United States Patent [19]
Kawaguchi et al.

[11] Patent Number: 5,670,994
[45] Date of Patent: Sep. 23, 1997

[54] ASSEMBLY STRUCTURE OF A FLAT TYPE DEVICE INCLUDING A PANEL HAVING ELECTRODE TERMINALS DISPOSED ON A PERIPHERAL PORTION

[75] Inventors: Hisao Kawaguchi; Shinichi Sugimoto, both of Nara; Yasunobu Tagusa, Ikoma, all of Japan

[73] Assignee: Sharp Kabushiki Kaisha, Osaka, Japan

[21] Appl. No.: 730,665

[22] Filed: Oct. 11, 1996

Related U.S. Application Data

[62] Division of Ser. No. 186,455, Jan. 25, 1994, Pat. No. 5,592,199.

[30] Foreign Application Priority Data

| Jan. 27, 1993 | [JP] | Japan | 5-011728 |
| Feb. 8, 1993 | [JP] | Japan | 5-020295 |
| Aug. 6, 1993 | [JP] | Japan | 5-196416 |

[51] Int. Cl.[6] ............................. G09G 5/00
[52] U.S. Cl. ................. 345/206; 345/87; 349/150
[58] Field of Search ................. 345/87, 98, 206, 345/903, 905; 349/150

[56] References Cited

U.S. PATENT DOCUMENTS

| 4,766,426 | 8/1988 | Hatada et al. | |
| 5,025,555 | 6/1991 | Mase | 29/846 |
| 5,072,075 | 12/1991 | Lee et al. | 29/846 |
| 5,375,322 | 12/1994 | Leed | 29/846 |
| 5,528,403 | 6/1996 | Kawaguchi et al. | 349/50 |

FOREIGN PATENT DOCUMENTS

| 455233 | 11/1991 | European Pat. Off. |
| 3731787 | 3/1989 | Germany |
| 61-114226 | 5/1986 | Japan |
| 62-237484 | 10/1987 | Japan |
| 63-126292 | 5/1988 | Japan |
| 63-205074 | 8/1988 | Japan |
| 649284 | 1/1989 | Japan |
| 227785 | 1/1990 | Japan |
| 2127621 | 5/1990 | Japan |
| 2248926 | 10/1990 | Japan |
| 225974 | 10/1990 | Japan |
| 2259728 | 10/1990 | Japan |
| 4115228 | 4/1992 | Japan |
| 4313731 | 5/1992 | Japan |
| 4304427 | 10/1992 | Japan |

OTHER PUBLICATIONS

"93 The Newest LC Process Technique", (from Monthly Semiconductor World Extra Number; pp. 249–252).
Patent Abstracts of Japan, vol. 17, No. 138 (P–1505) Mar. 22, 1993.
Patent Abstracts of Japan, vol. 16, No. 118 (P–1500) Mar. 11, 1993.
Patent Abstracts of Japan, vol. 16, No. 368 (P–1398) Aug. 7, 1992.
Patent Abstracts of Japan, Vol. 14, No. 577 (P–1146) Dec. 21, 1990.

*Primary Examiner*—Mark R. Powell
*Assistant Examiner*—Matthew Luu

[57] ABSTRACT

A panel having a plurality of electrode terminals disposed along a peripheral portion of one surface thereof is assembled at small size, less weight, and low cost. Flexible wiring boards on which a drive IC is mounted are connected to the electrode terminals, and circuit wiring is connected to the flexible wiring boards. On both sides of the peripheral portion of the panel, a first junction terminal and a second junction terminal are provided. By a first circuit wiring, the second junction terminal corresponding to one flexible wiring board is connected to the first junction terminal corresponding to another flexible wiring board adjacent to the flexible wiring board. An input terminal, output terminals, and a third junction terminal that lead to the drive IC are provided at places corresponding to the various terminals on one surface of the flexible wiring boards. By the second circuit wiring, the input terminal is connected to the third junction terminal. The corresponding terminals are connected to each other by overlapping the flexible wiring boards on the peripheral portion of the panel.

36 Claims, 41 Drawing Sheets

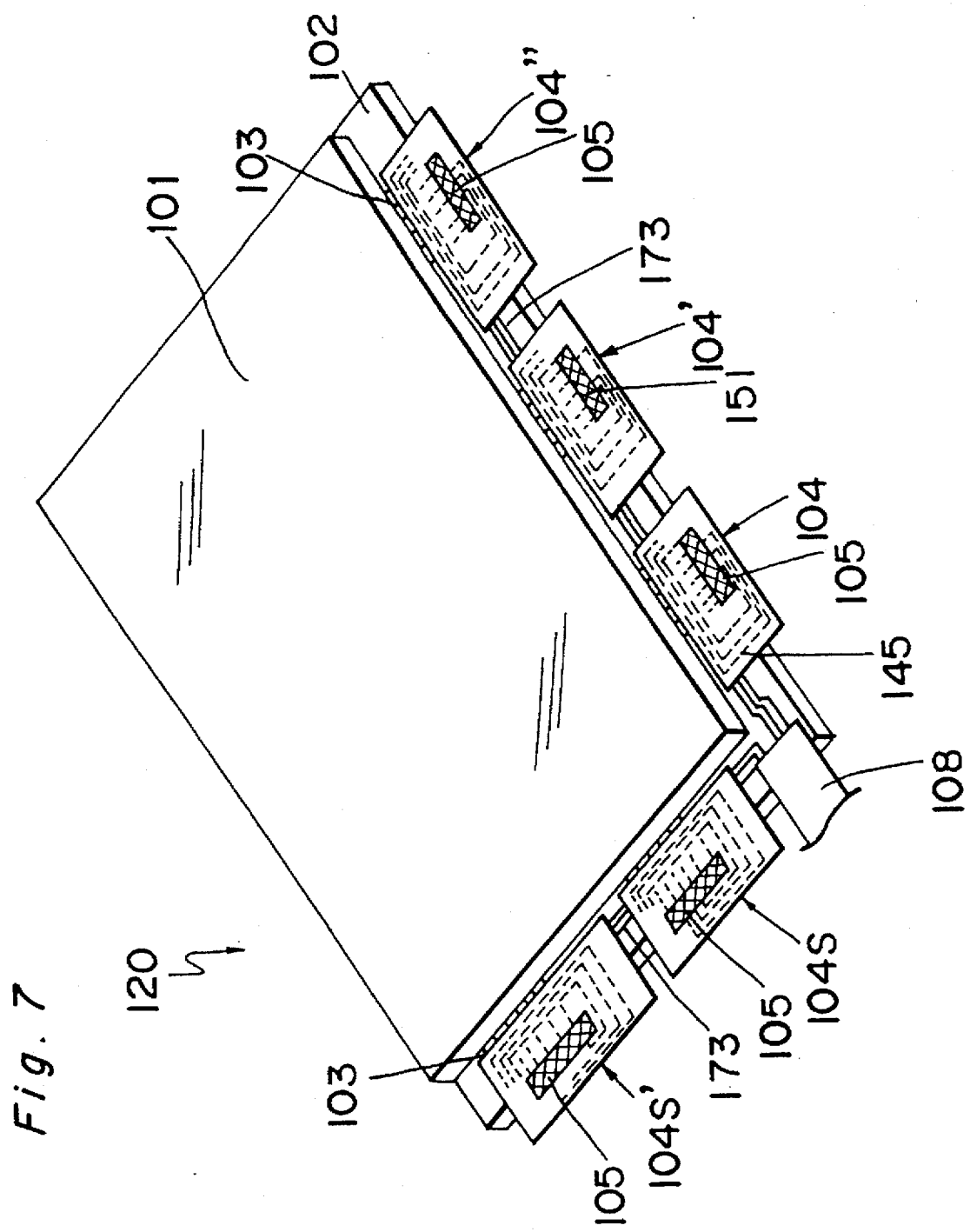

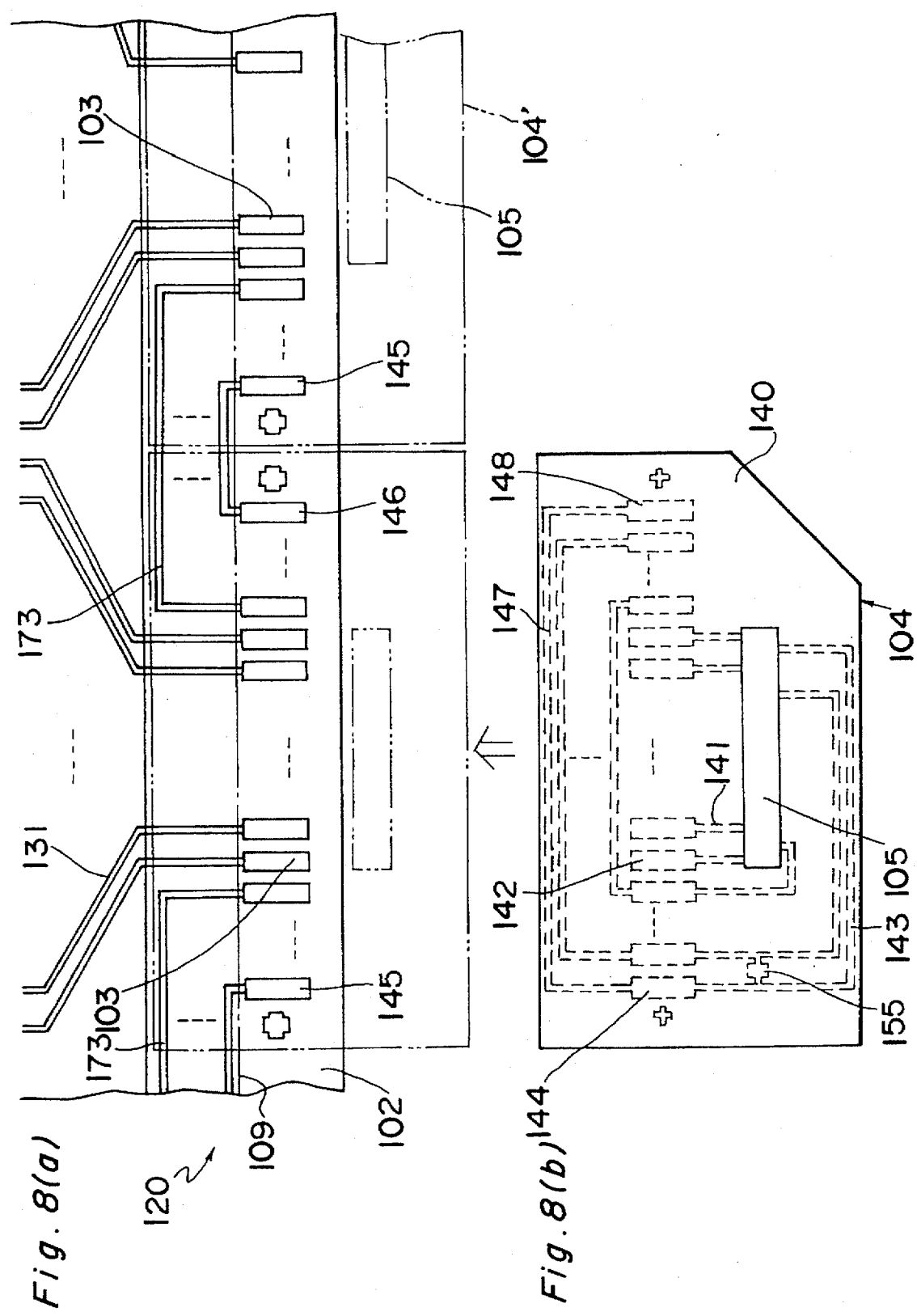

ASSEMBLY STRUCTURE OF A FLAT TYPE DEVICE INCLUDING A PANEL HAVING ELECTRODE TERMINALS DISPOSED ON A PERIPHERAL PORTION

This application is a divisional of application Ser. No. 08/186,455, filed on Jan. 25, 1994, now U.S. Pat. No. 5,592,199, the entire contents of which are hereby incorporated by reference.

BACKGROUND OF THE INVENTION

1. Field of the Invention

The present invention relates to an assembly structure of a flat type device and method for assembling the same. More specifically, the invention relates to an assembly structure of a flat type device including a panel having electrode terminals disposed on a peripheral portion thereof, such as liquid crystal, EL, plasma, and other panels.

2. Description of the Prior Art

Among various types of panels, a liquid crystal panel is described here. As shown in FIGS. 55 and 56, which are perspective and sectional views of a prior art, a liquid crystal panel 320 is in general so structured that liquid crystals 321 are sealed in between a pair of glass substrates 301, 302 and a large number of electrode terminals 303 are disposed on a peripheral portion of one glass substrate 302. FIG. 56 shows a section as viewed along the line A-A' in FIG. 55. In its assembled state, the liquid crystal panel 320 has on a peripheral portion thereof: flexible wiring boards 304, 304', ... each having a drive IC 305 mounted thereon for driving the liquid crystal panel 320; a generally L-shaped common wiring board 307 for receiving signals from external; and a generally rectangular control board 311 for feeding signals to the common wiring board through a connector 308 (the assembled panel is referred to as a "module"). As shown in FIG. 55, the common wiring board 307 has, on its one surface, a bus line (circuit wiring) 371, and electrode terminals 372 electrically conducting with the bus line 371 and corresponding to the flexible wiring boards 304, 304', ..., respectively. As shown in FIG. 56, the flexible wiring board 304 has a wiring layer, which includes output terminals 342 and an input terminal 306, provided on a base material surface 340 having a flexibility. The drive IC 305 is connected to the wiring layer by bump electrodes 305a, 305b (numeral 396 denotes resin).

Conventionally, the glass substrate 302 and the common wiring board 307 are juxtaposed with the electrode terminals 303, 372 faced upward. Then the electrode terminals 303 and 372 are electrically connected to the output terminals 342 and input terminal 306 of the flexible wiring board 304 by means of an anisotropic conductive material 395 or solder (not shown), respectively. Also, as shown in FIG. 55, one end of the connector 308 is connected to the bus line 371 of the common wiring board 307, while the other end of the connector 308 is connected to a signal feed terminal (not shown) of the control board 311.

In operation, a signal is fed to the bus line 371 of the common wiring board 307 from the control board 311 via the connector 308. Sequentially through the bus line 371, the electrode terminal 372, and the input terminal 306, the signal is inputted to the drive IC 305 of the flexible wiring boards 304, 304', .... Then, the signal outputted by the drive IC 305 is applied to pixels through the output terminals 342 and the electrode terminals 303. Thus, the liquid crystal panel 320 is driven.

Recently, liquid crystal panels have been undergoing very severe competitive development, facing a demand for downsizing and weight reducing the liquid crystal panel modules. However, the above-described conventional assembling structure has both the common wiring board 307 and the control board 311 disposed and spaced from each other on side portions of the liquid crystal panel 320, thus inevitably resulting in a rather large size module. Further, since two types of large components, the common wiring board 307 and the control board 311, are provided, the resulting module is increased in weight, making a difficulty for weight reduction. Still further, the number of parts is increased so that the material cost is also increased. Yet, since the number of times of connection process is large, the man-hour required is increased, causing higher cost, disadvantageously.

Also, the larger the number of parts and the size, the more the module is affected by external force. Besides, the larger the number of times of connection process, the more the rate of occurrence of defectives increases. For these and other reasons, the reliability of the module is deteriorated to a further problem.

SUMMARY OF THE INVENTION

The present invention has been developed with a view to substantially solving the above described disadvantages and has for its essential object to provide a structure and method for assembling a panel by which a panel having electrode terminals disposed on a peripheral portion thereof, typified by liquid crystal panels, can be assembled with small size, light weight, low cost, and high reliability.

In order to achieve the aforementioned object, an assembly structure according to a first aspect of the present invention is an assembly structure of a flat type device, in which a panel has a plurality of electrode terminals disposed along a peripheral portion of one surface thereof, a flexible wiring board on which a drive IC for driving the panel is mounted is electrically connected to the electrode terminals of the panel, and wherein a circuit wiring for transferring a signal fed from external is electrically connected to the flexible wiring board, the assembly structure comprising:

- an arrangement of the peripheral portion of the panel where a circuit wiring is provided at a layer below the electrode terminals so as to extend along the peripheral portion and to be electrically insulated from the electrode terminals with an insulating layer interposed therebetween, and where a junction terminal is provided so as to conduct with the circuit wiring, to penetrate through the insulating layer at a specified place, and to share the same layer with the electrode terminals; and
- an arrangement of one side of the flexible wiring board where an input terminal and output terminals leading to the drive IC are provided at places corresponding to the junction terminal and electrode terminals of the peripheral portion of the panel;
- wherein the flexible wiring board is overlaid on the peripheral portion of the panel so that the junction terminal and electrode terminals of the peripheral portion of the panel are electrically connected to the input terminal and output terminals of the flexible wiring board, respectively.

In the assembly structure of the flat type device according to the first aspect of the present invention, in operation, a signal fed to the circuit wiring of the peripheral portion of the panel from external is inputted to the drive IC via the junction terminal and then the input terminal of the flexible wiring board. A signal outputted by the drive IC is fed to the inside of the panel via the output terminals of the flexible wiring board and the electrode terminals of the peripheral portion of the panel. Thus, the panel is driven.

In the assembly structure of the flat type device according to the first aspect of the invention, the common wiring board, which would be disposed on a side portion of the panel in the prior art, is omitted. Accordingly, the size of the module is reduced compared with the prior art. Also, the number of parts is reduced so that the module is reduced in weight. Such reduction in the number of parts results in a reduction in the material cost. Yet, the junction terminal and electrode terminals of the panel are collectively connected to the input terminal and output terminals of the flexible wiring board by means of, for example, an anisotropic conductive material. This allows the connection process to be achieved at one time so that the man-hour required is reduced compared with the prior art and therefore the cost is also reduced. Further, based on the fact that the number of connection processes is reduced and that the panel and the common wiring board, which are larger components, are not coupled with each other by the flexible wiring board but integrated together, a high yield of the production process can be attained and products with higher reliability can be offered to the market.

As shown above, in the assembly structure according to the first aspect of the invention, the common wiring board, which would be disposed on a side portion of the panel in the prior art, can be omitted. Accordingly, the module can be reduced in size, compared with the prior art. Also, since the number of parts is reduced, the module can be reduced in weight. Such reduction in the number of parts allows the material cost to be reduced. Yet, the junction terminal and electrode terminals of the panel can be collectively connected to the input terminal and output terminals of the flexible wiring board by means of, for example, an anisotropic conductive material. This allows the connection process to be achieved at one time, so that the man-hour required can be reduced compared with the prior art. As a result, the cost can be reduced.

Further, the structure is that the input terminal and output terminals of the flexible wiring board are provided in series and that the panel and the circuit board, which are both larger components, are not coupled with each other by the flexible wiring board. This arrangement makes the resulting module less vulnerable to any external force. Also, the production yield is improved so that the cost can be reduced and the product reliability is enhanced.

When the electrode terminals of the peripheral portion of the panel are connected by means of an anisotropic conductive material, the anisotropic conductive material, which is the today's major material to be used for interconnection in liquid crystal panels, makes it possible to utilize the existing know-hows and equipment as they are. This leads to a less amount of new investment. Accordingly, conventional production techniques and commercially available or existing equipment may be easily employed.

When electronic components such as a chip capacitor and a resistor are mounted on the flexible wiring board, a compact module with an upgraded display can be made by reducing noise of signals inputted to the drive IC.

When a portion of the flexible wiring board that projects sideward of the peripheral portion of the panel is bent so as to be wound around the peripheral portion of the panel, the module can be further reduced in size.

When at least a region where the peripheral portion of the panel and the flexible wiring board overlap each other and the drive IC mounted on the flexible wiring board are covered with a specified protective resin, any harmful substances such as moisture, NaCl, and $H_2S$ gas can be prevented from penetrating into the connecting points at which the junction terminal and electrode terminals of the peripheral portion of the panel are connected to the input terminal and output terminals of the flexible wiring board, respectively. Also, the drive IC is firmly fixed so that inner leads of the drive IC will not break, and that durability to vibrations and shocks is even enhanced as a whole. Accordingly, the panel is further improved in its reliability so as be usable under very severe conditions.

If the electrode terminals of the peripheral portion of the panel are press fitted by a clip alone made of a shape memorizing member having a U shape in section, any defective drive IC that has proved or occurred as such after assembling can be easily exchanged for a good drive IC (or a flexible wiring board having a good drive IC mounted thereon) without the need of removing the adhesive or other work.

Further, if the electrode terminals of the peripheral portion of the panel are press fitted by a shape memorizing member having a U shape in section after being once connected by an anisotropic conductive material or the like, then the module reliability can be further enhanced.

The assembling method according to a second aspect of the invention is a method for assembling a flat type device, in which a panel has a plurality of electrode terminals disposed along a peripheral portion of one surface thereof, a flexible wiring board on which a drive IC for driving the panel is mounted is electrically connected to the electrode terminals of the panel, and a circuit wiring for transferring a signal fed from external is electrically connected to the flexible wiring board, the method for assembling a flat type device comprising the steps of:

providing, on the peripheral portion of the panel, a circuit wiring at a layer below the electrode terminals so as to extend along the peripheral portion and to be electrically insulated from the electrode terminals with an insulating layer interposed therebetween, and providing a junction terminal so as to conduct with the circuit wiring, to penetrate through the insulating layer at a specified place, and to share the same layer with the electrode terminals;

providing, on one side of the flexible wiring board, an input terminal and output terminals leading to the drive IC at places corresponding to the junction terminal and electrode terminals of the peripheral portion of the panel;

aligning the junction terminal and the electrode terminals with the input terminal and the output terminals with the peripheral portion of the panel and the flexible wiring board opposed to each other; and electrically connecting the junction terminal and the electrode terminals to the input terminal and the output terminals by means of an anisotropic conductive material.

In the method according to the second aspect of the invention, the junction terminal and electrode terminals of the peripheral portion of the panel are electrically connected to the input terminal and output terminals of the flexible wiring board by means of an anisotropic conductive material. Accordingly, the terminals are collectively connected so that the connection process can be achieved at one time. As a result, the man-hour required is reduced so that the cost lowers. Besides, by making the use of existing know-hows and equipment, new production facilities may be easily introduced with low cost.

The assembly structure according to a third aspect of the invention is an assembly structure of a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a circuit wiring for transferring a signal fed from external is electrically connected to the flexible wiring boards, the assembly structure comprising:

an arrangement of the peripheral portion of the panel where a first junction terminal and a second junction terminal corresponding to each one of the flexible wiring boards and sharing the same layer with the electrode terminals are provided on both sides of a group of the electrode terminals corresponding to each one of the flexible wiring boards in a direction along the peripheral portion of the panel, and where a first circuit wiring for connecting the second junction terminal corresponding to one of the flexible wiring boards to the first junction terminal corresponding to another flexible wiring board adjacent to the flexible wiring board is provided in proximity to a row formed by the various terminals; and an arrangement on the flexible wiring boards where an input terminal, output terminals, and a third junction terminal formed of part of the wiring layer and leading to the drive IC are provided at places corresponding to the first junction terminal, electrode terminals, and second junction terminal of the peripheral portion of the panel, and where a second circuit wiring for connecting the input terminal to the third junction terminal is provided;

wherein the flexible wiring boards are overlaid on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence.

In the assembly structure according to the third aspect of the invention, in operation, a signal is fed to the first circuit wiring of the peripheral portion of the panel from the external control board via the connector and the like. The signal is inputted to the drive IC from the first junction terminal via the input terminal of the flexible wiring board. A signal outputted by the drive IC is fed to the inside of the panel via the output terminals of the flexible wiring board and the electrode terminals of the peripheral portion of the panel. Thus, the panel is driven. Also, the signal is branched by the first junction terminal, passed sequentially through the second circuit wiring and third junction terminal of the flexible wiring board, the second junction terminal and first circuit wiring leading thereto of the peripheral portion of the panel, and thus fed to the first junction terminal corresponding to another flexible wiring board adjacent to the flexible wiring board. Then the signal is inputted to the drive IC from the first junction terminal via the input terminal of the adjacent flexible wiring board. A signal outputted by the drive IC is fed to the inside of the panel via the output terminals of the adjacent flexible wiring board and the electrode terminals of the peripheral portion of the panel. In this way, the signal is fed to the electrode terminals corresponding to an adjacent flexible wiring board one after another.

In the assembly structure of the flat type device according to the third aspect of the invention, the common wiring board, which would be disposed sideward of the panel in the prior art, is omitted. Accordingly, the module can be reduced in size compared with the prior art. Also, the number of parts is reduced so that the weight of the module is reduced. Such reduction in the number of parts allows a reduction in material cost. Yet, the first junction terminal, electrode terminals, and second junction terminal of the peripheral portion of the panel are collectively connected to the input terminal, output terminals, and third junction terminal of the flexible wiring board by means of, for example, an anisotropic conductive material. Also, the process of connection between the flexible wiring boards and the common wiring board does not exist (the control board is connected to the first circuit wiring of the peripheral portion of the panel via a connector as in the prior art). Accordingly, the man-hour required is reduced so that the cost lowers.

Further, since a smaller number of parts are involved and the module size is also small, or since a smaller number of times of connection is involved, the module is less affected by any external force so that the rate of occurrence of defectives lowers, accompanied by other advantages. As a result, the module reliability is enhanced.

When a portion of the flexible wiring boards that projects sideward of the peripheral portion of the panel is bent so as to be wound around the peripheral portion of the panel, the module size is further reduced.

When a slit is provided to the base material surface of the portion, at which the flexible wiring boards are wound, in a direction along the peripheral portion of the panel, the flexible wiring boards can be more easily bent around the winding portion, so that the module becomes easier to assemble.

When a clip made of a shape memorizing member having a U shape in section is provided to pinch the peripheral portion of the panel on outside of each one of the flexible wiring boards so that a group of the electrode terminals corresponding to each one of the flexible wiring boards are press fitted, the corresponding terminals can be easily connected to each other. Moreover, any flexible wiring board on which a defective IC that has proved or occurred as such after assembling is mounted can be easily exchanged for new one without the need of removing the adhesive or other work.

When a slit is provided to the base material surface of a portion of each one of the flexible wiring boards that corresponds to a spacing between the row of the input terminal, the output terminals and the third junction terminal, and the second circuit wiring so as to extend along the spacing, the slit, being close to the terminals, allows any excess of the material that connects the corresponding terminals to each other to easily flow therethrough more evenly among the terminals without being affected by the second circuit wiring pattern and the like. As a result, the insulating property between the connecting terminals of the flexible wiring board and the first or second circuit wiring can be readily retained. Further, the conditions that result after connection among the connecting terminals become uniform so that a stabler reliability of the module can be attained.

When the base material surface has been removed at a portion of the flexible wiring boards that corresponds to the input terminal, the output terminals, or the third junction terminal, a prober terminal for performance tests can be put in contact with the terminals through the portion where the base material surface has been removed, while the flexible wiring board is connected to the peripheral portion of the panel. As a result, performance tests for the panel and the drive ICs can be easily performed.

When the flexible wiring boards are overlaid on the peripheral portion of the panel in such a way that the row of the input terminal, the output terminals and the third junction terminal is located outer than the second circuit wiring, and when a portion of the flexible wiring boards that corresponds to the second circuit wiring is bent substantially 90 degrees to substantially 180 degrees with respect to the portions corresponding to the various terminals, then the width of the peripheral portion of the panel is required only to be equivalent to the portions corresponding to the terminals, so that the width of the peripheral portion of the panel can be designed narrow. As a result, the module size can be further reduced.

When the flexible wiring boards are overlaid on the peripheral portion of the panel in such a way that the row of the input terminal, the output terminals and the third junction terminal is located inner than the second circuit wiring, and when a portion of the flexible wiring boards on one side of the row of the various terminals opposite to the side on which the second circuit wiring is located is bent substantially 90 degrees to substantially 180 degrees with respect to the portions corresponding to the various terminals, then the width of the peripheral portion of the panel is required only to be equivalent to the portions corresponding to the terminals so that the width of the peripheral portion of the panel can be designed narrow. As a result, the module size can be further reduced.

When the drive IC is mounted on a portion of each one of the flexible wiring boards at which the flexible wiring boards are bent, the extent in which the flexible wiring boards project sideward of the peripheral portion of the panel is reduced by an extent of the width of the drive IC. As a result, the module size can be further reduced.

Further, when electronic components such as a capacitor and a resistor are mounted on the flexible wiring boards, measures for noise involved in the input signal line and the like can be easily implemented in a compact-mounting structure. As a result, a compact module of high display grade can be realized.

The assembling method according to a fourth aspect of the invention is a method for assembling a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a circuit wiring for transferring a signal fed from external is electrically connected to the flexible wiring boards, the method for assembling a flat type device comprising the steps of:

providing, on the peripheral portion of the panel, a first junction terminal and a second junction terminal corresponding to each one of the flexible wiring boards and sharing the same layer with the electrode terminals on both sides of a group of the electrode terminals corresponding to each one of the flexible wiring boards in a direction along the peripheral portion of the panel, and providing a first circuit wiring for connecting the second junction terminal corresponding to one of the flexible wiring boards to the first junction terminal corresponding to another flexible wiring board adjacent to the flexible wiring board in proximity to a row formed by the various terminals; and providing, on the flexible wiring boards, an input terminal, output terminals, and a third junction terminal formed of part of the wiring layer and leading to the drive IC at places corresponding to the first junction terminal, electrode terminals, and second junction terminal of the peripheral portion of the panel, and providing a second circuit wiring for connecting the input terminal to the third junction terminal is provided; and aligning the first junction terminal, electrode terminals, and second junction terminal of the peripheral portion of the panel with the input terminal, output terminals, and third junction terminal of each one of the flexible wiring boards, respectively, with the peripheral portion of the panel and the flexible wiring boards opposed to each other, and electrically connecting the corresponding terminals to each other by means of a specified electrically connecting material.

In the assembling method according to the fourth aspect of the invention, the first junction terminal, electrode terminals, and second junction terminal of the peripheral portion of the panel are connected to the input terminal, output terminals, and third junction terminal of the flexible wiring board by means of a specified electrical connecting material (anisotropic conductive material, solder, photosetting insulating resin, etc.). Thus, the corresponding terminals can be collectively connected to each other. Further, there is involved no connecting process of the flexible wiring board and the common wiring board (the control board is connected to the first circuit wiring of the peripheral portion of the panel by means of a connector as in the prior art). Accordingly, the man-hour required is reduced so that the cost lowers. Further, the input terminal and the output terminals are connected under the same conditions. Thus, variation in the connecting conditions of the two types of terminals in fabrication is reduced, so that a stabler reliability of the module can be attained.

The assembly structure according to a fifth aspect of the invention is an assembly structure of a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a control board for feeding a signal for driving the panel is electrically connected to the flexible wiring boards, the assembly structure comprising:

an arrangement of the peripheral portion of the panel where a first junction terminal and a second junction terminal corresponding to each one of the flexible wiring boards and sharing the same layer with the electrode terminals are provided on both sides of a group of the electrode terminals corresponding to each one of the flexible wiring boards in a direction along the peripheral portion of the panel, and where a first circuit wiring for connecting the second junction terminal corresponding to one of the flexible wiring boards to the first junction terminal corresponding to another flexible wiring board adjacent to the flexible wiring board is provided in proximity to a row formed by the various terminals;

an arrangement on the flexible wiring boards where an input terminal, output terminals, and a third junction terminal formed of part of the wiring layer and leading to the drive IC are provided at places corresponding to the first junction terminal, electrode terminals, and second junction terminal of the peripheral portion of the panel, where a second circuit wiring for connecting the input terminal to the third junction terminal is provided, and where a fourth junction terminal leading to the third junction terminal via a third circuit wiring is provided; and an arrangement on one surface of the control board where a signal feed terminal for feeding a signal for driving the panel is provided in correspondence to the fourth junction terminal of the flexible wiring boards;

wherein the flexible wiring boards are overlaid on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence;

and wherein the control board is overlaid on the flexible wiring boards so that the fourth junction terminal of the flexible wiring boards is electrically connected to the signal feed terminal of the control board in correspondence.

In the assembly structure of the flat type device according to the fifth aspect of the invention, in operation, a signal is fed from the signal feed terminal of the control board to the fourth junction terminal of the flexible wiring board. This signal is inputted from the fourth junction terminal to the drive IC sequentially via the third circuit wiring, the third junction terminal, the second circuit wiring, and the input terminal. A signal outputted by the drive IC is fed to the inside of the panel via the output terminals of the flexible wiring board and the electrode terminals of the peripheral portion of the panel (direct route). Thus, the panel is driven. Also, the signal can be fed to the panel through a following indirect route. That is the signal branched by the third junction terminal of the flexible wiring board, passed sequentially through the second junction terminal and first circuit wiring leading thereto of the peripheral portion of the panel, and thus fed to the first junction terminal corresponding to another flexible wiring board adjacent to the flexible wiring board. Then the signal is inputted to the drive IC from the first junction terminal via the input terminal of the adjacent flexible wiring board. A signal outputted by the drive IC is fed to the inside of the panel via the output terminals of the adjacent flexible wiring board and the electrode terminals of the peripheral portion of the panel. In this way, the signal is fed to the electrode terminals corresponding to an adjacent flexible wiring board one after another.

In the assembly structure of the flat type device according to the fifth aspect of the invention, the common wiring board and the connector, which would be disposed sideward of the panel in the prior art, are omitted. Accordingly, the module size is reduced compared with the prior art. Also, the number of parts is reduced, so that the module is reduced in weight. Further, such a reduction in the number of parts allows a reduction in the material cost. Yet, the first junction terminal, electrode terminals, and second junction terminal of the peripheral portion of the panel are collectively connected to the input terminal, output terminals, third junction terminal of the flexible wiring board by means of, for example, an anisotropic conductive material. The connecting process between the flexible wiring boards and the control board is reduced in burden to a level similar to or less than the connecting process for the common wiring board in the prior art. The connecting process for the connector is entirely obviated. Accordingly, the total man-hour required is reduced compared with the prior art. As a result, the cost lowers. Furthermore, the module reliability becomes stabler and improved by virtue of its number of times of connection smaller than in the prior art, and other advantages.

When the panel is generally rectangular shaped and the control board is generally L-, U-, or square-shaped along the peripheral portion of the panel, then the signal is fed from the control board to the flexible wiring boards by a direct route, i.e. a shortest route as required. Accordingly, the wire resistance is reduced.

When the fourth junction terminal of part of the plurality of flexible wiring boards are not connected to the signal feed terminal of the control board, the number of connecting points between the flexible wiring boards and control board is reduced. As a result, the man-hour required is further reduced so that the cost lowers. For example, the fourth junction terminal of the flexible wiring board is connected to the signal feed terminal of the control board at a corner portion of the peripheral portion of the panel, while the fourth junction terminal of the flexible wiring boards is not connected to the signal feed terminal of the control board at places other than the corner portion. In such a case, the signal is fed to the electrode terminals corresponding to the flexible wiring board at the corner portion of the peripheral portion of the panel through the aforementioned direct route, while the signal is fed to the electrode terminals corresponding to flexible wiring boards at places other than the corner portion through the aforementioned indirect route. Yet, in this case, the control board is not required to be provided lengthily along the peripheral portion of the panel, but may be provided only at the corner portion. Accordingly, the module is further reduced in size and weight.

When the fourth junction terminal of the part of the flexible wiring boards has been cut off and removed together with the base material surface, it is no longer necessary to prepare different types of flexible wiring boards previously for assembling. In other words, the flexible wiring boards are prepared as provided with a fourth junction terminal, and the fourth junction terminal is cut off and removed before starting the assembly. In such a case, design cost for the flexible wiring boards will never increase.

When the portion of the part of the flexible wiring boards that projects sideward of the peripheral portion of the panel is bent at least once, the module size is further reduced.

When the control board is overlaid on the peripheral portion of the panel directly or via a spacer and assembled integrally therewith, the module is increased in strength with its reliability enhanced. Also, it is no longer needed to provide any auxiliary reinforcement member for assembling the panel and the control board, so that the module can be designed for small size and light weight.

When the control board is mounted on one surface of the peripheral portion of the panel opposite to the surface on which the electrode terminals are provided, and when the flexible wiring boards are wound around a peripheral portion of the panel and the control board, then the module size is further reduced.

When a clip made of a shape memorizing member having a U shape in section is provided to pinch the peripheral portion of the panel and the control board on outside of the flexible wiring boards so that a group of the electrode terminals corresponding to each one of the flexible wiring boards are press fitted, the terminals can be easily connected to each other. Moreover, any flexible wiring board on which a defective IC that has proved or occurred as such after assembling is mounted can be easily exchanged for new one.

When connection between the peripheral portion of the panel and the flexible wiring boards and connection between the flexible wiring boards and the control board are achieved by an identical connecting material, they can be collectively connected simultaneously by heating and thermally curing the conductive material by, for example, two thermal press head tips. As a result, the man-hour required is reduced so that the cost lowers.

The assembling method according to a sixth aspect of the invention is a method for assembling a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a control board for feeding a signal fed from external is electrically connected to each of the flexible wiring boards, the method for assembling a flat type device comprising the steps of:

providing, on the peripheral portion of the panel, a first junction terminal and a second junction terminal corresponding to each one of the flexible wiring boards and sharing the same layer with the electrode terminals on both sides of a group of the electrode terminals corresponding to each one of the flexible wiring boards in a direction along the peripheral portion of the panel, and providing a first circuit wiring for connecting the second junction terminal corresponding to one of the flexible wiring boards to the first junction terminal corresponding to another flexible wiring board adjacent to the flexible wiring board in proximity to a row formed by the various terminals;

providing, on the flexible wiring boards, an input terminal, output terminals, and a third junction terminal formed of part of the wiring layer and leading to the drive IC at places corresponding to the first junction terminal, electrode terminals, and second junction terminal of the peripheral portion of the panel; providing a second circuit wiring for connecting the input terminal to the third junction terminal; and providing a fourth junction terminal leading to the third junction terminal via a third circuit wiring;

providing, on one surface of the control board, a signal feed terminal for feeding a signal for driving the panel in correspondence to the fourth junction terminal of the flexible wiring boards;

overlaying the flexible wiring boards on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence; and overlaying the control board on the flexible wiring boards so that the fourth junction terminal of the flexible wiring boards is electrically connected to the signal feed terminal of the control board in correspondence.

In the method for assemblying the flat type device according to the sixth aspect of the invention, the first junction terminal, electrode terminals, second junction terminal of the panel are collectively connected to the input terminal, output terminals, and third junction terminal of the flexible wiring board by means of, for example, an anisotropic conductive material. Also, the connecting process between the flexible wiring boards and the control board is reduced in burden to a level similar to or less than the connecting process for the common wiring board in the prior art. The connecting process for the connector is entirely obviated. Accordingly, the total man-hour required is reduced compared with the prior art. As a result, the cost lowers.

When the control board is overlaid directly or via a spacer on one surface of the peripheral portion of the panel opposite to the surface on which the electrode terminals are provided, and when the flexible wiring boards are wound around a peripheral portion of the panel and the control board, and further when a clip made of a shape memorizing member having a U shape in section is provided to pinch the peripheral portion of the panel and the control board on outside of the flexible wiring boards so that a group of the terminals corresponding to each one of the flexible wiring boards are press fitted, then the module size is further reduced. Yet, the terminals can be easily connected to each other so that the assembly work is facilitated.

When a connecting material which will be cured by heating and pressurization or by heating, cooling, and pressurization is provided between the peripheral portion of the panel and the flexible wiring boards and between the flexible wiring boards and the control board; and when connection of the terminals in their correspondence is simultaneously achieved by two thermal press head tips, then connection between the panel and the flexible wiring boards and connection between the flexible wiring boards and the control board can be achieved simultaneously and collectively. Accordingly, the man-hour required is reduced so that the cost lowers.

The assembly structure according to a seventh aspect of the invention is an assembly structure of a flat type device having:

a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; a plurality of connecting terminals arrayed on the insulating substrate in such a direction as to intersect the array direction of the wiring boards at proximately both ends of each one of the wiring boards in their array direction; and a bypass wiring which electrically connects at least part of the plurality of connecting terminals at proximately the both ends with each other and which is electrically connected to the circuit element;

the display panel including a plurality of common lines which are connected respectively to the connecting terminals of each one of the plurality of wiring boards adjacent to one another on the peripheral portion and which are formed between one another of the connecting terminals of the plurality of wiring boards adjacent to one another;

wherein the connecting terminals of each one of the plurality of wiring boards are connected to the plurality of common lines and other connecting terminals on the display panel by means of an identical connecting material.

According to the seventh aspect of the invention, the display device comprises: a display panel having a peripheral portion; and a plurality of wiring boards which are disposed on a peripheral portion of the display panel in an array direction extending along the peripheral portion and on which a circuit element for driving the display panel is mounted. A plurality of connecting terminals arranged on the plurality of wiring boards are arrayed on an insulating substrate at proximately both ends in the array direction of the wiring boards in such a direction as to intersect this array direction. Also, a bypass wiring is provided on each of the plurality of wiring boards. The bypass wiring electrically connects at least part of the plurality of connecting terminals at the proximately both ends of the flexible wiring boards with each other and is electrically connected to the circuit element.

Such a structure of the wiring boards makes the wire resistance due to distribution of the common lines lower than when the connecting terminals are arrayed in parallel in the array direction, leading to a stabler display grade.

The assembly structure according to an eighth aspect of the invention is an assembly structure of a flat type device having:

a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; a plurality of connecting terminals arrayed on the insulating substrate in such a direction as to intersect the array direction of the wiring boards at proximately both ends of each one of the wiring boards in their array direction; and a bypass wiring which electrically connects at least part of a plurality of connecting terminals at proximately the both ends with each other and which is electrically connected to the circuit element;

the display panel including a plurality of common lines which are connected in common to part of the connecting terminals of each one of the plurality of wiring boards on the peripheral portion and which are formed over a range including an array range of the plurality of wiring boards;

wherein the connecting terminals of each one of the plurality of wiring boards are connected to the plurality of common lines and other connecting terminals on the display panel by means of an identical connecting material.

According to the eighth aspect of the invention, the display panel has a plurality of common lines which are connected to their corresponding connecting terminals of a plurality of wiring boards adjacent to one another on the peripheral portion and which are formed between one and another of the connecting terminals of the plurality of wiring boards adjacent to one another. The connecting terminals of the plurality of wiring boards are connected to the plurality of common lines and other connecting terminals on the display panel by means of the same connecting material.

Such a structure of the display panel makes it feasible to substantially reduce the area occupied by the display device. The reason is that, compared with the case where a separate wiring board other than the display panel and the above wiring boards is used so that the above common lines are provided on the separate wiring board, such a separate wiring board can be omitted.

In this way, according to the seventh and eighth aspects of the invention, the following advantages can be attained:
(1) The display device is offered with smaller size and less thickness;
(2) The display device is offered with less weight; and
(3) The display device is less affected by any external force by virtue of its small-size structure, with its reliability as a display device improved.

The assembly structure according to a ninth aspect of the invention is an assembly structure of a flat type device having:

a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; and a bypass wiring which electrically connects at least part of a plurality of connecting terminals at proximately both ends of the wiring boards with each other and which is electrically connected to the circuit element;

the display panel including a plurality of first common lines which are connected in common to the connecting terminals of each one of the plurality of wiring boards on the peripheral portion and which are formed over a range including an array range of the plurality of wiring boards; and a plurality of second common lines which are connected in common to part of the connecting terminals of each one of the plurality of wiring boards on the peripheral portion and which are formed over a range including the array range of the plurality of wiring boards;

wherein the connecting terminals of each one of the plurality of wiring boards are connected to the first common lines, the second common lines, and other connecting terminals on the display panel by means of an identical conductive connecting material.

According to the ninth aspect of the invention, the assembly structure of the display device comprises a display panel having a peripheral portion, and a plurality of wiring boards. The plurality of wiring boards are arranged on a peripheral portion of the display panel in an array direction along the peripheral portion and each have a circuit element mounted thereon for driving the display panel. A plurality of wiring boards each have a bypass wiring which electrically connects at least part of the plurality of connecting terminals at proximately both ends of the wiring boards with each other, and which is electrically connected to the circuit element.

The second common lines formed on the display panel are connected in common to part of the connecting terminals of each one of the plurality of wiring boards on the peripheral portion of the display panel. Also, the first common lines are formed over a range including the array range of the plurality of wiring boards on the display panel. The connecting terminals of each of the plurality of wiring boards are connected to the first and second common lines and other connecting terminals on the display panel by means of the same connecting material.

Also in the ninth aspect of the invention as described above, the same advantages as listed in the foregoing articles (1) to (3) can be attained.

In the seventh aspect of the invention, the bypass wiring may include a first bypass wiring which is formed on the insulating substrate and which directly connects the connecting terminals at proximately the both ends to one another.

Also, the bypass wiring may include: a second bypass wiring formed on the insulating substrate over a range from proximately any one of the both ends to the circuit element; a third bypass wiring which is formed on the insulating substrate over a range from proximately the other any one of the both ends to the circuit element; and an in-element bypass wiring which is formed within the circuit element and both ends of which are connected to the second bypass wiring and the third bypass wiring, respectively.

In the seventh aspect of the invention, the bypass wiring may be provided on both surfaces of the insulating substrate of each one of the wiring boards.

Also, the first bypass wiring may be provided on the insulating substrate and at such a position that the first bypass wiring passes between the insulating substrate and the circuit element.

Also, the connecting material may be an anisotropic conductive film.

Further, the display panel may comprise a pair display boards having display-use electrodes provided on their surfaces opposite to each other and having an optical transmission property, wherein the common lines are provided both on at least one of the pair of display boards within a range of overlap portion of these boards excepting a area of the display-use electrodes and on the peripheral portion.

The above seventh, eighth, and ninth aspects of the invention offer the following advantages:

(1) Since the circuit board on which the common lines for input signals to the ICs are formed is no longer necessitated, it becomes possible to reduce material cost and make the display panel thinner, more lightweight, and more compact. Also, a reduced number of connection processes leads to a lower rate of occurrence of defectives and an improved yield of the assembling process.

(2) Since the input/output-use electrode terminals of the flexible wiring board are collectively connected to the electrode terminals of the display panel, the man-hour required for assembling can be reduced to a substantial extent so that the cost can be reduced.

(3) Since the common lines for use of input signals or power supply are formed between one wiring board and its adjacent wiring board in the peripheral portion of the panel so that an input signal is bypassed within the wiring boards, the wire resistance between wiring boards connected to both ends of the peripheral portion of the display panel is reduced. Further, an increased connection width of the wiring boards and the electrode terminals of the display panel results in a decreased connection resistance.

(4) With part of the common lines for input signals formed outside opposite electrodes, the delay time of a signal is reduced. By virtue of the above advantages, there can be provided a liquid crystal display device which is prevented from failures in displaying an image, good in display grade, and compact in construction.

The method for assembling a flat type display device according to a tenth aspect of the invention including a display panel having a peripheral portion, comprising the steps of:

aligning a plurality of wiring boards on which a circuit element for driving the display panel is mounted with the peripheral portion of the display panel; and connecting the display panel to the wiring boards by means of a connecting material in such a way that signal input terminals, a bypass signal input terminal, and signal output terminals for the display panel of the wiring boards are treated collectively.

The assembling method of a display device according to the tenth aspect of the invention is implemented in the following way. A plurality of wiring boards each having a circuit element for driving the display panel mounted thereon are aligned with the common lines of the peripheral portion of the display panel. Connecting terminals of the plurality of wiring boards are connected to the common lines and other connecting terminals of the peripheral portion of the display panel by means of a connecting material. If the common lines were provided to provided to the display panel or a separate wiring board other than the plurality of wiring boards, there would be involved connection processes between the plurality of wiring boards and the display panel and between the plurality of wiring boards and the separate wiring board. In the present assembling method, the need for the connecting process between the plurality of wiring boards and the separate wiring board is eliminated. Thus, the number of assembling processes for the display device is reduced substantially, so that the assembling process of the display device is simplified.

According to the assembling method of the tenth aspect of the invention, as the connection of terminals is currently implemented with an anisotropic conductive material as a mainstream, use of an anisotropic material as the connecting material eliminates the need of developing new connecting materials and the existing know-hows can be utilized. Thus, the conventional manufacturing equipment may more often be employed as they are, resulting in less investment in plant and equipment.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a perspective view of a liquid crystal module which is an embodiment of the present invention according to its third and fourth aspects;

FIGS. 8(a) and 8(b) are plan views of the peripheral portion of the liquid crystal module;

DETAILED DESCRIPTION OF THE PREFERRED EMBODIMENTS

The assembly structure of a display panel according to the present invention is now described in more detail by way of its preferred embodiments.

Figure 1:
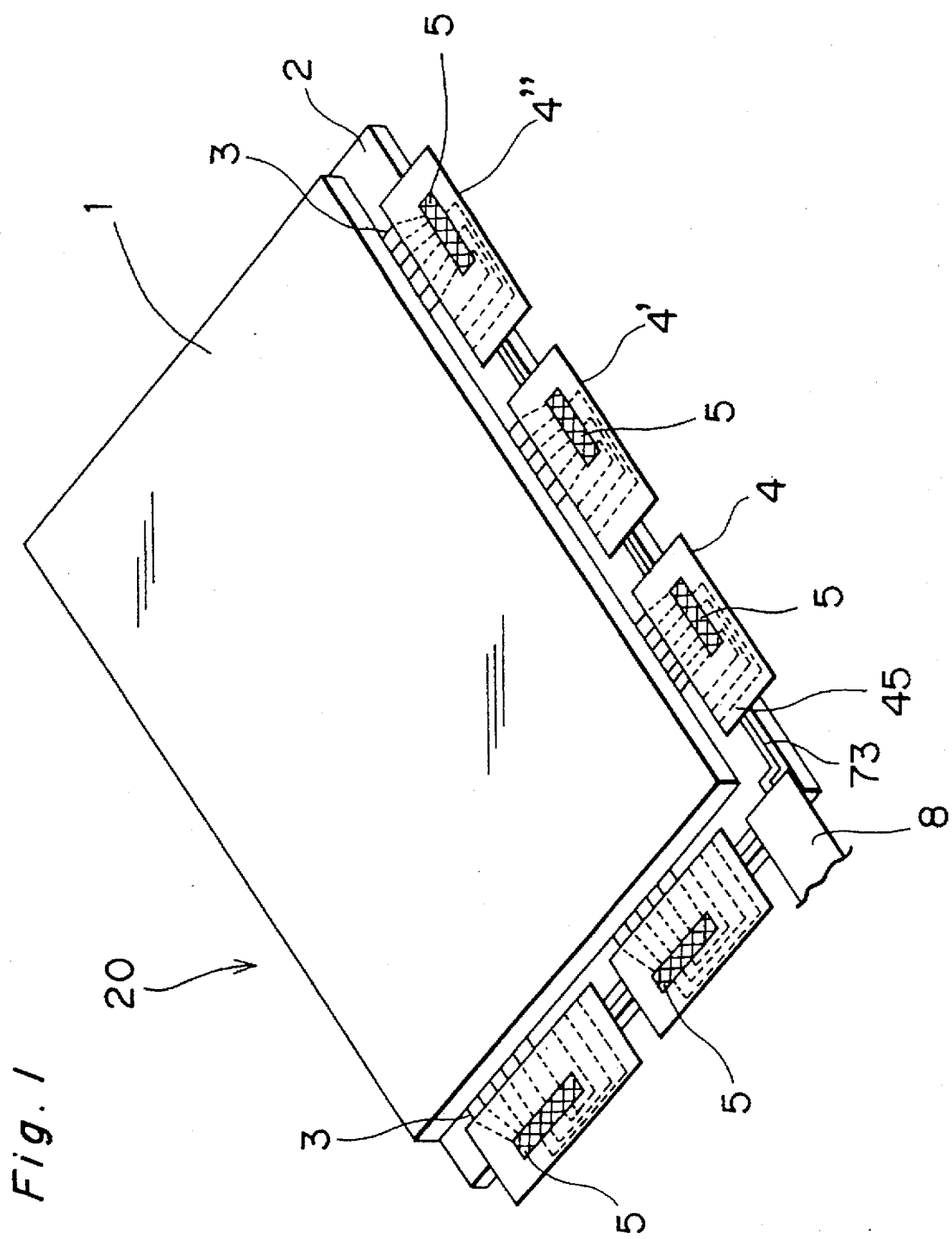
FIG. 1 is a perspective view of a liquid crystal module which is an embodiment of the present invention according to its first, second, and fourth aspects.

FIG. 1 is a perspective view of the liquid crystal module which is an embodiment of the first, second, and fourth aspect of the present invention. A liquid crystal panel 20 has liquid crystals 21 (see FIG. 4(b)) sealed between a pair of glass substrates 1, 2. Flexible wiring boards 4, 4', . . . each having a drive IC 5 for driving the liquid crystal panel 20 mounted thereon are attached on the peripheral portion of one glass substrate 2.

Figure 2:
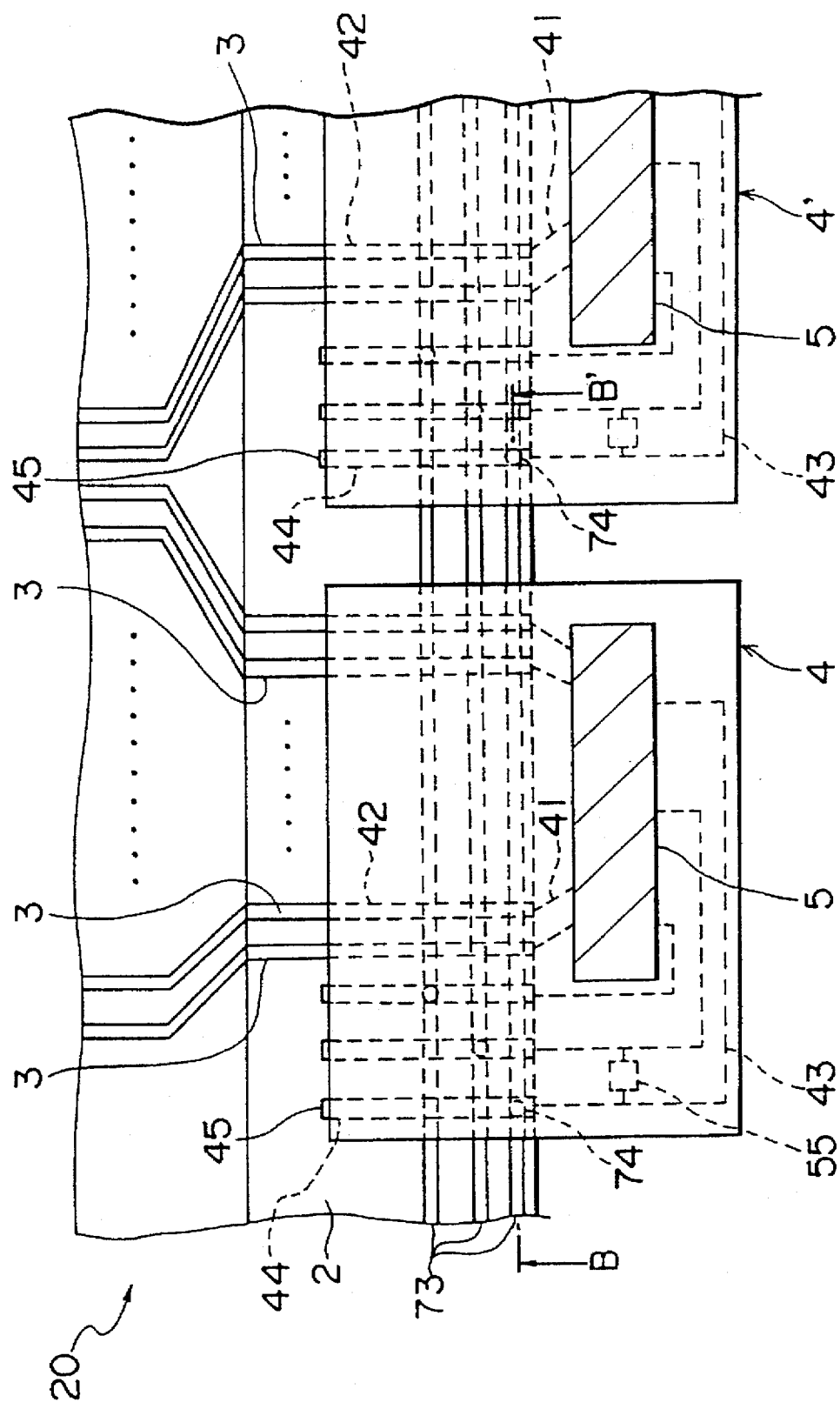
FIG. 2 is a plan view of the peripheral portion of the module shown in FIG. 1.
Figure 3:
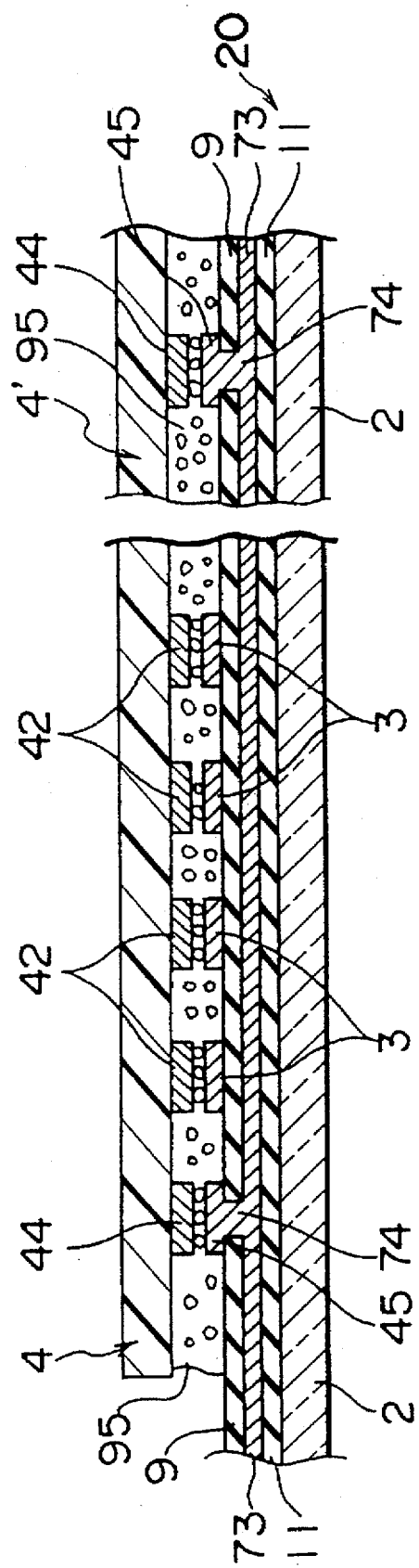
FIG. 3 is a sectional view taken along the line B–B' of FIG. 2.

FIG. 2 is a plan view of the peripheral portion of the liquid crystal panel 20 of FIG. 1, while FIG. 3 is a sectional view taken along the line B–B' of FIG. 2 in the arrow direction. As shown in FIG. 2, on the peripheral portion of the liquid crystal panel 20 (glass substrate 2), there are disposed a plurality of electrode terminals 3 which lead to pixels (not shown) inside the panel. As shown in FIG. 3, a bus line 73 as a circuit wiring is provided at a layer below the electrode terminals 3. The bus line 73 extends along the peripheral portion of the panel and is electrically insulated from the electrode terminals 3 with an insulating layer 9 interposed therebetween (a base coat 11 having insulating property is provided between the bus line 73 and the glass substrate 2). The bus line 73 has through holes 74 formed at specified points thereon. A junction terminal 45 is also provided so as to lead to the bus line 73 via the through holes 74. The junction terminal 45 shares the same layer with the electrode terminals 3 do. On the other hand, as shown in FIG. 2, the flexible wiring board 4 is rectangular in shape, having an input terminal 44 and output terminals 42 of a strip shape provided along one side line of the rectangle on one surface of the flexible wiring board 4. These input terminal 44 and output terminals 42 lead to the drive IC 5 by means of lines 43, 41. The drive IC 5 is mounted along a side line opposite to that for the input terminal 44 and the output terminals 42 by means of gang bond (collective thermal press bonding) or use of solder or conductive paste. It is noted that the line 43 has a capacitor 55 for use of signal adjustment connected thereto. Adjacent to the flexible wiring board 4 is provided a flexible wiring board 4' having the completely same arrangement as in the board 4.

In the assembling, while the peripheral portion of the liquid crystal panel 20 and the flexible wiring board 4 are opposed to each other, the junction terminal 45 and the electrode terminals 3 are aligned with the input terminal 44 and the output terminals 42, respectively, in one-to-one correspondence. Then, as shown in FIG. 3, the junction terminal 45 and the electrode terminals 3 are pressed or thermally press bonded with the input terminal 44 and the output terminals 42 by means of an anisotropic conductive material 95. Thereby, the junction terminal 45 and the electrode terminals 3 are collectively electrically connected to the input terminal 44 and the output terminals 42, respectively. Also, as shown in FIG. 1, a connector 8 for feeding drive-use signals from external is connected to a portion of the bus line 73 corresponding to a corner of the liquid crystal panel 20. Further, connection of the input terminal 44 and that of the output terminals 42 may be achieved by the anisotropic conductive material 95 or instead by other materials such as solder or photo-setting resins.

In operation, a drive-use signal is fed to the bus line 73 of the peripheral portion of the panel via the connector 8 from external. This signal is inputted to the drive IC 5 sequentially through the junction terminal 45, the input terminal 44 of the flexible wiring board 4, and the line 43 as shown in FIG. 2. A signal outputted by the drive IC 5 is fed to pixels (not shown) of the liquid crystal panel 20 sequentially through the line 41, the output terminals 42, and the electrode terminals 3 of the peripheral portion of the panel. Thus, the liquid crystal panel 20 is driven.

Since this liquid crystal module is provided with no common wiring board 307 that would be disposed on one side of the glass substrate 2 in the prior art (see FIG. 55), the size of the module can be reduced compared with the prior art. Also, the number of parts can be reduced so that the weight of the module can also be reduced. Such reduction in the number of parts allows a reduction in material cost. Yet, connection of the terminals 45, 3 of the peripheral portion of the panel and the terminals 44, 42 of the flexible wiring board can be accomplished only by a one-time connecting process. As a result, the man-hour required can be reduced compared with the prior art, leading to a cost reduction.

Figure 4A:
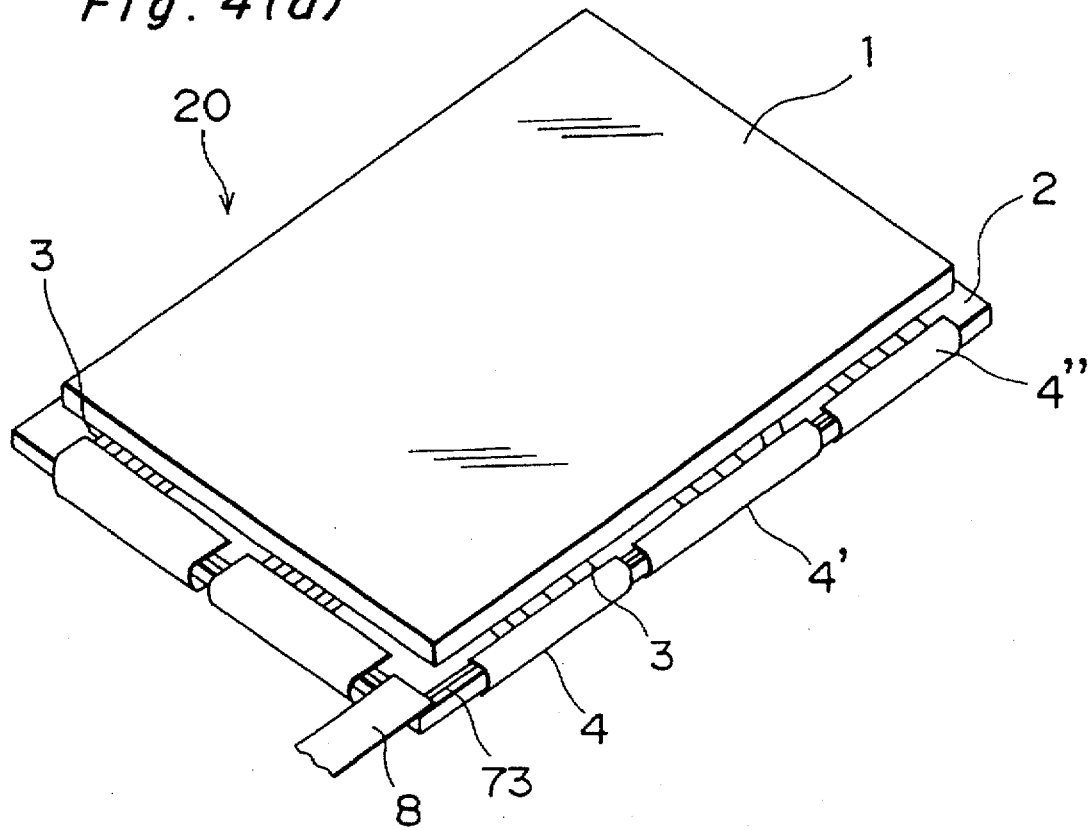
FIGS. 4(a) and 4(b) are views showing a modification example of the liquid crystal module.
Figure 4B:
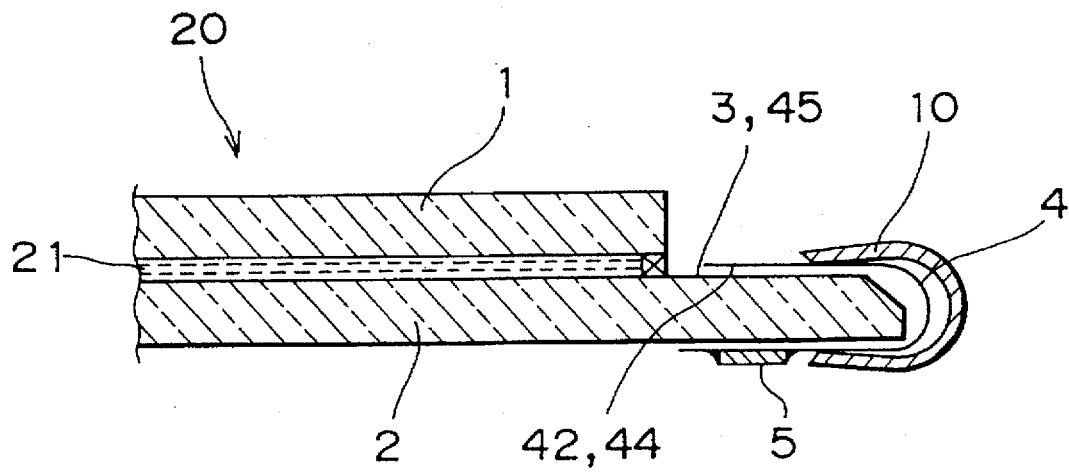

FIG. 4 shows a modification example of the above liquid crystal module. In this example, as shown in FIG. 4(a), after the connecting process, the portion of the flexible wiring boards 4, 4', . . . that projects sideward of the peripheral portion of the liquid crystal panel 20 (glass substrate 2) is bent so as to be wound around the peripheral portion of the panel. Further, as shown in FIG. 4(b), a clip 10 made of a shape memorizing alloy (or shape memory plastics) and having a U shape in section is used to pinch the peripheral portion of the panel on the outside of the flexible wiring board 4 so that the board 4 is press fitted thereto. This facilitates the connection of the terminals 45, 3 of the peripheral portion of the panel to the terminals 44, 42 of the flexible wiring board 4 in their correspondence, as well as the replacement of defective ICs.

Figure 5A:
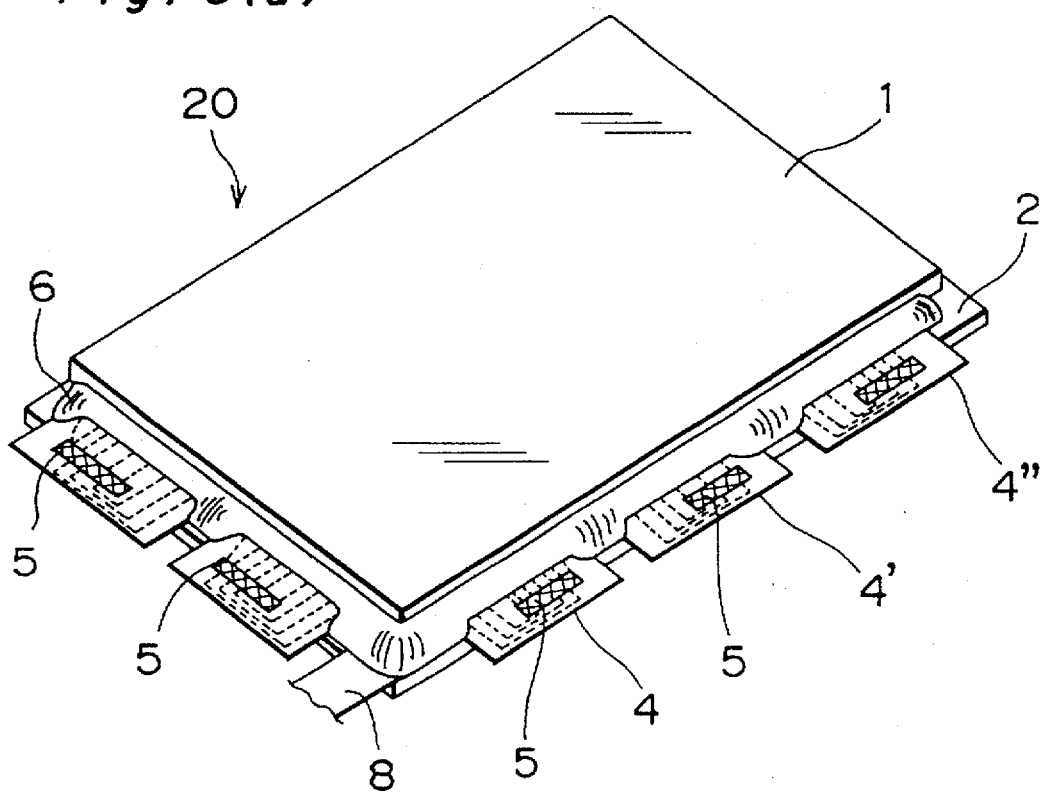
FIGS. 5(a) and 5(b) are views showing another modification example of the liquid crystal module.
Figure 5B:
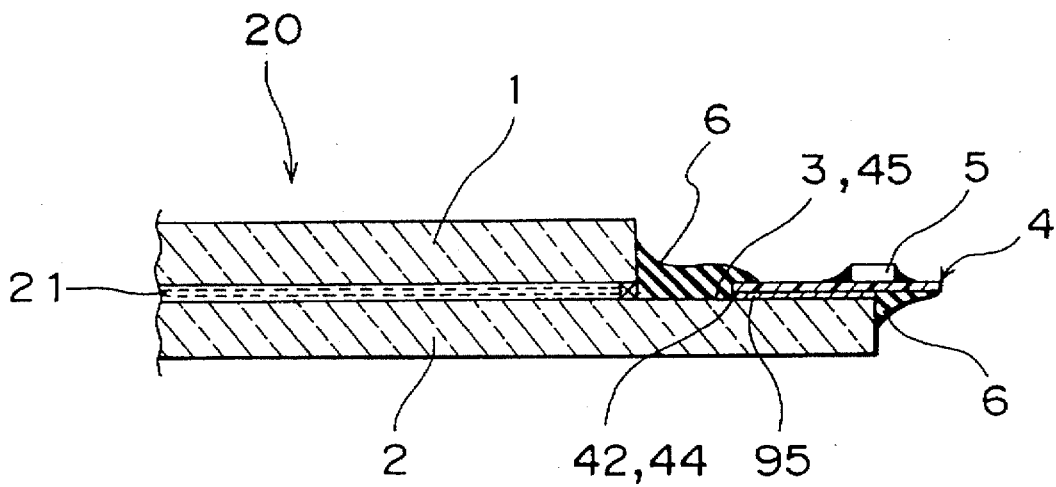
Figure 6A:
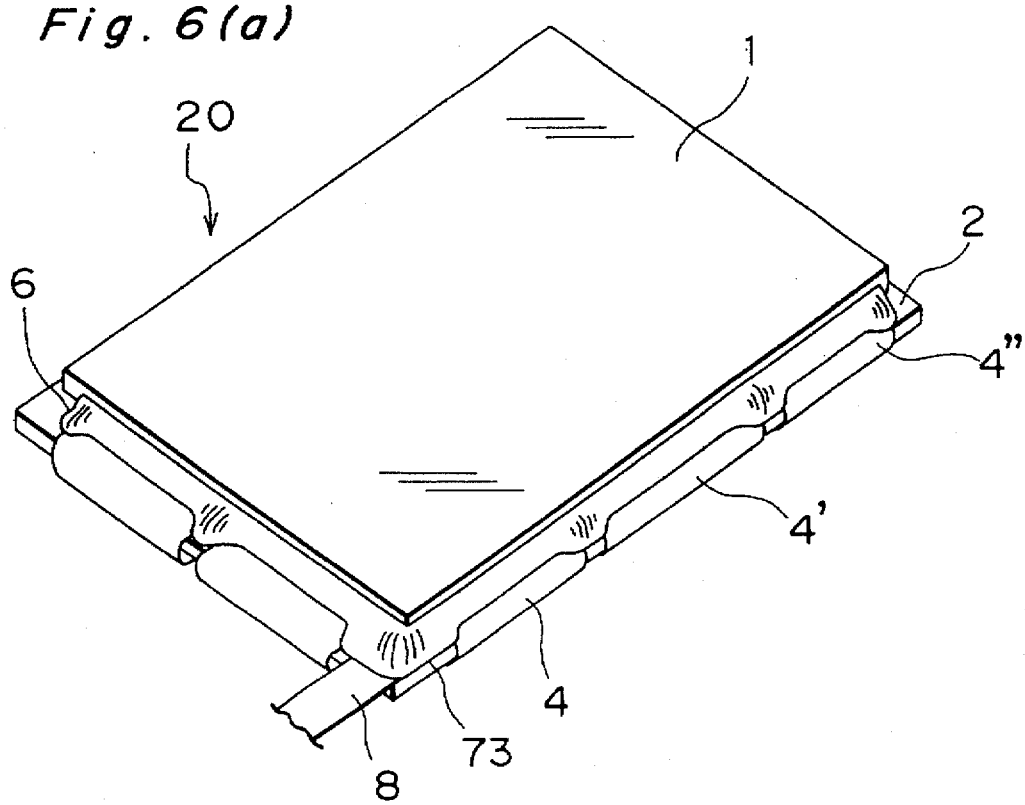
FIGS. 6(a), 6(b) and 6(c) are views showing further modification example of the liquid crystal module.
Figure 6B:
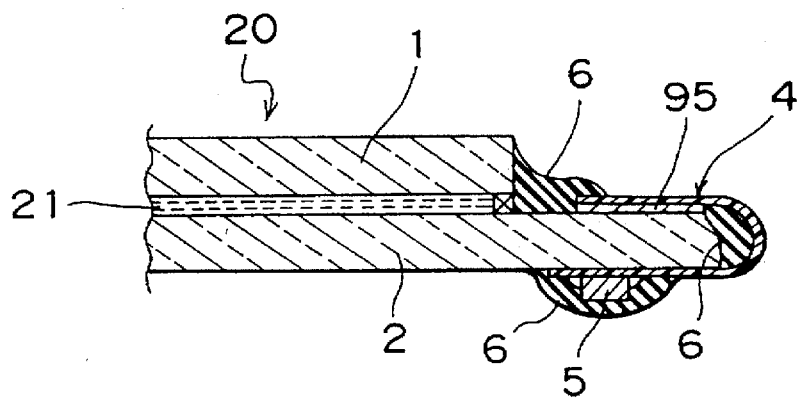
Figure 6C:
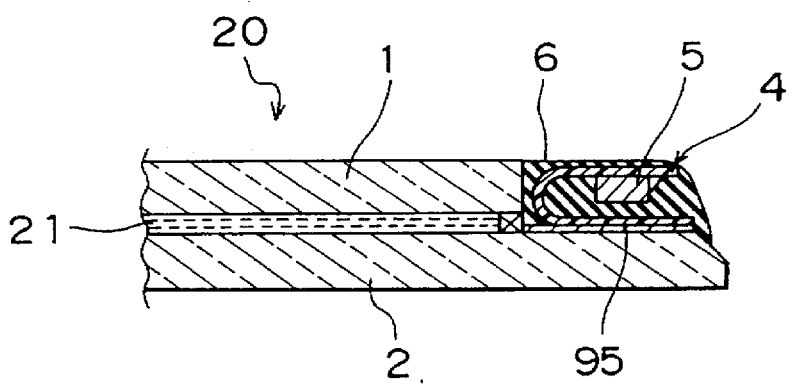

Otherwise, as shown in FIGS. 5(a), (b) and FIGS. 6(a), (b), portions where the peripheral portion of the liquid crystal panel 20 overlaps with the flexible wiring boards 4, 4', . . . as well as the drive IC 5 may be firmly coated with an epoxic, ultraviolet-setting type protective resin 6 with high rigidity, which would tend to crack in the conventional structure so that it could not be used. Also, of course, a silicone series, soft resin may be used to coat the portions as in the prior art. It is noted that FIGS. 5(a), (b) show an example in which the protective resin 6 is applied to the module of FIG. 1, while FIGS. 6(a), (b) show an example in which the protective resin 6 is applied to the module where the flexible wiring board is bent by its portion projecting out of the peripheral portion of the panel. The protective resin 6 serves to prevent any harmful substances such as moisture, NaCl, and $H_2O$ gas from penetrating the connecting portions between the terminals 45 and 44, or 3 and 42. As a result, the liquid crystal module can be improved in its reliability. Furthermore, as shown in FIG. 6(c), the flexible wiring board 4 may be bent and folded in two on the peripheral portion of the liquid crystal panel 20, and then coated as a whole with the protective resin 6.

FIG. 7 is a perspective view of a liquid crystal module which is an embodiment of the present invention according to its third and fourth aspects. A liquid crystal panel 120 has liquid crystals 121 (see FIG. 9) sealed between a pair of glass substrates 101, 102. Flexible wiring boards 104, 104', 104", 104S and 104S' each having a drive IC 105 for driving the liquid crystal panel 120 mounted thereon are attached on the peripheral portion of one glass substrate 102.

Figure 9:
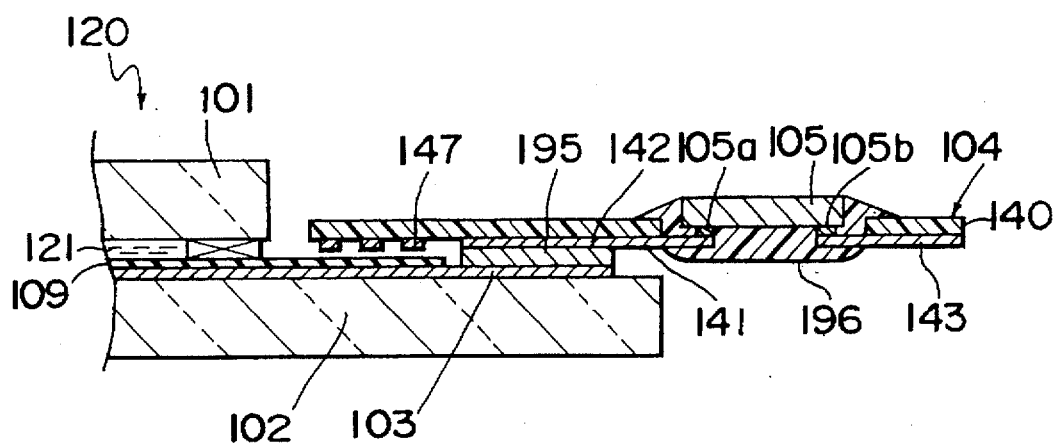
FIG. 9 is a sectional view of the peripheral portion of the liquid crystal module.

FIGS. 8(a) and (b) are plan views of the peripheral portion of the liquid crystal panel 120 and the flexible wiring board 104, respectively. As shown in FIG. 8(a), on the peripheral portion of the liquid crystal panel 120 (glass substrate 102), there are disposed a first junction terminal 145, electrode terminals 103, and a second junction terminal 146 at a specified pitch in a plurality in series, all of which terminals are strip shaped and share the same layer. The electrode terminals 103 lead to pixels (not shown) inside the panel via lines 131. A first circuit wiring 173 is provided on the panel's inner side of the junction terminals 146, 145. The first circuit wiring 173 extends along the peripheral portion of the panel, electrically connecting the junction terminal 146 and the junction terminal 145 to each other. In addition, the lines 131 and the first circuit wiring 173 are coated with an insulating layer 109. On the other hand, as shown in FIG. 8(b), the flexible wiring board 104 is of an approximately rectangular shape, having a wiring layer including an input terminal 144, output terminals 142, a third junction terminal 148 provided to a base material surface 140 with a flexibility. The input terminal 144, the output terminals 142, and the third junction terminal 148 are all strip-shaped and provided at places corresponding to the terminals 145, 103, and 146, respectively, of the peripheral portion of the panel on the rear side of the flexible wiring board 104. On one side of the flexible wiring board 104, a second circuit wiring 147 for connecting the input terminal 144 to the third junction terminal 148 is provided so as to extend along the row of the input terminal 144, output terminals 142, and a third junction terminal 148. The input terminal 144 and the output terminals 142 lead to the drive IC 105 via a line 143 and a line 141, respectively. The drive IC 105 is mounted on the flexible wiring board 104 in such a way that it extends in its longitudinal direction along the row of the input terminal 144, the output terminals 142, and the third junction terminal 148. Also, as shown in FIG. 9, the drive IC 105 is connected to the line 141 and the line 143 via a bump electrode 105a and a bump electrode 105b, respectively, and coated at its periphery with a resin 196. It is noted that, as shown in FIG. 8(b), a capacitor 155 for use of signal adjustment is connected to the line 143 so as to prevent any differences in display grade among the drive ICs 105, 105, . . . .

Also, it is preferable that an insulating resin or the like (not shown) is applied to the surface of the second circuit wiring 147 to enhance the insulating reliability among lines.

In the assembling, while the peripheral portion of the liquid crystal panel 120 and the flexible wiring board 104 are opposed to each other, the first junction terminal 145, the electrode terminals 103, and the second junction terminal 146 are aligned with the input terminal 144, the output terminals 142, and the third junction terminal 148, respectively, in one-to-one correspondence. Then, as shown in FIG. 9, the first junction terminal 145, the electrode terminals 103, and the second junction terminal 146 are thermally press bonded with the input terminal 144, the output terminals 142, and the third junction terminal 148 by means of an anisotropic conductive material 195. Thereby, the various terminals are collectively electrically connected to their corresponding ones. The flexible wiring board 104, as shown in the figure, is overlapped with the peripheral portion of the panel in such a way that the row of the input terminal 144, the output terminals 142, and the third junction terminal 148 is located outside the second circuit wiring 147. It is noted that the anisotropic conductive material 195 may be provided in such an extent as to cover the dimensions of the various terminals, or otherwise may be provided over the outer whole range of the insulating layer 109. Also, solder, photo-setting resins, or other connecting materials may be used instead of the anisotropic conductive material 195. In this way, as shown in FIG. 7, flexible wiring boards 104', 104" with the same pattern as that of the flexible wiring board 104 are connected along one side of the liquid crystal panel 120, while flexible wiring boards 104S, 104S' with a different pattern from that of the flexible wiring board 104 are connected along another side. Further, like the prior art, at a portion of the first circuit wiring 173 corresponding to a corner of the liquid crystal panel 120, a control board (not shown) for feeding signals for driving the liquid crystal panel 120 is connected via a connector 108.

In operation, a drive-use signal is fed to the first circuit wiring 173 of the peripheral portion of the panel via the connector 108 from the control board. This signal is inputted to the drive IC 105 sequentially through the first junction terminal 145, the input terminal 144 of the flexible wiring board 104, and the line 143 as shown in FIG. 8. A signal outputted by the drive IC 105 is fed to pixels (not shown) of the liquid crystal panel 120 sequentially through the line 141 and output terminals 142 of the flexible wiring board 104, the electrode terminals 103 of the peripheral portion of the panel, and the lines 131. Thus, the liquid crystal panel 120 is driven. Also, the signal is branched at the first junction terminal 145 so as to be fed to the first junction terminal 145 of another flexible wiring board 104' adjacent to the flexible wiring board 104, sequentially through the second circuit wiring 147 and third junction terminal 148 of the flexible wiring board 104, the second junction terminal 146 of the peripheral portion of the panel, and the first circuit wiring 173 leading thereto. Then the signal is inputted from the first junction terminal 145 via the input terminal of the flexible wiring board 104' to the drive IC 105. A signal outputted by this drive IC 105 is fed to the inside of the panel via the output terminals of the flexible wiring board 104' and the electrode terminals 103 of the peripheral portion of the panel. In this way, the signal is fed to the electrode terminals 103 of the flexible wiring boards 104, 104', ... adjacent to one another, in turn. The signal is similarly fed to the electrode terminals 103 of the flexible wiring boards 104S, 104S' adjacent to one another on another side of the liquid crystal panel 120 (FIG. 7).

Since this liquid crystal module is provided with no common wiring board 307 that would be disposed sideward of the panel in the prior art (see FIGS. 55 and 56), the size of the module can be reduced compared with the prior art. Also, the number of parts can be reduced so that the weight of the module can also be reduced. Such reduction in the number of parts allows a reduction in material cost. Yet, the first junction terminal 145, electrode terminals 103, and second junction terminal 146 of the peripheral portion of the panel are connected to the input terminal 144, output terminals 142, third junction terminal 148 of the flexible wiring board 104 collectively by means of the anisotropic conductive material 195. Further, the connection process of the flexible wiring boards 104, ... to the common wiring board is not involved (the control board is connected to the first circuit wiring of the peripheral portion of the panel via a connector as in the prior art). As a result, the man-hour required can be reduced compared with the prior art, leading to a cost reduction. A higher reliability also can be attained.

Figure 10:
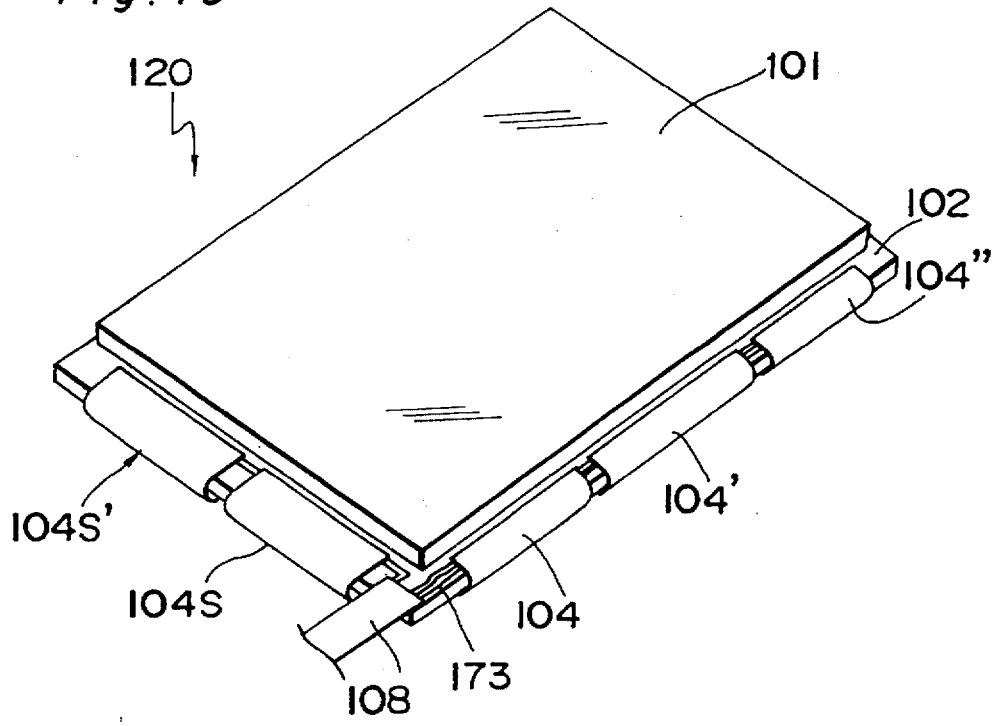
FIG. 10 is a perspective view showing a modification example of the liquid crystal module.
Figure 11:
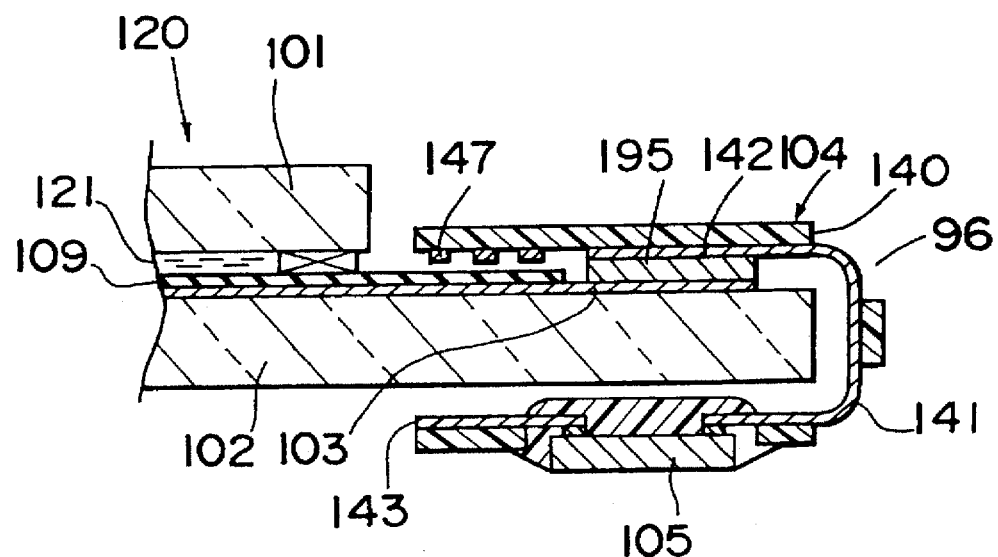
FIG. 11 is a sectional view of the modification example of FIG. 10.

FIGS. 10 and 11 show a modification example of the above-described liquid crystal module. In this example, as shown in FIG. 11, a slit 96 is provided to a portion of the base material surface 140 where the flexible wiring boards 104, ... are wound around the peripheral portion of the panel, in the direction along the peripheral portion. Further, the flexible wiring boards 104, ... are connected to the peripheral portion of the panel and thereafter bent by their portion projecting sideward of the peripheral portion of the liquid crystal panel 120 (glass substrate 102) so as to be wound around the peripheral portion of the panel. Thereby, the size of the module can be further reduced. It is noted that the provision of the slit 96 makes the flexible wiring boards 104, ... easy to bend, facilitating the assembling. In this assembling state, a clip (not shown) made of a shape memorizing alloy or shape memory plastics having a U shape in section may also be used to pinch the peripheral portion of the panel on the outer peripheral side of the flexible wiring boards 104, ... so that the various terminals involved are press bonded. As a result, the terminals can be easily connected to their corresponding ones.

Figure 12:
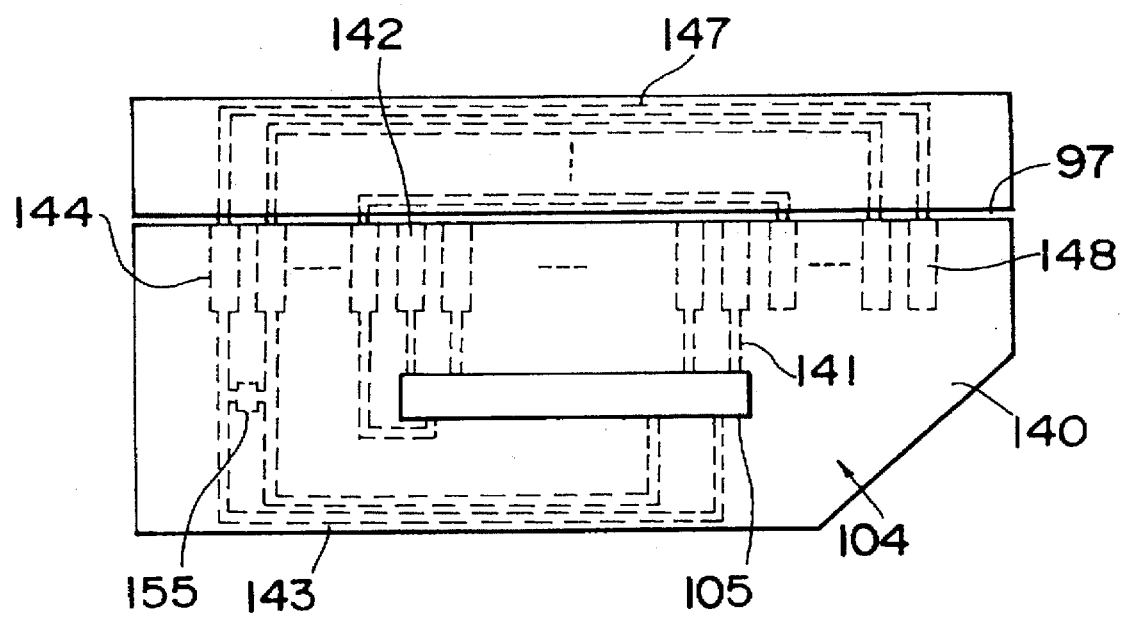
FIG. 12 is a plan view showing a flexible wiring board in which slit is provided.
Figure 13:
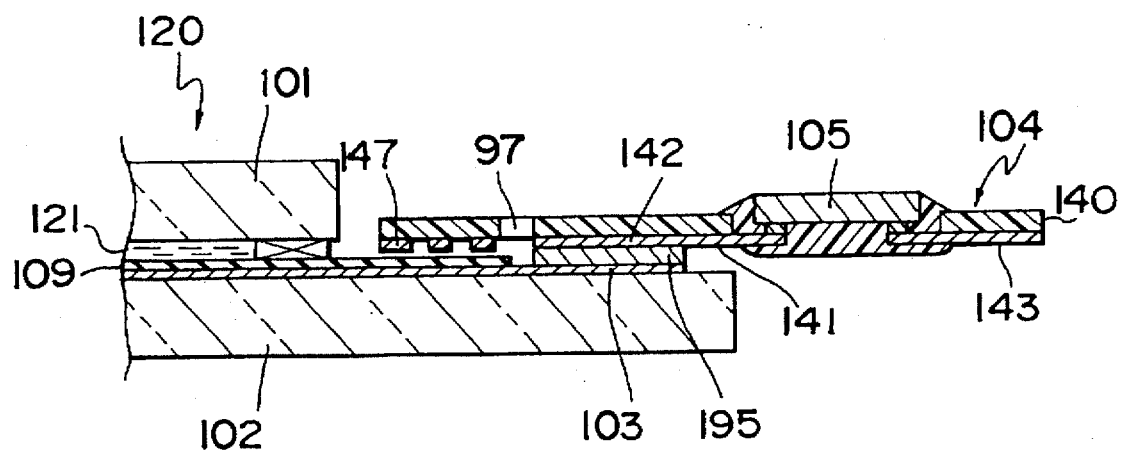
FIG. 13 is a sectional view of the flexible wiring board in which a slit is provided.

Also, as shown in FIGS. 12 and 13, a slit 97 may be provided to a portion of the base material surface 140 corresponding to a gap between the row of the input terminal 144, the output terminals 142, and the third junction terminal 148 of the flexible wiring board 4 and the second circuit wiring 147, so that it ranges along the gap. In this case, since the slit 97 is in proximity to the row of the terminals 144, 142, and 148, any excessive portions of the anisotropic conductive material 195 will easily flow out uniformly among the terminals through the slit 97 when the flexible wiring board 104 is connected to the peripheral portion of the panel, as shown in FIG. 13. As a result, a stabler reliability of the connecting portions is attained.

Figure 14:
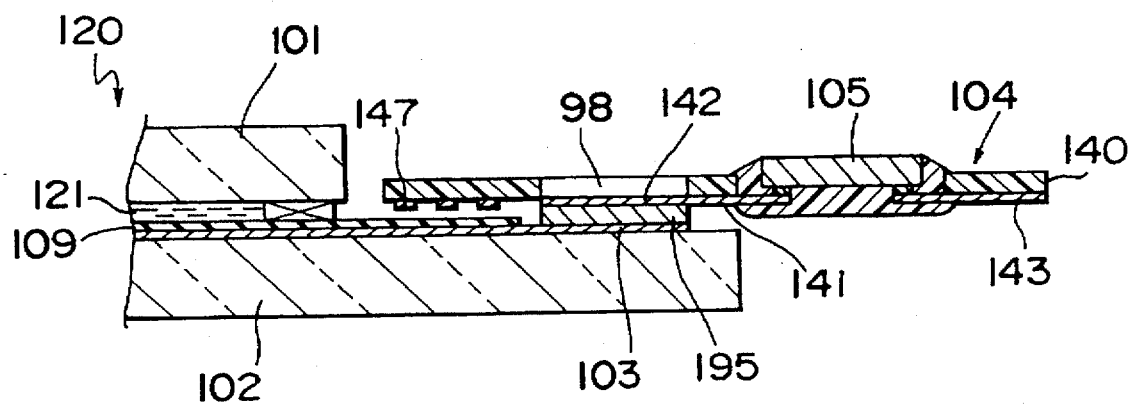
FIG. 14 is a sectional view of a flexible wiring board in which an opening is provided.

Further, as shown in FIG. 14, it is also possible that base material surface 140 of the flexible wiring board 104 corresponding to the input terminal 144, output terminals 142, and the third junction terminal 148 are removed and an opening 98 is provided. In this case, with the flexible wiring board 104 connected to the peripheral portion of the liquid crystal panel 120, a prober terminal for performance tests can be thrown in contact with the input terminal 144, output terminals 142, or third junction terminal 148 of the flexible wiring board 104. Therefore, performance tests for the liquid crystal panel 120 and the drive ICs can be easily performed.

Figure 15:
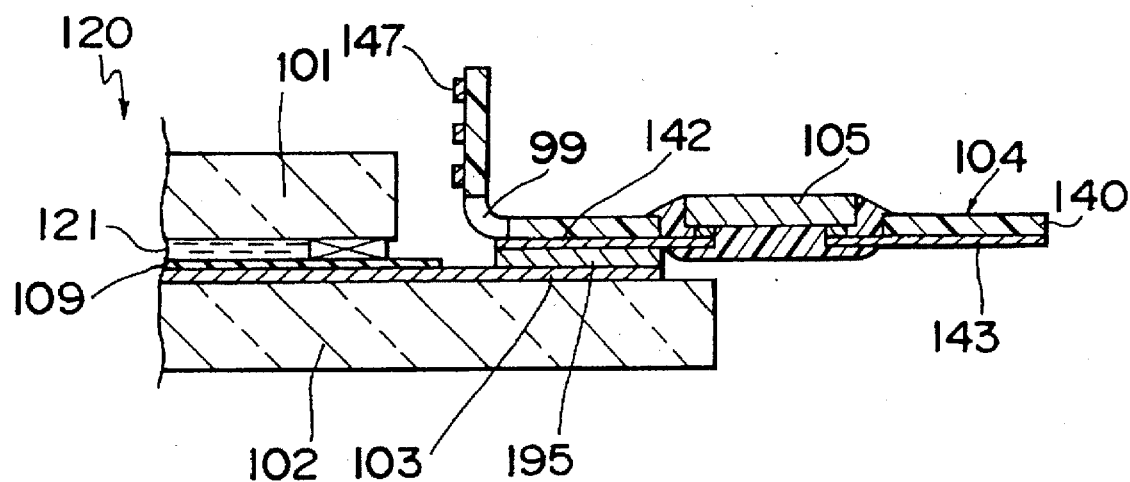
FIG. 15 is a sectional view of a flexible wiring board bent 90 degrees.

Further, as shown in FIG. 15, it is also possible that a portion of the flexible wiring board 104 corresponding to the second circuit wiring 147 is bent 90 degrees to 180 degrees with respect to the portions of the input terminal 144, the output terminals 142, and the third junction terminal 148. In such a case, the width of the peripheral portion of the panel is required only to be equivalent to the terminals 144, 142, and 148 so that the width of the peripheral portion of the panel can be designed narrow. As a result, the module size can be further reduced.

Figure 16:
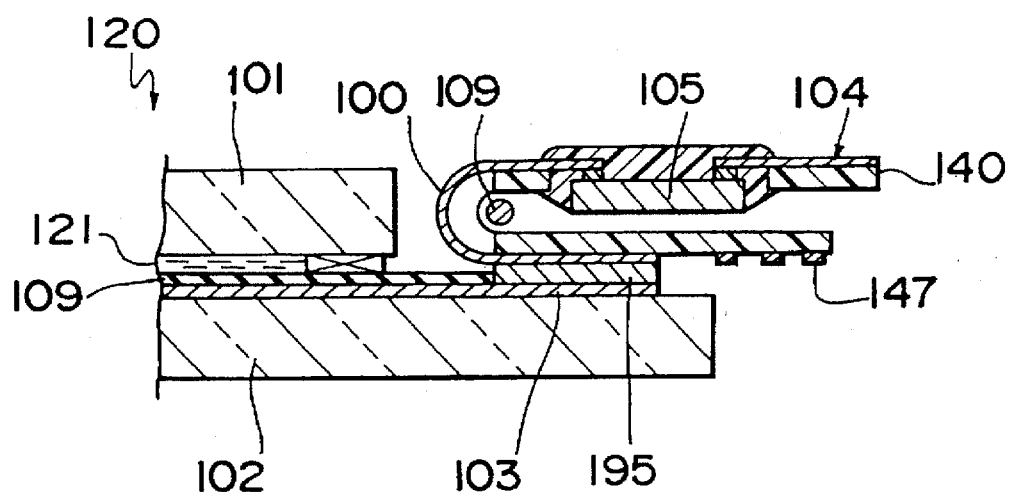
FIG. 16 is a sectional view of a flexible wiring board bent 180 degrees.

Further, as shown in FIG. 16, it is also possible that the flexible wiring board 104 is overlaid on the peripheral portion of the panel so that the row of the input terminal 144, the output terminals 142, and the third junction terminal 148 is located inside the second circuit wiring 147, and that a portion of the flexible wiring board 104 opposite to the second circuit wiring 147 is bent 90 degrees to 180 degrees with respect to the portions corresponding to the terminals 144, 142, and 148. It is noted that numeral 109 denotes a rod-like member for giving the bent portion 100 of the flexible wiring board 104 a curvature. In such a case, as in the case of FIG. 15, the width of the peripheral portion of the panel is required only to be equivalent to the terminals 144, 142, and 148, so that the width of the peripheral portion of the panel can be designed narrow. As a result, the module size can be further reduced. Yet, since the drive IC 105 is mounted at the bent portion as shown in the figure, the extent in which the flexible wiring board 104 projects sideward of the peripheral portion of the panel can be reduced by an extent corresponding to the width of the drive IC. As a result, the module size can be further reduced.

In addition, the flexible wiring board may be a front-and-rear double-layer wiring type with bumps. This makes possible to design other different compact modules.

Figure 17:
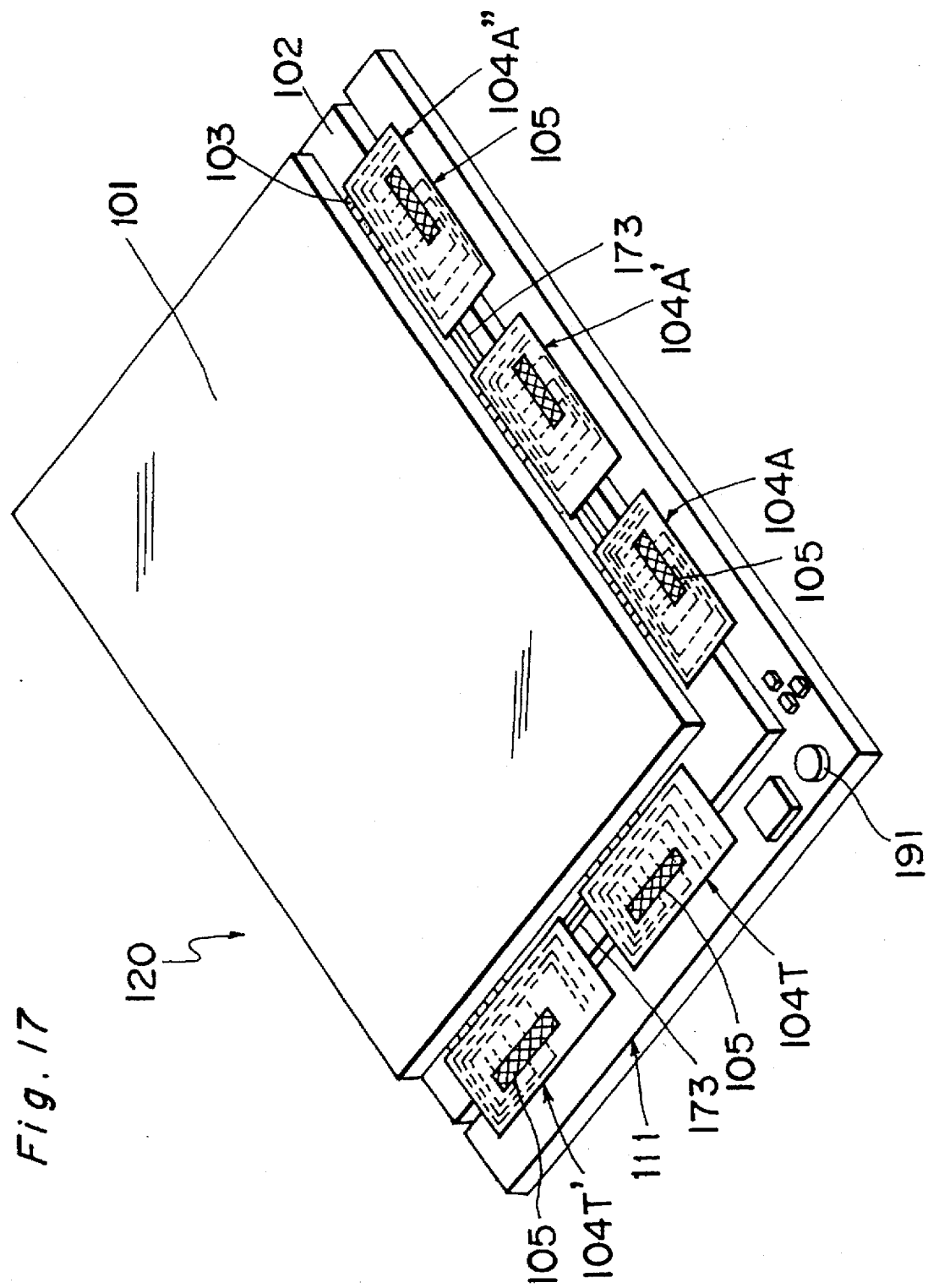
FIG. 17 is a perspective view of a liquid crystal module which is an embodiment of the present invention.

FIG. 17 is a perspective view of a liquid crystal module which is an embodiment according to the fourth and sixth aspect of the present invention. A liquid crystal panel 120 has liquid crystals 121 (see FIG. 22) sealed between a pair of rectangular glass substrates 101, 102. Five flexible wiring boards 104A, 104A', 104A", 104T, and 104T' each having a drive IC 105 for driving the liquid crystal panel 120 mounted thereon are attached on the peripheral portion of one glass substrate 102. An L-shaped control board 111 for feeding signals for driving the liquid crystal panel 120 is provided along the peripheral portion of the liquid crystal panel 120 (numeral 191 denotes an electronic component).

Figure 18:
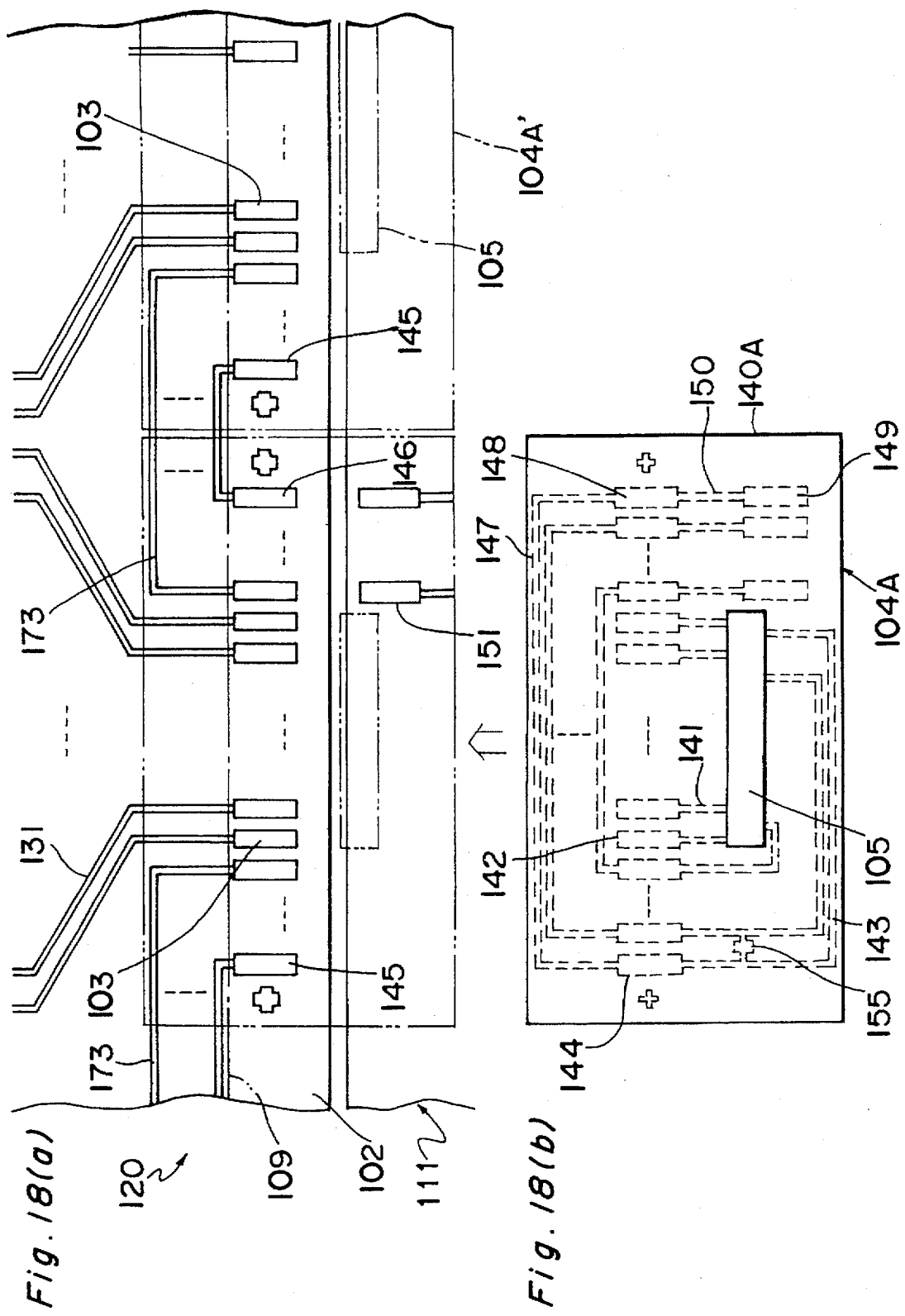
FIGS. 18(a) and 18(b) are plan views of the peripheral portion of the liquid crystal module.
Figure 22:
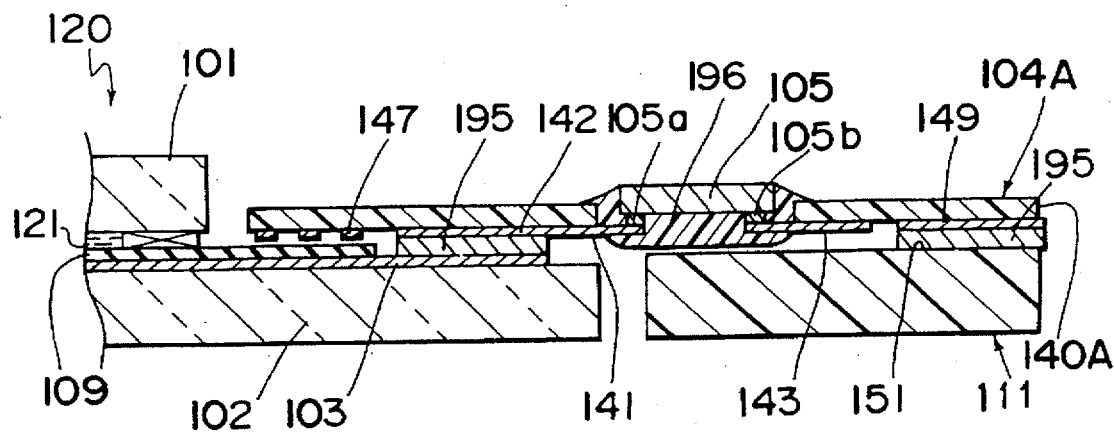
FIG. 22 is a main-part sectional view showing a liquid crystal module of FIG. 17.
Figure 23:
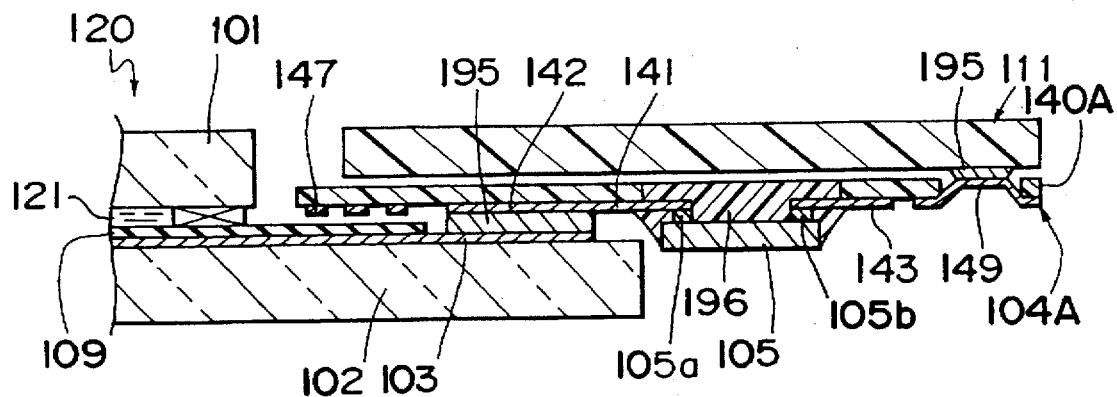
FIG. 23 is a sectional view showing a modification example of the liquid crystal module of FIG. 17.

FIGS. 18(a) and (b) are plan views of the peripheral portion of the liquid crystal panel 120 and the flexible wiring board 104A, respectively. As shown in FIG. 18(a), on the peripheral portion of the liquid crystal panel 120 (glass substrate 102), there are disposed a first junction terminal 145, electrode terminals 103, and a second junction terminal 146 at a specified pitch in a plurality in series, all of which terminals are strip shaped and share the same layer. The electrode terminals 103 lead to pixels (not shown) inside the panel via lines 131. A first circuit wiring 173 is provided on the panel's inner side of the junction terminals 146, 145. The first circuit wiring 173 extends along the peripheral portion of the panel, electrically connecting the junction terminal 146 and the junction terminal 145 to each other. In addition, the lines 131 and the first circuit wiring 173 are covered with an insulating layer 109. On the other hand, as shown in FIG. 18(b), the flexible wiring board 104A is of an approximately rectangular shape, having a wiring layer including an input terminal 144, output terminals 142, a third junction terminal 148 provided to a base material surface 140 with a flexibility. The input terminal 144, the output terminals 142, and the third junction terminal 148 are all strip-shaped and provided at places corresponding to the terminals 145, 103, and 146, respectively, of the peripheral portion of the panel on the rear side of the flexible wiring board 104A. On one side of the flexible wiring board 104A, a second circuit wiring 147 for connecting the input terminal 144 to the third junction terminal 148 is provided so as to extend along the row of the input terminal 144, output terminals 142, and a third junction terminal 148. The input terminal 144 and the output terminals 142 lead to the drive IC 105 via a line 143 and a line 141, respectively. The drive IC 105 is mounted on the flexible wiring board 104A in such a way that it extends in its longitudinal direction along the row of the input terminal 144, the output terminals 142, and the third junction terminal 148. Also, as shown in FIG. 22, the drive IC 105 is connected to the line 141 and the line 143 via a bump electrode 105a and a bump electrode 105b, respectively. Also, as shown in FIG. 18(b), a fourth junction terminal 149 is provided to the flexible wiring board 104A. This fourth junction terminal 149 leads to the third junction terminal 148 via the third circuit wiring 150 and is located at a place corresponding to a signal feed terminals 151 provided on one surface of the control board 111 shown in FIG. 18(a). It is noted that a capacitor 155 for use of signal adjustment is connected to the line 143 so as to prevent any differences in display grade among the drive ICs 105, 105, . . . .

In the assembling, while the peripheral portion of the liquid crystal panel 120 and the flexible wiring board 104A are opposed to each other, the first junction terminal 145, the electrode terminals 103, and the second junction terminal 146 are aligned with the input terminal 144, the output terminals 142, and the third junction terminal 148, respectively, in one-to-one correspondence. Then, as shown in FIG. 22, the first junction terminal 145, the electrode terminals 103, and the second junction terminal 146 are thermally press bonded with the input terminal 144, the output terminals 142, and the third junction terminal 148 by means of an anisotropic conductive material 195. Thereby, the various terminals are collectively electrically connected to their corresponding ones. The flexible wiring board 104A, as shown in the figure, is overlapped with the peripheral portion of the panel in such a way that the row of the input terminal 144, the output terminals 142, and the third junction terminal 148 is located outside the second circuit wiring 147. It is noted that the anisotropic conductive material 195 may be provided in such an extent as to cover the dimensions of the various terminals, or otherwise may be provided over the outer whole range of the insulating layer 109. Also, solder or other connecting materials may be used instead of the anisotropic conductive material 195. In this way, as shown in FIG. 17, flexible wiring boards 104A', 104A", with the same pattern as that of the flexible wiring board 104A are connected along one side of the liquid crystal panel 120, while flexible wiring boards 104T, 104T' with a different pattern from that of the flexible wiring board 104A are connected along another side. Further, the fourth junction terminals 149 of the flexible wiring boards 104A, . . . are aligned with the signal feed terminals 151 of the control board 111 each in one-to-one correspondence, and the corresponding terminals are connected to each other by means of the anisotropic conductive material 195 as shown in FIG. 22.

In operation, a signal is fed from the signal feed terminal 151 of the control board 111 to the fourth junction terminal 149 of the flexible wiring board 104A. This signal is inputted to the drive IC 105 from the fourth junction terminal 149 sequentially through the third circuit wiring 150, the third junction terminal 148, the second circuit wiring 147, the input terminal 144, and the line 143, as shown in FIG. 18(b). A signal outputted by the drive IC 105 is fed to pixels (not shown) of the liquid crystal panel 120 sequentially through the line 141 and output terminals 142 of the flexible wiring board 104A, the electrode terminals 103 of the peripheral portion of the panel, and the lines 131 (direct route). Thus, the liquid crystal panel 120 is driven at a shortest route and with less wire resistance. Also, the signal can be fed to the panel in another indirect route as described below. That is, the signal is branched at the third junction terminal 148 of the flexible wiring board 104A so as to be fed to the first junction terminal 145 of another flexible wiring board 104' adjacent to the flexible wiring board 104A through the second junction terminal 146 of the peripheral portion of the panel and the first circuit wiring 173 leading thereto. Then the signal is inputted from the first junction terminal 145 via the input terminal 144 of the flexible wiring board 104A' to the drive IC 105. A signal outputted by this drive IC 105 is fed to the inside of the panel via the output terminals of the flexible wiring board 104A' and the electrode terminals 103 of the peripheral portion of the panel. In this way, the signal is fed to the electrode terminals 103 of the adjacent flexible wiring boards 104A, 104A', . . . , in turn.

Since this liquid crystal module is provided with no common wiring board 307 or connector that would be disposed sideward of the panel in the prior art (see FIGS. 55 and 56), the size of the module can be reduced compared with the prior art. Also, the number of parts can be reduced so that the weight of the module can also be reduced. Such reduction in the number of parts allows a reduction in material cost. Yet, the first junction terminal 145, electrode terminals 103, and second junction terminal 146 of the peripheral portion of the panel are connected to the input terminal 144, output terminals 142, third junction terminal 148 of the flexible wiring board 104A, . . . collectively by means of the anisotropic conductive material 195. Further, the connection process of the flexible wiring boards 104A, . . . to the control board 111 can be achieved by such less work as to be equivalent to the connection process for the common wiring board of the prior art. The connection process for the connector can be completely omitted. As a result, the man-hour required can be reduced as a whole, compared with the prior art, leading to a cost reduction. A higher reliability also can be attained. Further, the control board 111 may be a board made of hard type glass epoxy, or otherwise of thin, soft type polyimide or polyester. The latter case allows further reduction in thickness and weight of the module.

Figure 19:
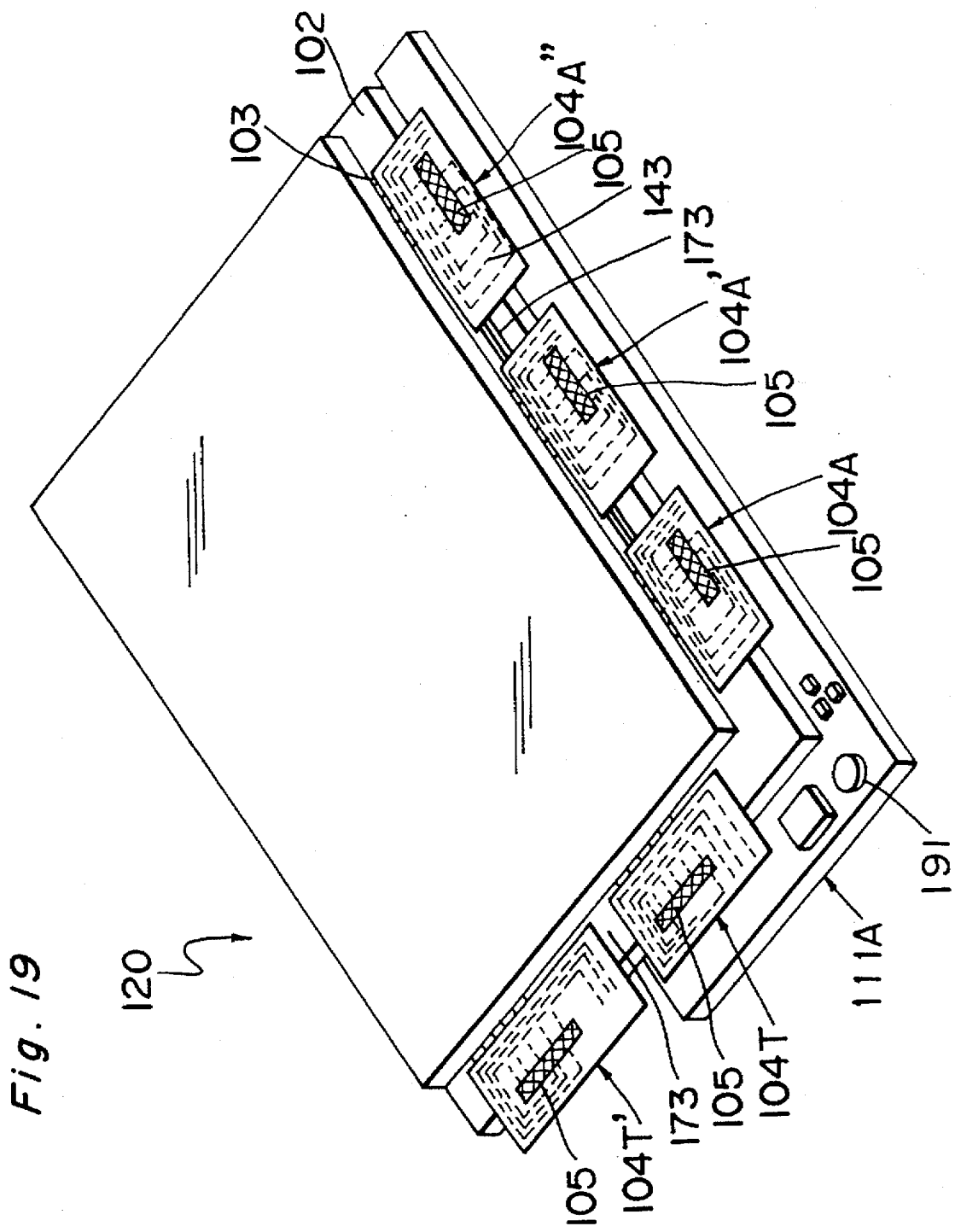
FIG. 19 is a perspective view showing an modification example of the liquid crystal module of FIG. 17.
Figure 20:
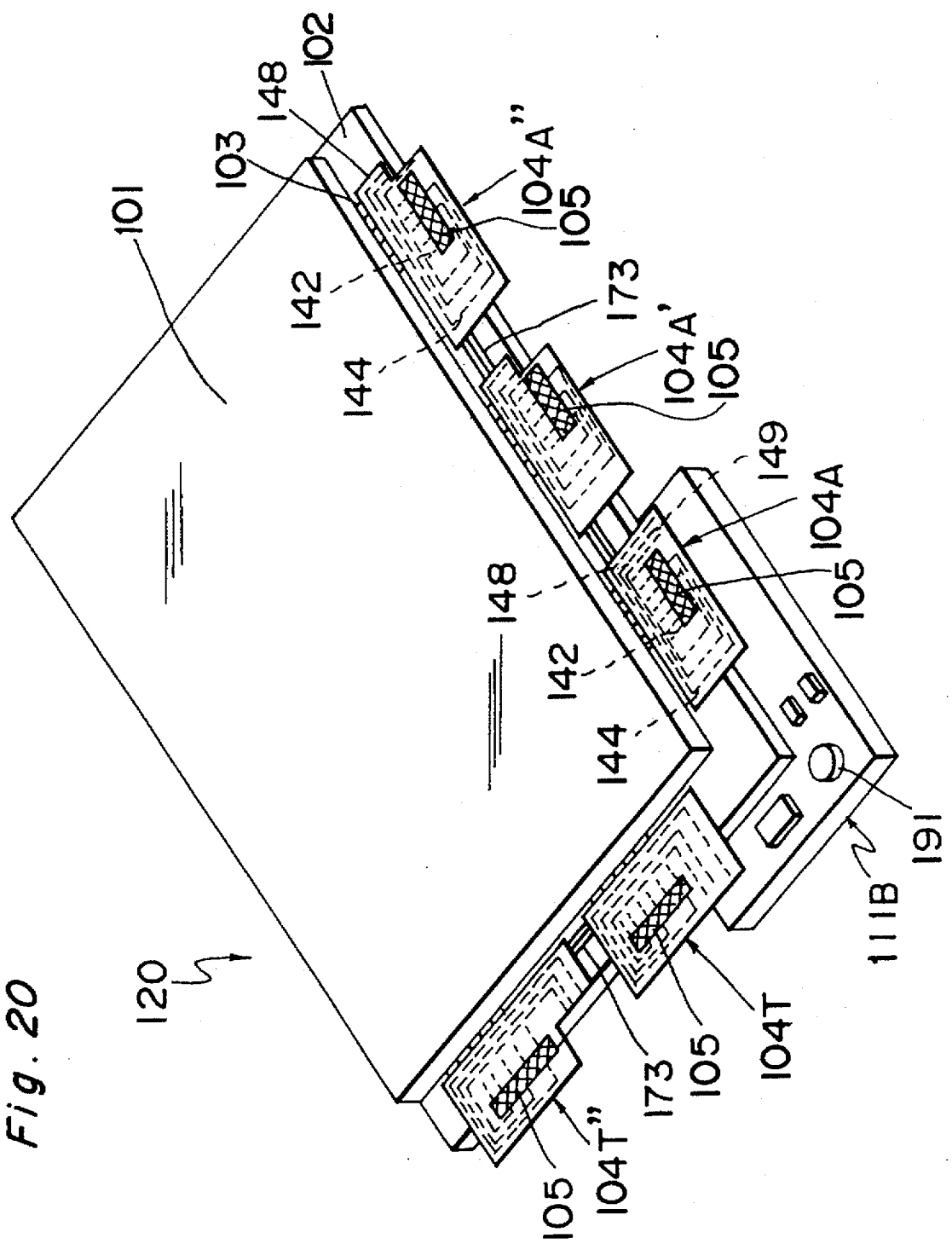
FIG. 20 is a perspective view showing a modification example of the liquid crystal module of FIG. 17.
Figure 21:
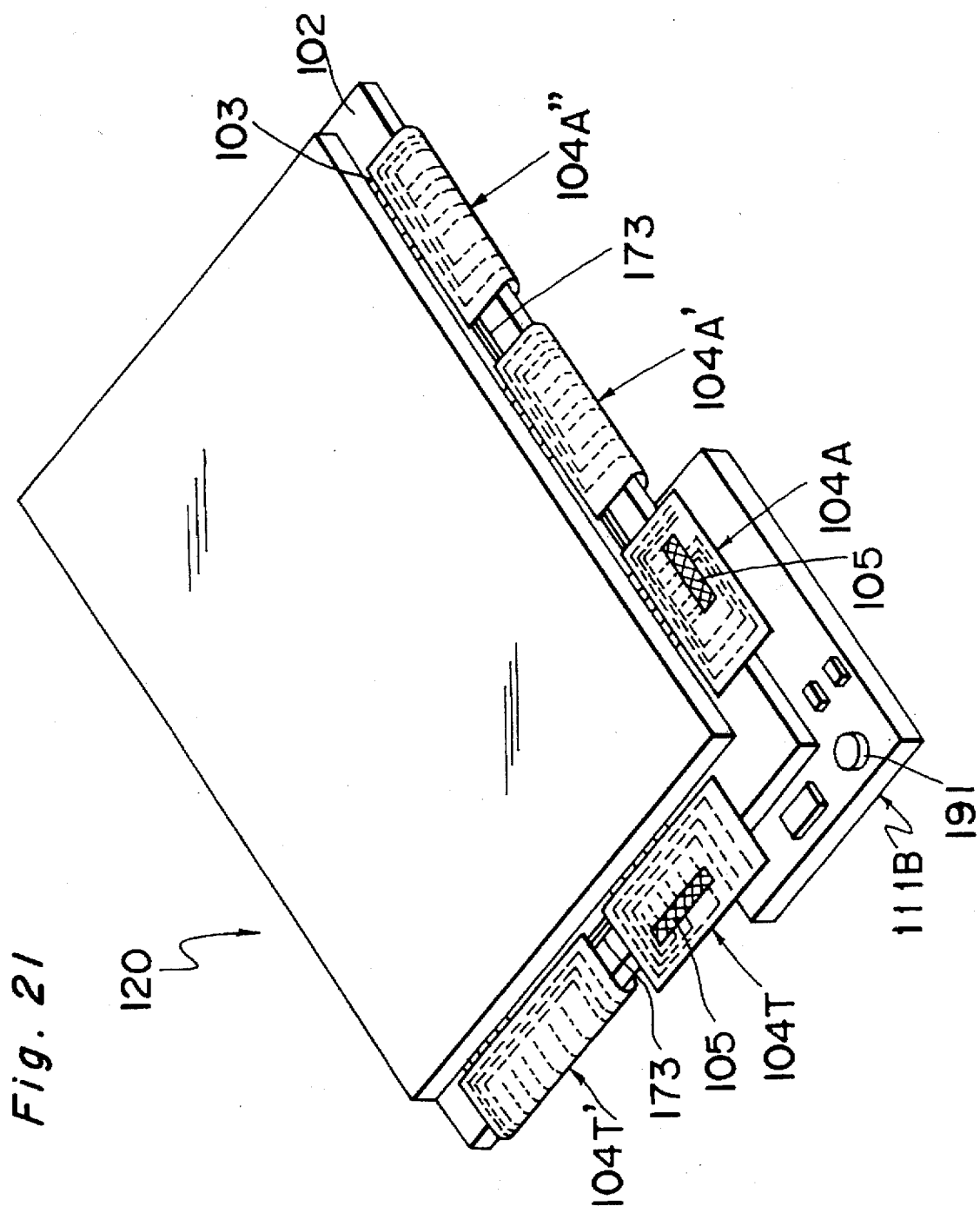
FIG. 21 is a perspective view showing a modification example of the liquids crystal module of FIG. 17.

FIGS. 19 to 21 each show a modification example of the above-described liquid crystal module. In the liquid crystal module shown in FIG. 19, the fourth junction terminal 149 of the flexible wiring board 104T' is not connected to the signal feed terminal of a control board 111A (the control board 111A is so designed that its shorter side line of an L-shape become short for weight reduction, as compared with the control board 111 shown in FIG. 17). As a result, the number of points where the flexible wiring board is connected to the control board 111A can be reduced, so that the man-hour required can be reduced with further cost reduction. In this case, the drive-use signal is fed to the portions of the peripheral portion of the panel corresponding to the flexible wiring boards 104A, 104A', 104A", and 104T via the aforementioned direct route, while the signal is fed to the portion of the peripheral portion of the panel corresponding to the flexible wiring board 104T' via the aforementioned indirect route.

In the liquid crystal module shown in FIG. 20, the fourth 3unction terminal 149 and the third circuit wiring 150 of the flexible wiring boards 104A, 104A', and 104T" have been cut off and removed together with the base material surface 140 (a control board 111B is so designed that both its longer and shorter side lines of L-shape become short for weight reduction). As a result, the number of points where the flexible wiring board is connected to the control board 111A can be reduced, so that the man-hour required can be reduced with further cost reduction. In this case, there is no need of preparing different types of flexible wiring boards before assembling. Instead, the fourth junction terminal 149 and the third circuit wiring 150 may be cut off and removed before starting the assembling. Further, the aforementioned drive-use signal is fed to the portions of the peripheral portion of the panel corresponding to the flexible wiring boards 104A, 104T via the aforementioned direct route, while the signal is fed to the portions of the peripheral portion of the panel corresponding to the flexible wiring board 104A', 104A", and 104T" via the aforementioned indirect route.

In the liquid crystal module shown in FIG. 21, the portions of the flexible wiring boards 104A', 104A", and 104T', which are not connected to the control board 111B, that project sideward of the peripheral portion of the panel are bent so as to be wound around the peripheral portion of the panel. Thereby, the number of points where the flexible wiring boards are connected to the control board 111B can be reduced. Besides, the module size can be further reduced.

FIGS. 23 to 27 show another modification example of the above-described liquid crystal module. In the liquid crystal module shown in FIG. 23, the control board 111 is partially overlapped on the flexible wiring board 104A of the peripheral portion of the panel, and bonded therewith by an unshown adhesive (or double-sided tape) so as to be integrally attached. In this case, the strength of the module can be increased so that the its reliability also can be enhanced. Further, since there is no need of providing any additional reinforcement member for mounting the liquid crystal panel 120 and the control board 111, the module can be designed to be further small-size and lightweight.

Figure 24:
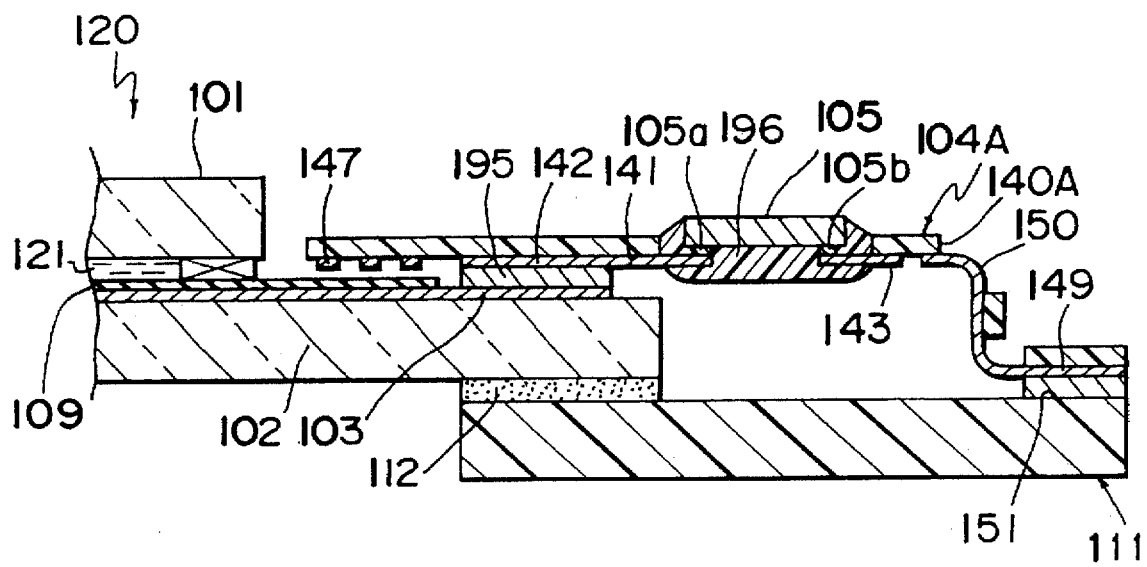
FIG. 24 is a sectional view showing a modification example of the liquid crystal module of FIG. 17.
Figure 28:
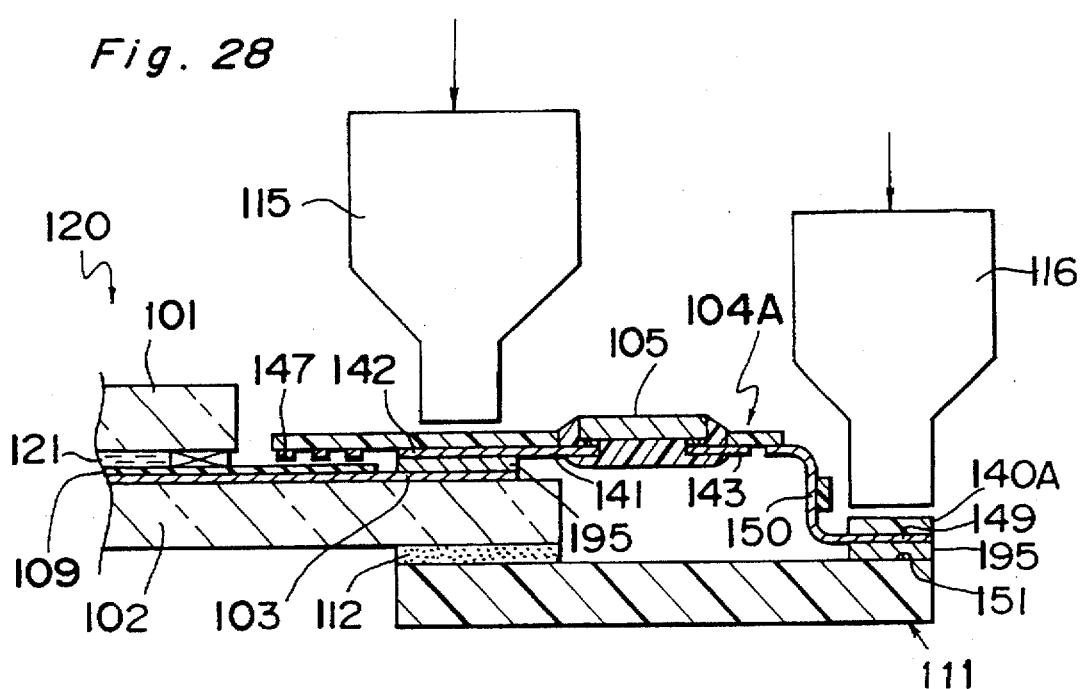
FIG. 28 is a sectional view showing an assembled state of the liquid crystal module of FIG. 24.
Figure 29:
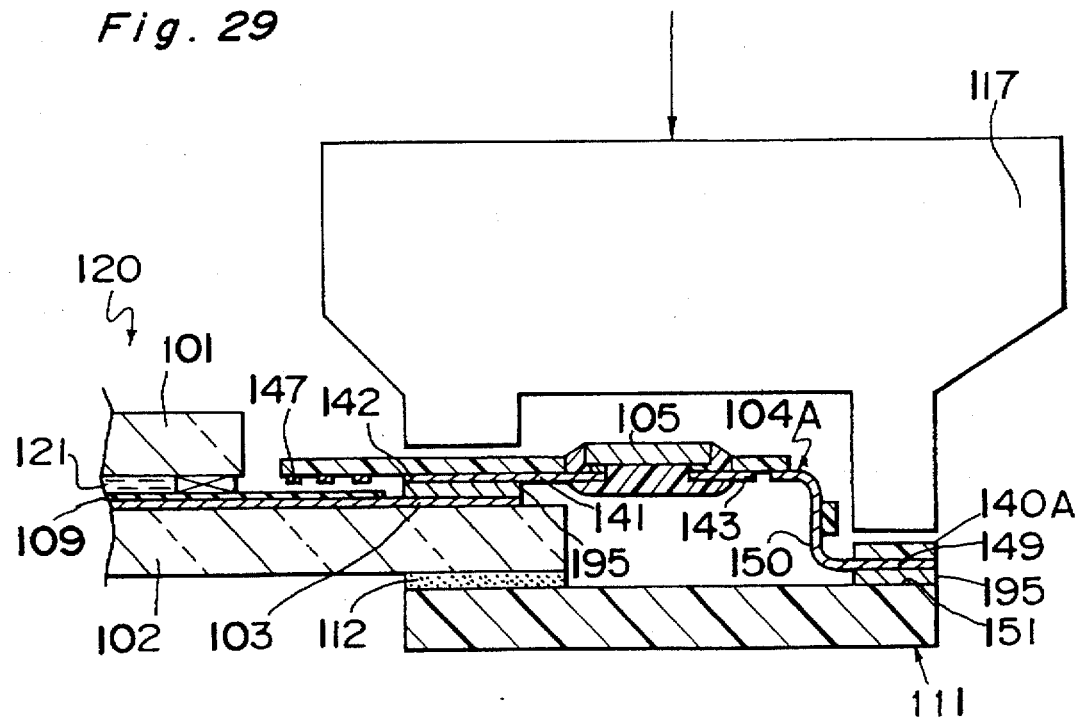
FIG. 29 is a sectional view showing an assembled state of the liquid crystal module of FIG. 24.

In the liquid crystal module shown in FIG. 24, the control board 111 is integrally mounted on a surface opposite to the surface on which the electrode terminals 103 of the peripheral portion of the panel are provided, in such a way as to be partially overlapped therewith and bonded by an adhesive 112. The portion of the flexible wiring board 104A corresponding to the third circuit wiring 150 is bent at two points so that a step gap approximately equivalent to the thickness of the glass substrate 2 can be formed. In the assembling, first, the liquid crystal panel 120 and the control board 111 are bonded together. Then, the output terminals 142, . . . of the flexible wiring board 104A bent as shown in the figure are aligned with the electrode terminals 103, . . . of the peripheral portion of the panel, while the fourth junction terminal 149 of the flexible wiring board 104A is aligned with the signal feed terminal 151 of the control board 111. Next, as shown in FIG. 28, identical anisotropic conductive materials 195, 195 are fed between the flexible wiring board 104A and the peripheral portion of the panel and between the flexible wiring board 104A and the control board 111, so as to be provided between corresponding terminals. Then the corresponding terminals are thermally press bonded simultaneously by two thermal press bonding heads 115, 116. Otherwise, as shown in FIG. 29, the corresponding terminals are thermally press bonded simultaneously by a thermal press head 117 having two head tips. Thereby, the number of connecting processes is reduced, so that the man-hour required can be reduced with cost reduction. Yet, as in the case shown in FIG. 23, the strength of the module can be increased, so that the reliability is enhanced. As a result, the module can be designed for smaller size and less weight.

Figure 25:
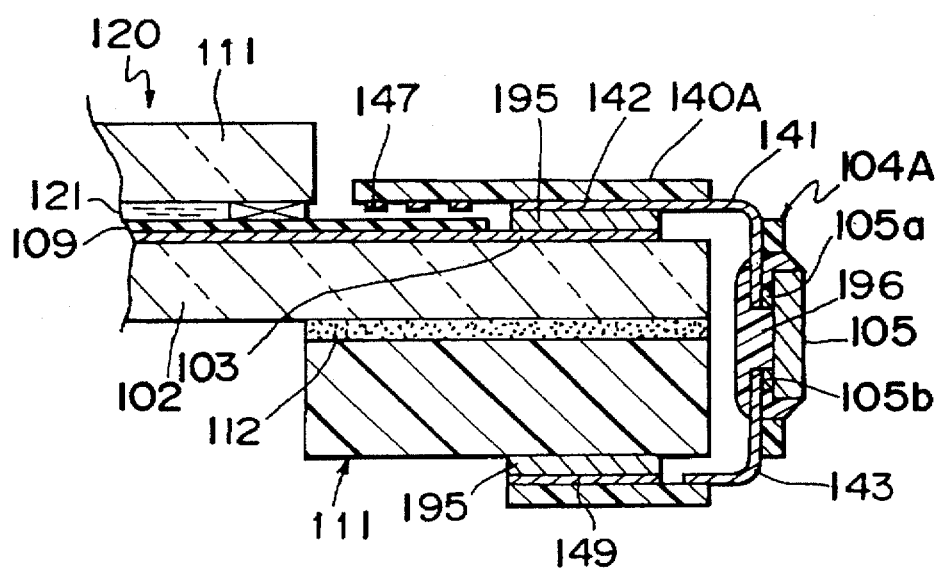
FIG. 25 is a sectional view showing a modification example of the liquid crystal module of FIG. 17.
Figure 26:
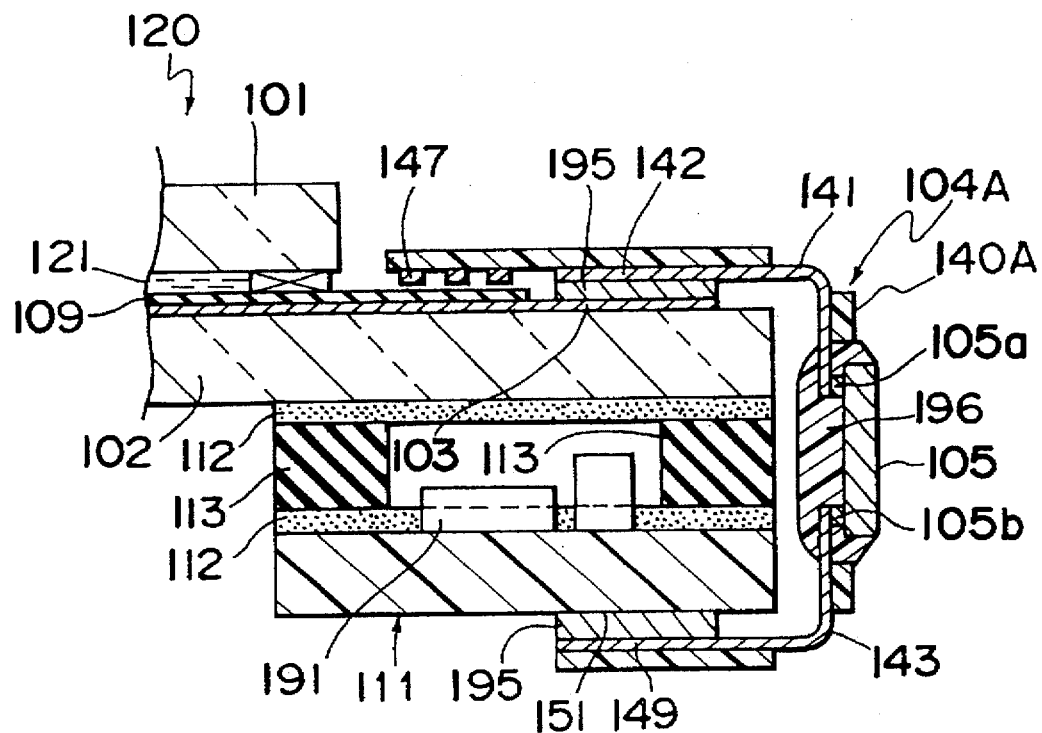
FIG. 26 is a sectional view showing a modification example of the liquid crystal module of FIG. 17.

In the liquid crystal module shown in FIG. 25, the control board 111 is mounted on a surface opposite to the surface on which the electrode terminals 103 of the peripheral portion of the panel are provided in such a way that the control board 111 is bonded by the adhesive 112 so as not to project sideward of the peripheral portion of the panel. The flexible wiring board 104A is bent so as to be wound around the peripheral portions of the liquid crystal panel 120 and the control board 111. In this case, since the control board 111 does not project sideward of the liquid crystal panel 120, the module size can be further reduced. Yet, as in the cases shown in FIGS. 23 and 24, the strength of the module can be increased so that its reliability can be enhanced and that the module can be designed to be lightweight. In addition, when an electronic component 191 is mounted on the control board 111 as shown in FIG. 26, spacers 113, 113 may be provided between the glass substrate 102 and the control board 111 to ensure a clearance for the electronic component 191.

Figure 27:
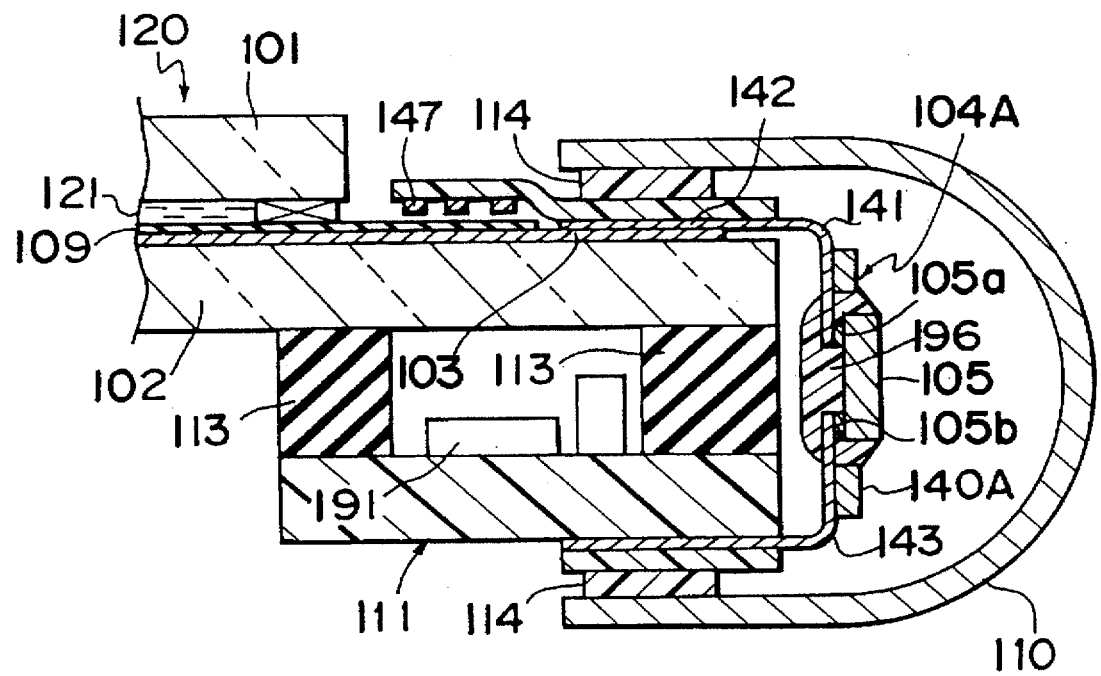
FIG. 27 is a sectional view showing a modification example of the liquid crystal module of FIG. 17.

In the liquid crystal module shown in FIG. 27, a clip 110 made of a shape memorizing alloy or shape memory plastics having a U shape is used to pinch the peripheral portion of the panel and the control board 111 on the outer periphery of the flexible wiring board 104A, thereby pressing the corresponding terminals. Numeral 114 denotes a buffer material. In this case, the anisotropic conductive material or the like can be omitted between the corresponding terminals, facilitating the connection of the terminals. As a result, the liquid crystal panel 120 can be easily assembled. Further, by virtue of its simple removal, any defective drive ICs 105 if any can be easily replaced with new ones. Yet, as in the cases shown in FIGS. 25 and 26, the control board 111 does not project sideward of the liquid crystal panel 120, so that the module size can be further reduced. Also, the strength of the module can be increased so that its reliability can be enhanced and that the module can be designed lightweight.

Figure 30:
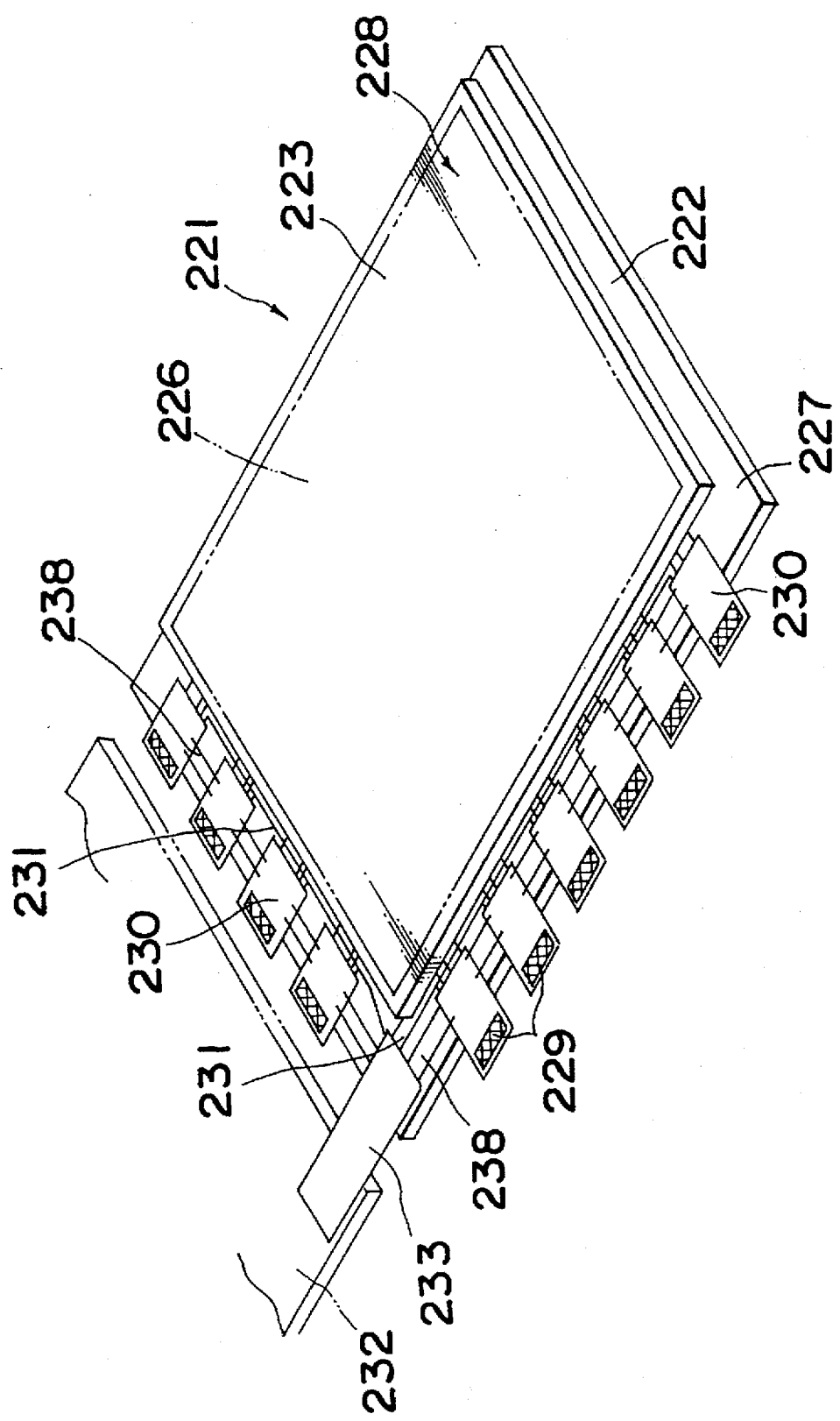
FIG. 30 is a perspective view showing a liquid crystal display device which is an embodiment of the present invention according to its seventh, eighth, and tenth aspects.
Figure 31:
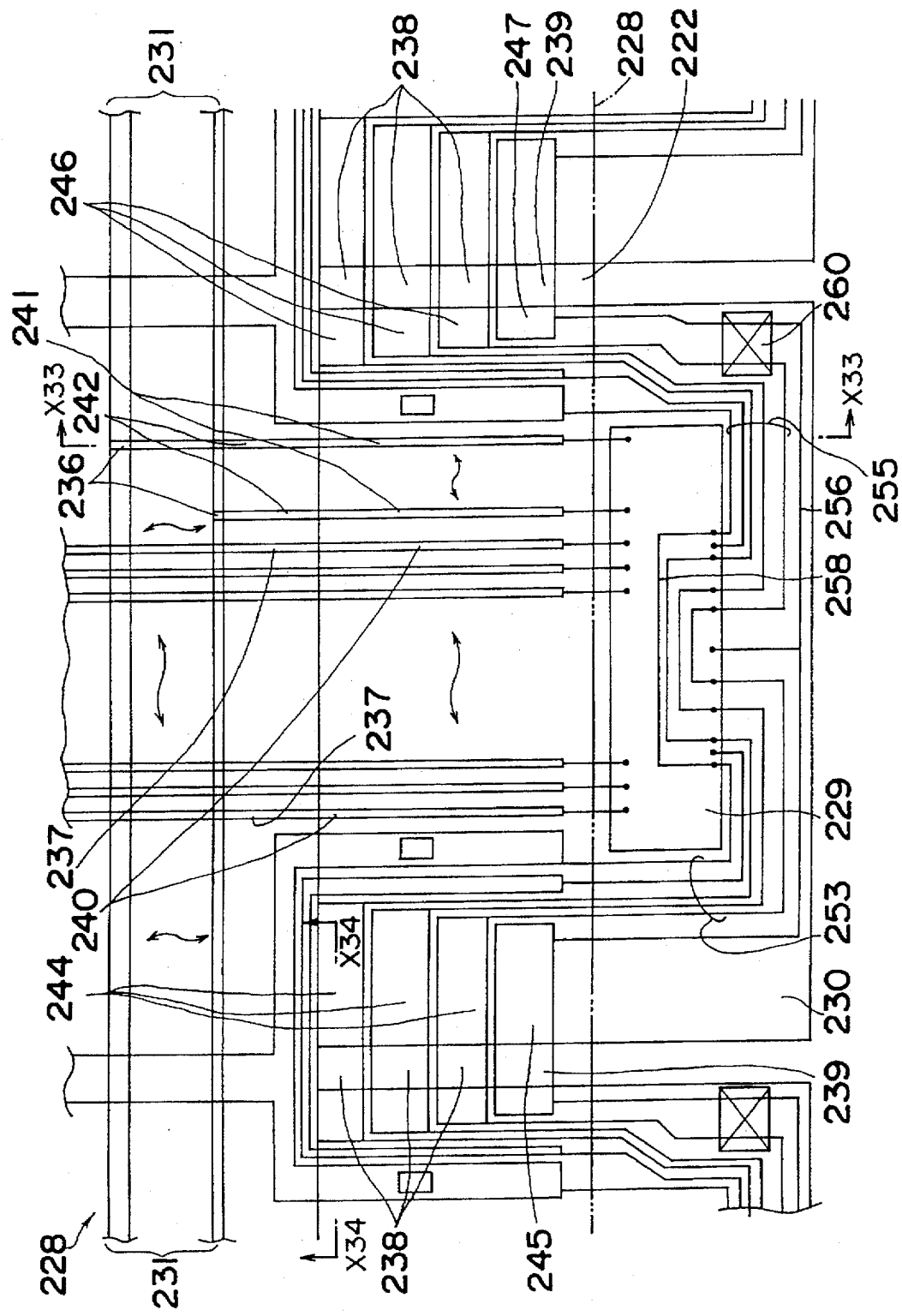
FIG. 31 is a plan view of the vicinity of a flexible wiring board of the liquid crystal display device of FIG. 30.
Figure 32:
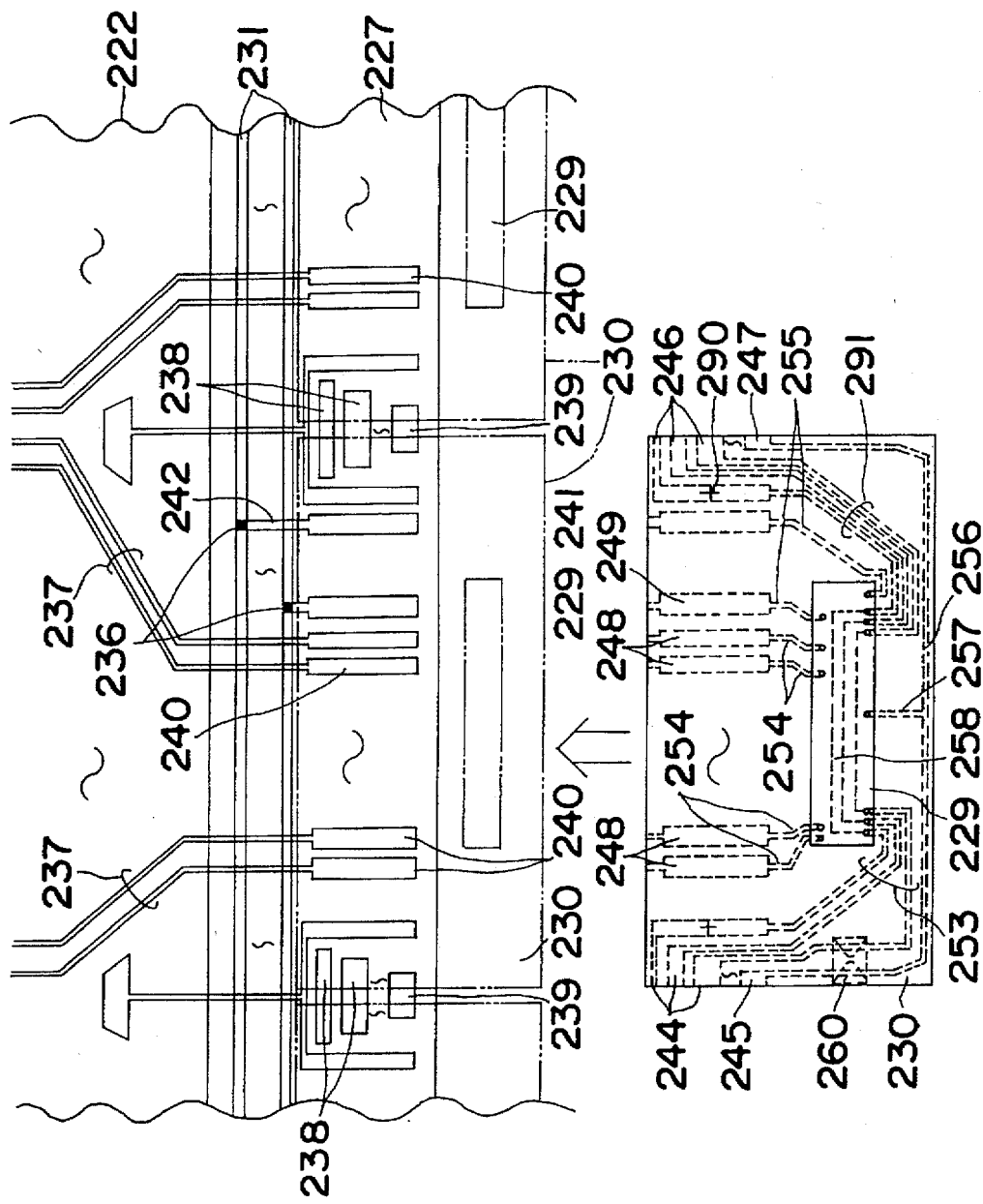
FIG. 32 is an exploded perspective view of the vicinity of a flexible wiring board of the liquid crystal display device of FIG. 30.
Figure 33:
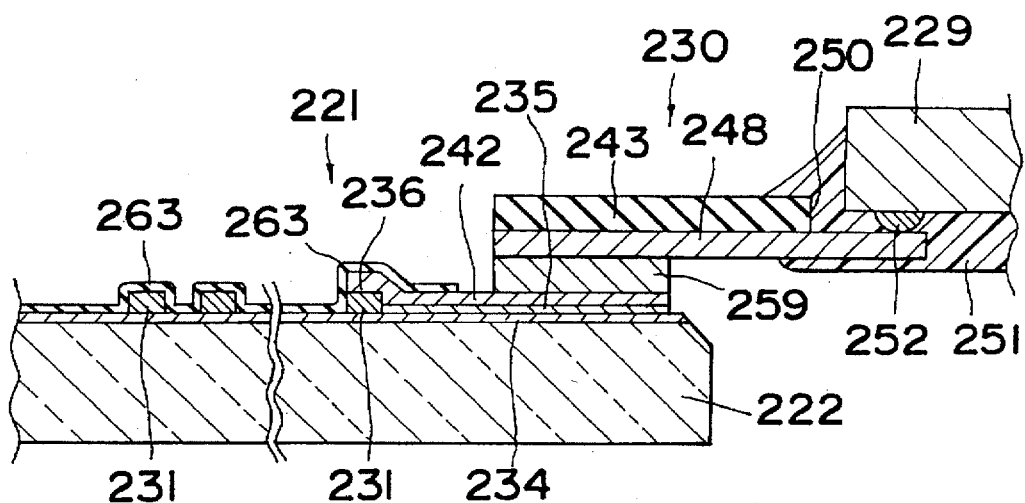
FIG. 33 is a sectional view taken along the line X33—X33 of FIG. 31.
Figure 34:
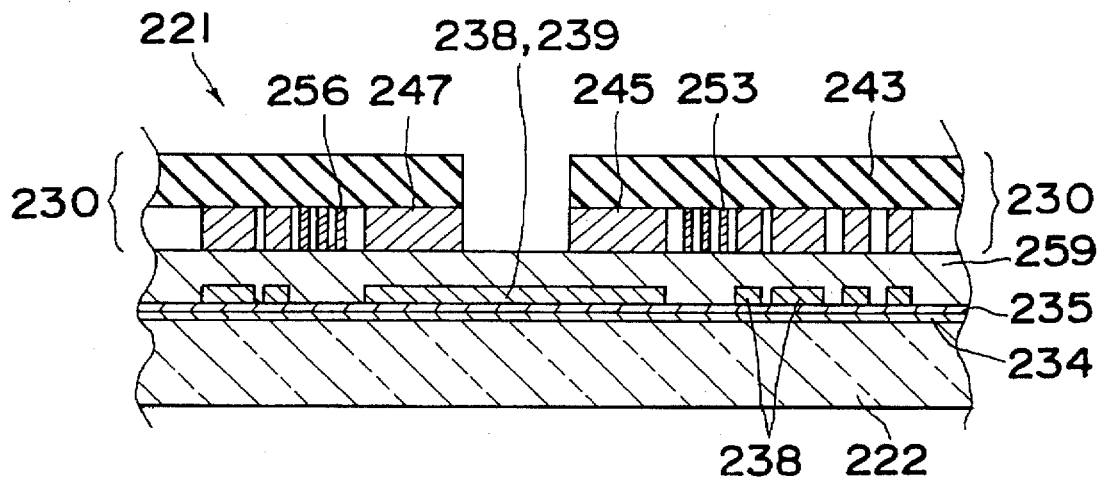
FIG. 34 is a sectional view taken along the line X34—X34 of FIG. 31.

FIG. 30 is a perspective view of a liquid crystal display device 221, which is an embodiment according to the seventh, eighth, and tenth aspects of the present invention. FIG. 31 is a plan view of the liquid crystal display device 221 around a flexible wiring board 230. FIG. 32 is an exploded perspective view of the liquid crystal display device 221 around the flexible wiring board. FIG. 33 is a sectional view as viewed along the cutting-plane line X33—X33 of FIG. 31. FIG. 34 is a sectional view as viewed along the cutting-plane line X34—X34 of FIG. 31. In the following description, the liquid crystal display device 221 is taken as an example. The embodiments of the present invention can be applied to not only the liquid crystal display device 221 but also a wide variety of matrix-driven display devices including the EL display devices or plasma display devices.

In the embodiments, the liquid crystal display device (hereinafter, referred to as display device) 221 includes a display panel 228 having such an arrangement that liquid crystals 282 (see FIG. 36) are injected between a pair of rectangular glass substrates 222, 223 having transparent electrodes (not shown) formed on their opposite surfaces, the liquid crystals 282 being surrounded and sealed by a sealant 225 (see FIG. 36). The region on the glass substrates 222, 223 provided to the display panel 228, where the transparent electrode are arranged, is defined as a display section 226 where the display of an image is implemented. As an example in which a drive IC 229 for driving the liquid crystal display device 221 is mounted on a peripheral portion 227 of one glass substrate 222 other than the range over which the glass substrate 222 overlaps the other glass substrate 223, there are mounted ten flexible wiring boards 230. A peripheral portion 227 is an L-shaped region extending along adjoining two sides of the glass substrate 222. Also, the flexible wiring board 230 has an insulating film 243 (see FIG. 33) made of an electrically insulating material such as polyimide resin and polyester resin. On this insulating film 243, various terminals and wiring lines later described are formed.

Common lines 231 for feeding signals or power to be fed in common to the flexible wiring boards 230 are formed continuously over the range over which the plurality of flexible wiring boards 230 are arranged on the peripheral portion 227. A signal or drive-use power to be fed in common to the flexible wiring boards 230 is fed to the common lines 231 from a control board 232 via a connector 233. The display device 221 is comprised of the display panel 228, the plurality of flexible wiring boards 230, and the control board 232.

As shown in FIGS. 31 and 32, an insulating film 234 is formed on the glass substrate 222 of the display panel 228 by forming a $Ta_2O_5$ film as an example. When source electrodes or gate electrodes within the display section 226 are formed on the insulating film 234, the plurality of common lines 231 are formed from such a material as ITO, Ta, Ti, Mo, Cu, Au, Al, and Ag paste, in a single-layer or multi-layer structure so as to be 50 nm or more in thickness, a few μm—a few mm in line width, and 0.1 Ω/□–several 100's Ω/□ in resistance at a length ranging over approximately the entire length of the peripheral portion 227. On the glass substrate 222 having the common lines 231 (see FIGS. 31 to 33) formed thereon, an insulating film 235 is formed from such a material as SiN, $SiO_2$, $Ta_2O_5$, or polyimide so as to have a plurality of through holes 236.

On the insulating film 235, there are formed a plurality of signal lines 237, for example, each connected to a group of pixels corresponding to each row of the whole pixels arrayed in a matrix within the display section 226; and signal-use junction common lines 238 and power-use junction common lines 239 each having a length ranging between opposing terminals of adjacent flexible wiring boards 230 on the peripheral portion 227. The junction common lines 238, 239 are formed from such a material as ITO, Ta, Ti, Mo, Cu, Au, Al, and Ag paste in a single-layer or multilayer structure so as to be 50 nm or more in thickness, a few μm—a few mm in line width, and 0.1 Ω/□–several 100's Ω/□ in resistance. The junction common lines 238, 239, as shown in FIGS. 31 and 32, are arrayed in a direction perpendicular to the direction in which the plurality of flexible wiring boards 230 are arrayed on the peripheral portion 227 (lateral direction in FIGS. 31 and 32). Rectangular connecting portions 240 are formed at an equal pitch at end portions of the signal lines 237. The connecting portions 240 are formed from such a material as ITO, Ta, Ti, Mo, Cu, Au, Al, and Ag paste in a single-layer or multilayer structure so as to be 50 nm or more in thickness, a few μm—a few mm in line width, and 0.1 Ω/□–several 100's Ω/□ in resistance. The plurality of connecting portions 240 are arrayed along the aforementioned array direction.

On the peripheral portion 227 of the glass substrate 222, there are formed a plurality of lead-in lines 242 each one end of which is connected to a common line 231 via a through hole 236 of insulating film 235 and the other end of which extends toward an end of the peripheral portion 227. The end portion of each lead-in line 242 is connected to rectangular connecting portions 241 arrayed along the aforementioned array direction on the peripheral portion 227. An insulating film 263 is formed so as to cover the common lines 231 and the lead-in lines 242 as described above.

On the other hand, the flexible wiring boards 230 are each formed into rectangular shape and generally referred to as TAB (Tape Automated Bonding) boards. The flexible wiring boards 230 have input terminals 244, 245 connected to the input-side junction common lines 238, 239, respectively, on the rear surface of the base material 243 with a flexibility opposite to the glass substrate 222. These input terminals 244, 245, as shown in FIGS. 31 and 32, are arrayed in a direction perpendicular to the aforementioned array direction at one end portion of the flexible wiring boards 230 along the array direction.

Further, a plurality of electrode terminals 248 (see FIG. 32) to be connected to the plurality of connecting portions 240 at an end portion of the flexible wiring boards 230 which end portion is adjacent to the aforementioned one end portion and which confronts the glass substrate 222 are arranged along the array direction. Besides, a plurality of electrode terminals 249 to be connected to the connecting portions 241, respectively, are also arrayed along the aforementioned array direction. On the flexible wiring boards 230, output terminals 246, 247 for outputting signals of the same type as those inputted to the input terminals 244, 245 are arrayed in a direction perpendicular to the aforementioned array direction, at an end portion of the flexible wiring boards 230 opposite to the end portion where the input terminals 244, 245 are located, in the same arrayed state as in the input terminals 244, 245. The input terminals 244, 245 and the output terminals 246, 247 are formed from such a material as Sn- or Au-plated Cu and aluminum so as to be 10–60 μm in thickness and a few μm—a few mm in line width.

Meanwhile, accommodating hole 250 (see FIG. 33) for accommodating the IC 229 are formed at positions away from the end portions of the flexible wiring boards 230. The IC 229 within the accommodating holes 250 is firmly coated with a protective resin layer 251, for example, of epoxy resin. The IC 229 is provided with a plurality of electrode bumps 252. In the flexible wiring boards 230, a plurality of connecting lines 253, 254, 255 are formed for connecting the input terminals 244, 245, the electrode terminals 248, 249, and the output terminals 246, 247 to their corresponding electrode bumps 252 of the IC 229. Further, alignment marks 290 (see FIG. 32) are provided at positions corresponding to some of the electrode terminals 249.

In the flexible wiring boards 230, a connecting line 256 is formed for connecting the input terminal 245 directly to the output terminal 247, while a branch line 257 is formed for connecting the connecting line 256 to its corresponding electrode bump 252 of the IC 229. Some signals inputted from the input terminals 244 to one flexible wiring board 230 are to be transferred to another adjacent flexible wiring board 230. To implement such transfer, a plurality of internal lines 258 for connecting at the inside of the IC 229 the input-use connecting line 253 directly to an output-use connecting line 291 (see FIG. 32) in correspondence to the signal to be transferred are formed within the IC 229. In the flexible wiring boards 230, a chip capacitor 260 for signal adjustment is connected to the connecting line 256 and part of the connecting lines 253. Thereby, any differences in display grade among the ICs 229 of the flexible wiring boards 230 are reduced.

Connection between the above-described display panel 228 and the flexible wiring boards 230 is achieved by using an anisotropic conductive film 259.

Figure 35:
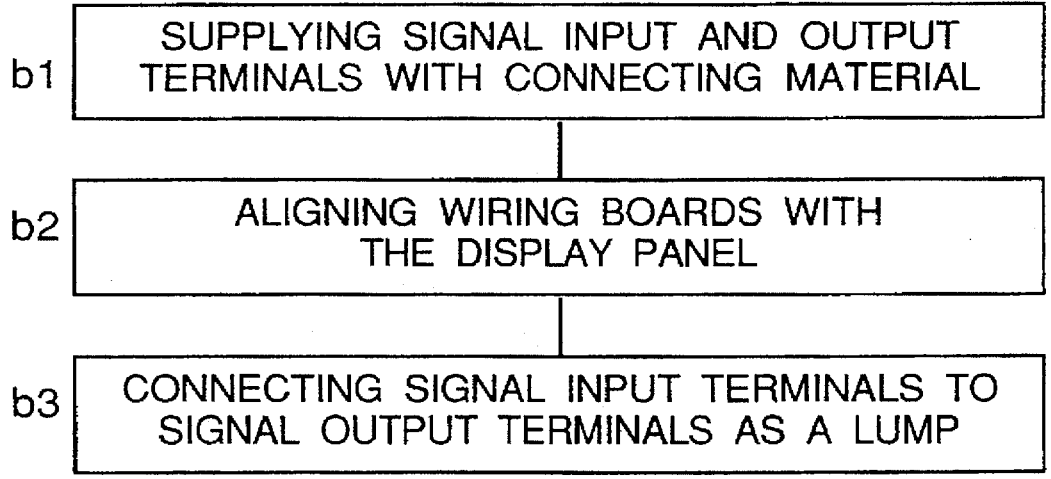
FIG. 35 is a flow chart showing an example of the manufacturing process of a display device according to the tenth aspect of the present invention.

FIG. 35 is a flow chart showing the process of manufacturing the display device 221, which process is an embodiment according to the tenth aspect of the present invention. FIG. 36 is a sectional view showing the manufacturing process.

The manufacturing process of the present embodiment is now described with reference to the aforementioned figures. In mounting the flexible wiring boards 230 onto the display panel 228, at step b1 of FIG. 35, the anisotropic conductive film 259 is applied in adhesion or coating onto the connecting portions of a predetermined plurality of flexible wiring boards 230 in the peripheral portion 227 of the display panel 228. At step b2, the flexible wiring boards 230 are aligned with a predetermined plurality of positions of the peripheral portion 227 of the display panel 228. More specifically, while the peripheral portion 227 of the display panel 228 is opposed to the plurality of flexible wiring boards 230, the connecting portions 240, 241, the electrode terminals 248, 249, the junction common lines 238, 239 and input/output terminals 244, 245, 246, 247 of one flexible wiring board 230 located at its both ends in the array direction are aligned for each flexible wiring board 230 in one-to-one correspondence, respectively.

Figure 36:
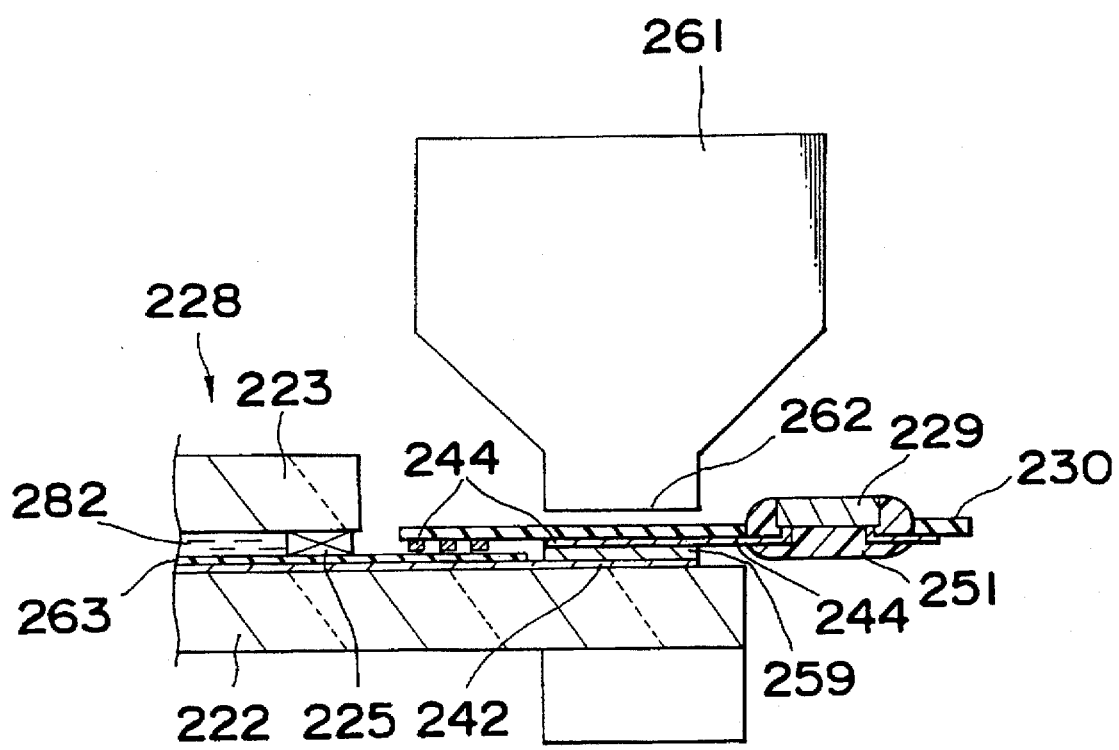
FIG. 36 is a sectional showing view showing the manufacturing process.

Then, at step b3, the display panel 228, on which the aligned flexible wiring boards 230 are mounted, are heated by a thermal press head 261 having a single or plurality of press portions 262 which is shown in FIG. 36 and which have such a shape as to press the connecting portions to the display panel 228 of each flexible wiring board 230. By this heating, thermal press bonding is achieved, as shown in FIG. 36, between the connecting portions 240, 241 and the electrode terminals 248, 249, and between the junction common lines 238, 239 and the input/output terminals 244, 245, 246, 247 located at both ends in the array direction of one flexible wiring board 230. Thus, the process of mounting a plurality of flexible wiring boards 230 onto the display panel 228 is completed.

Through this process, opposing electrodes of the connecting portions 240, 241, the terminals 244, 245, 246, 247, 248, 249, and the junction common lines 238, 239 can be electrically connected collectively.

Some advantages can be offered by virtue of the above-described structure of the display device 221, i.e. a structure that the connecting terminals 244 to 247 of the display panel 228 and the flexible wiring boards 230 include connecting terminals arranged in parallel to the array direction of the flexible wiring boards 230 in the display panel 228, and connecting terminals arrayed in a direction perpendicular to the array direction. The advantages are, for example, that the size of the flexible wiring boards 230 along the array direction can often be reduced further than a case where all the connecting terminals 244 to 247 are arrayed in parallel to the array direction, and that resistance due to distribution of the common lines can be lowered so that the display grade can be maintained at successful level.

Figure 55:
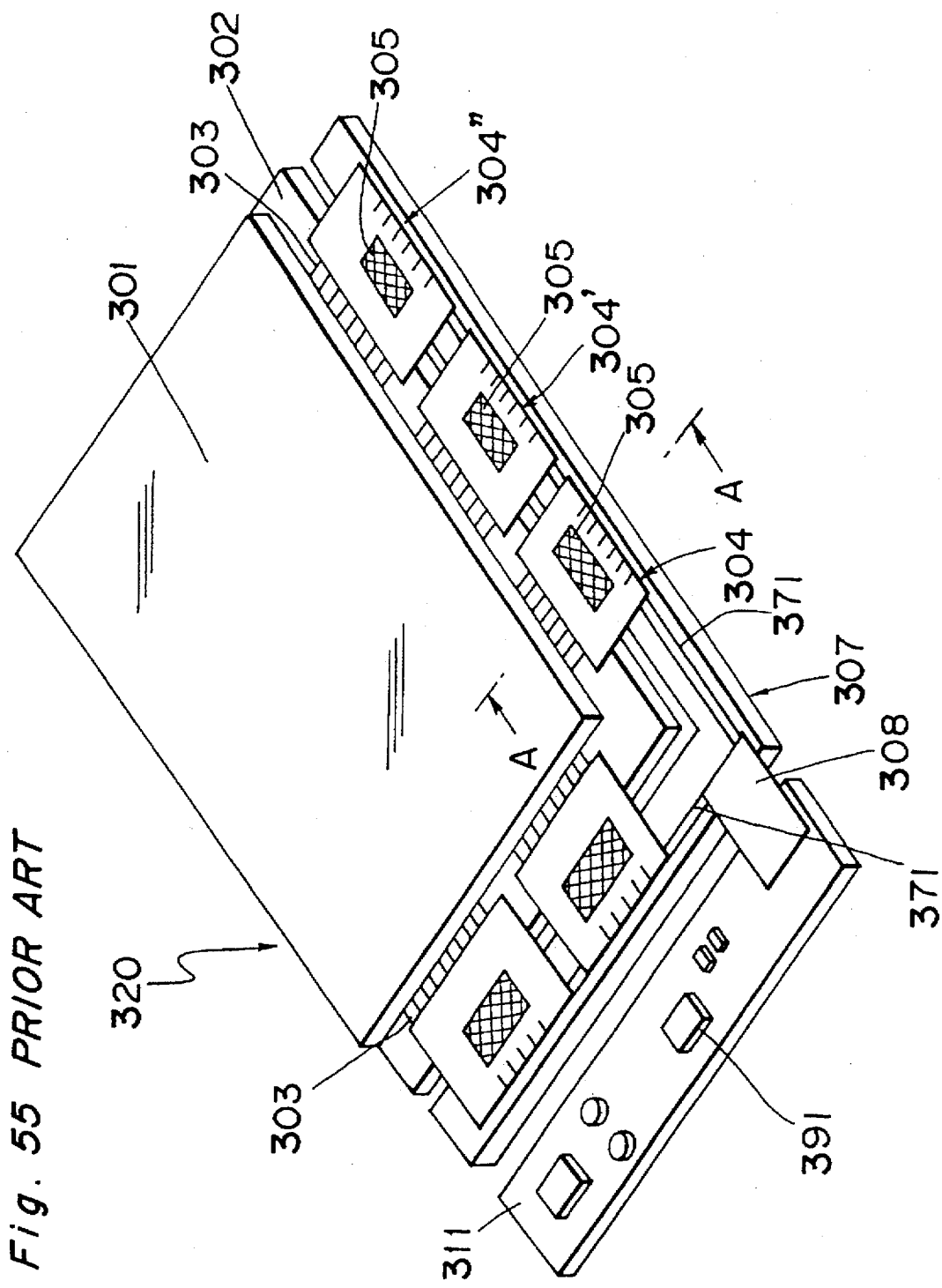
FIG. 55 is a perspective view of a prior-art liquid crystal module.
Figure 56:
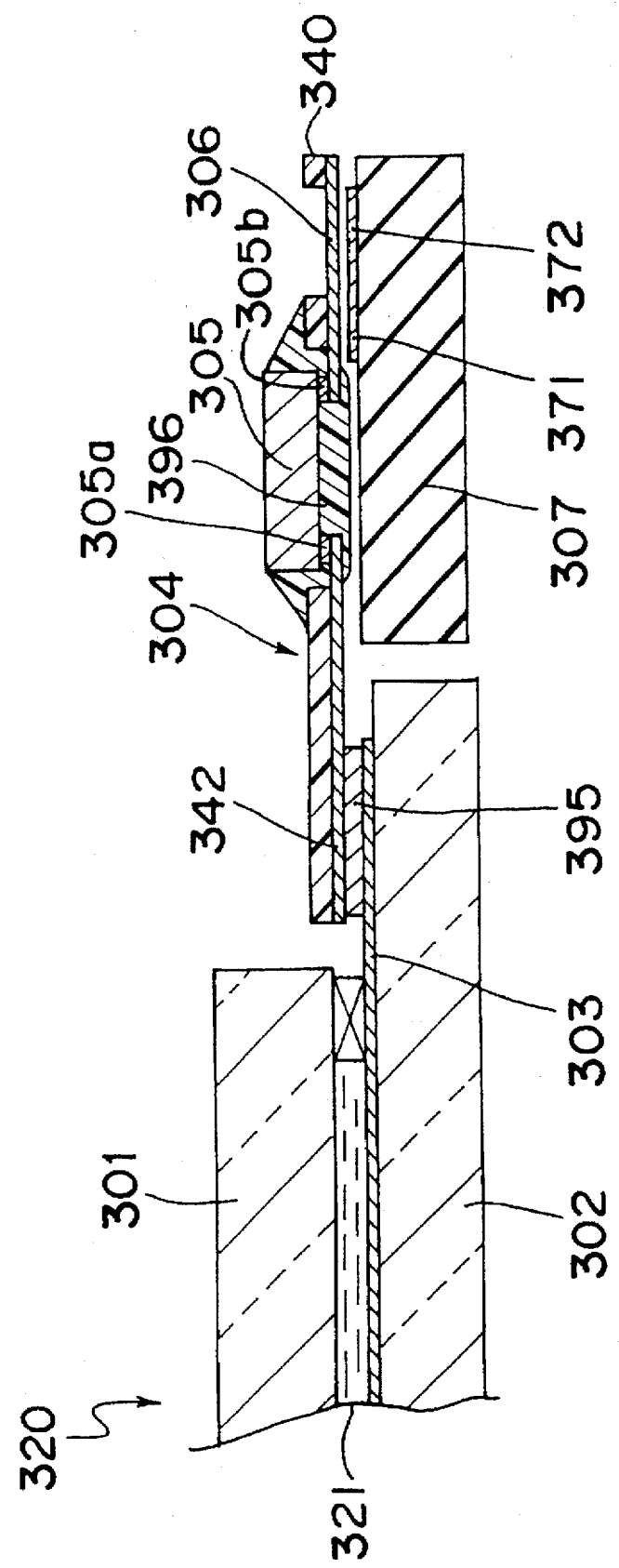
FIG. 56 is a sectional view taken along the line A—A of FIG. 55.

The above-described structure of the display panel 228 also allows the area occupied by the display device 221 to be reduced substantially. This is due to the fact that, compared with the prior art in which a further wiring board is used separately of the display panel 228 and the flexible wiring boards 230 so that the common lines 231 are provided to the separately provided wiring board as shown in FIG. 55, the present embodiment allows the separate wiring board to be omitted.

Thus, in the present embodiment, the display device 221 can be provided in smaller size, thinner thickness, and less weight. Further, the display device 221 is less affected by any external force by virtue of its reduced size, so that the reliability of the display device 221 can be improved.

The region where the anisotropic conductive film 259 is provided, may extend to such areas as equivalent to the areas of the terminals 244, 245, 246, 247, 248, and 249, so that the terminals 244, 245, 246, 247, 248, and 249 may be coated independently of one another, or otherwise may extend over the outer whole region of the insulating film 263. Also, solder, photo-setting resins, or other connecting materials may be used instead of the anisotropic conductive film 259.

In this way, as shown in FIG. 30, a plurality of flexible wiring boards 230 which have the same wiring pattern and which serve for, for example, driving scanning lines of the display device 221 are connected to the display panel 228 along one side of the display device 221. Along another side of the display device 221, flexible wiring boards 230 which have a wiring pattern different from that of the foregoing flexible wiring boards 230 and which serve for, for example, driving data lines of the display device 221 are connected to the display panel 228. Further, at a corner portion 264 of the peripheral portion 227 of the glass substrate 222, a control board 232 for feeding signals for driving the display device 221 is connected to the common lines 231 and the junction common lines 238, 239 via the connector 233.

In operation of the display device 221, a drive-use signal is fed from the control board 232 to the common lines 231 and the junction lines 238 of the peripheral portion 227 of the display device 221 via the connector 233. The signal drives the IC 229 from the connecting portions 241 and terminals 244, 245, as shown in FIGS. 31 and 32, via the connecting lines 253, 251 of the flexible wiring boards 230, while output signals of the IC 229 are fed to the pixel electrodes (not shown) of the display device 221 via the connecting lines 254 and the electrode terminals 248. Thereby, the display device 221 is driven.

Also, the above drive-use signal is branched by the junction common line 238 and fed to the input terminals 244 of a flexible wiring board 230 adjacent to the foregoing flexible wiring board 230 via the input terminals 244 and connecting line 253 of the flexible wiring board 230, lower lines or internal lines 258 of the IC 229, the connecting lines 291, the output terminals 246, and the junction common lines 238. Then the signal is fed from the input terminals 244 via the connecting lines 253 of the adjacent flexible wiring boards 230 to the drive IC 229. A signal outputted by the drive IC 229 is fed to the inside of the display section 226 of the display panel 228 via the output terminals 246 of the flexible wiring boards 230 and the connecting portions 240 of the peripheral portion 227.

In this way, the above drive-use signals are fed to the connecting portions 240 of a plurality of the flexible wiring boards 230 mounted on one side of the peripheral portion 227 of the liquid crystal display device 221. The same drive-use signals are similarly fed also to the connecting portions 240 of the flexible wiring boards 230 (see FIG. 30) mounted on another side of the liquid crystal display device.

Since the liquid crystal display device 221 is provided with no common wiring board 307 (see FIGS. 55 and 56) that would be disposed sideward of the liquid crystal display device 301 in the prior art, the size of the liquid crystal display device 221 can be reduced, so that the liquid crystal display device 221 can be offered in less thickness and weight. This also allows cost reduction of the liquid crystal display device 221.

Yet, connection between the junction lines 238, 239 of the peripheral portion 227 of the liquid crystal display device 221 and the input terminals 244, 245 of the flexible wiring boards 230, connection between the output terminals 246, 247 of the flexible wiring boards 230 and the junction lines 238, 239, and connection between the connecting portions 240, 241 and the electrode terminals 248, 249 of the flexible wiring boards 230 are achieved collectively by means of the anisotropic conductive film 259. As a result, the connecting process for manufacturing the liquid crystal display device 221 can be reduced, so that the rate of occurrence of any defectives in the connecting process is reduced, and that the production yield in the assembling process is improved. Also, a cost reduction can be expected in terms of the manufacturing process.

Further, in the above-described embodiment, the common wiring board in the prior art is not adopted, so that the connecting process between the flexible wiring boards 230 and the common wiring board is eliminated. Accordingly, the man-hour required is reduced compared with the prior art, with cost reduction. Also, since the number of parts is reduced, the reliability of the liquid crystal display device 221 can be improved substantially.

In the above-described embodiment, a signal to be transferred from one to another among the flexible wiring boards 230 is transferred via the junction common lines 238, 239 and the connecting line 256 within the flexible wiring boards 230. Accordingly, wire resistance involved in the transfer of a signal can be reduced more than when the signal is transferred by using only the common lines 231 formed on the peripheral portion 227 of the display panel 228 by the thin-film technique. Also, the input terminals 244, 245, output terminals 246, 247, and electrode terminals 248, 249 of the flexible wiring boards 230 can be increased in line width and, besides, the junction common lines 238, 239, connecting portions 240, 241 of the display panel 228 can also be increased in line width. As a result, connection resistance that results when the flexible wiring boards 230 are mounted onto the display panel 228 can be reduced.

In the flexible wiring boards 230 of this embodiment, it is also possible that a resin having an electrical insulation property is applied to the surface on which the input terminals 244, 245, thereby forming an insulating coat, so that the plurality of input terminals 244, 245, terminals 248, 249, connecting terminals 253, 254, 255, 291, 256, and output terminals 246, 247 are increased in reliability on their mutual electrical insulation.

Figure 37:
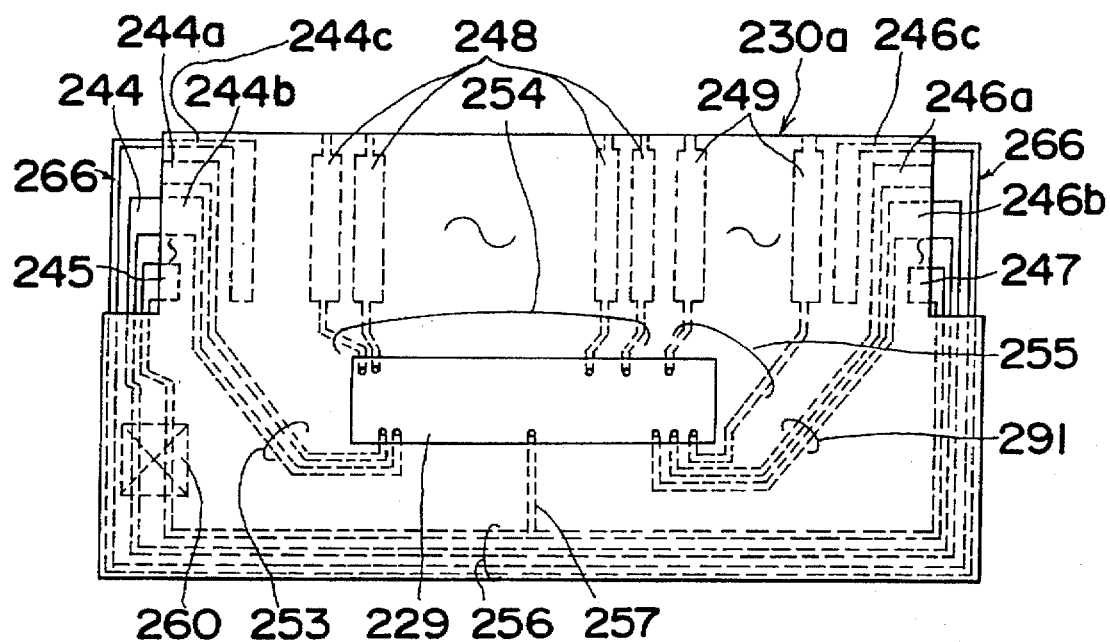
FIG. 37 is a plan view of a modification example of the flexible wiring board to be used in the liquid crystal display device of FIG. 30.

FIG. 37 is a plan view of a flexible wiring board 230a which is a modification example of the flexible wiring boards 230 of the foregoing embodiment, for use in the liquid crystal display device 221 of the present invention. In this modification flexible wiring board 230a, corner portions at both ends of a side of an insulating film 243 (see FIGS. 33, 34) of the flexible wiring boards 230 of the foregoing embodiment, the side being opposed to the display panel 228, have been cut out to form cutouts 266.

If the signal inputted to one of the plurality of input terminals 244 formed on the flexible wiring board 230, is a signal of a first type that should be inputted to the IC 229 mounted on the flexible wiring board 230, the first type signal is inputted from an input terminal 244a through a connecting line 253 to the IC 229. The signal is processed at the inside of the IC 229, where a different waveform signal is generated and then passed through a connecting line 291 and a terminal 246a, thus fed to an adjacent flexible wiring board 230. On the other hand, if the signal to be inputted as above is a signal of a second type that, for example, is inputted to the IC 229 and should be transferred to another adjacent flexible wiring board 230 without being changed in signal waveform, then the second type signal is inputted to an input terminal 244b that is connected to the IC 229 via the connecting line 253 and besides connected directly to an output terminal 246b corresponding to the input terminal 244b via the connecting line 256.

If the signal to be inputted as above is a signal of a third type that, for example, is transferred to another adjacent flexible wiring board 230 or other electrodes on the panel (e.g. common electrodes) without being inputted to the IC 229, then the third type signal is inputted to an input terminal 244c that is connected directly to an output terminal 246c corresponding to the input terminal 244c via the connecting line 256. The input terminal 245 is connected to the corresponding output terminal 247 via the connecting lines 256, while part of the connecting line 256 is connected to the IC 229 via a branch line 257.

The flexible wiring board 230a as described above is mounted to the display panel 228 in the same assembling process as in the foregoing embodiment. In this process, clearances due to the cutouts 266 are formed between a plurality of adjacent flexible wiring boards 230a mounted on the display panel 228. Through these clearances, as shown in FIG. 37, part of the input terminals 244b, 244c, part of the connecting lines 256, and part of the output terminals 246b, 246c are exposed to outside. Accordingly, when this flexible wiring board 230a is used, the clearances are coated with an insulating film made of such a material as SiN and polyimide, as an example, on the panel side.

Figure 38:
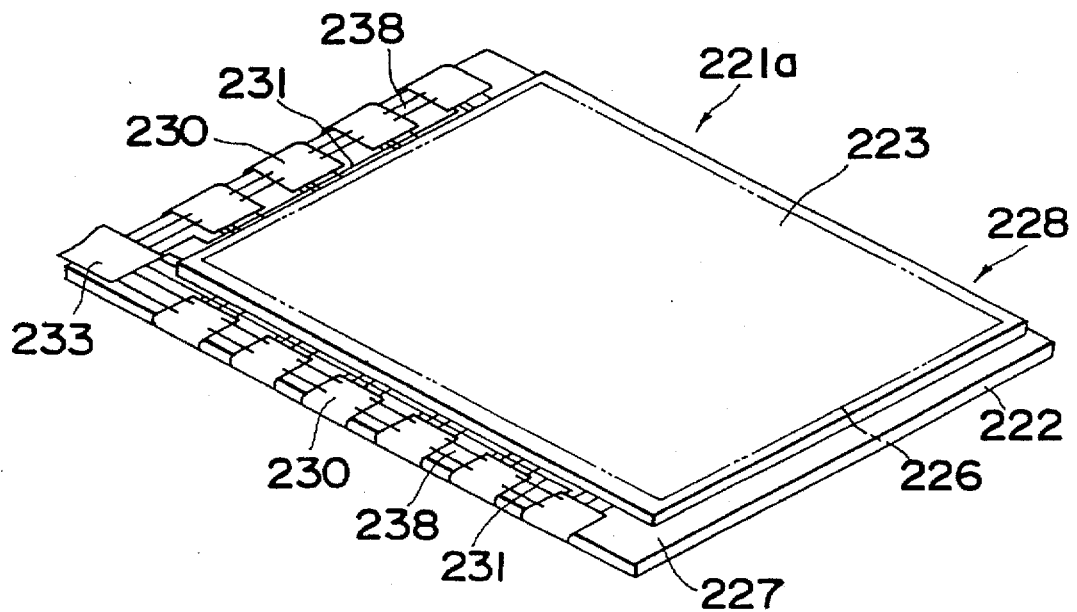
FIG. 38 is a perspective view showing a liquid crystal display device which is a second embodiment of the panel according to its seventh aspect.
Figure 39:
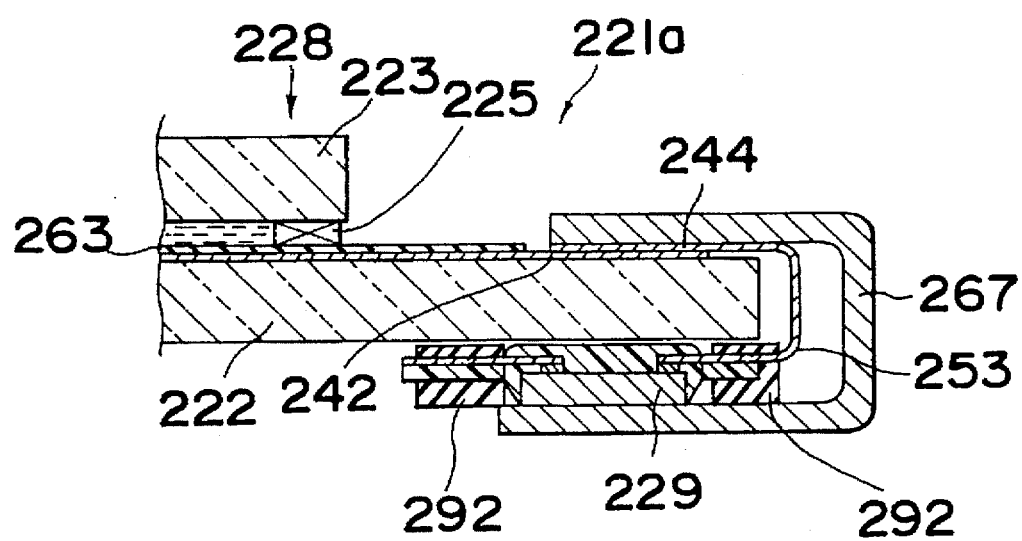
FIG. 39 is a sectional view of the embodiment of FIG. 38.

FIG. 38 is a perspective view of a liquid crystal display device 221a which is a second embodiment according to the seventh aspect of the present invention. FIG. 39 is a sectional view of this embodiment. The liquid crystal display device 221a of this embodiment is similar to the liquid crystal display device 221 of the foregoing first embodiment, where corresponding parts are designated by same reference numerals. In the second embodiment, the plurality of flexible wiring boards 230 are connected to the peripheral portion 227 of the display panel 228. Thereafter, portions of the flexible wiring boards 230 that project outward of the peripheral portion 227 of the display panel 228 are bent so as to be wound around the peripheral portion 227 of the display panel 228, as shown in FIGS. 38 and 39. By this bending process, the display panel 228 of the liquid crystal display device 221 is pinched by the flexible wiring boards 230 at their peripheral portion 227.

Thereby, the size of the liquid crystal display device 221a can be further reduced by the bending extent of the flexible wiring boards 230.

In the present embodiment, it is also possible as shown in FIG. 39 that a clip 267 made of a shape memorizing alloy or shape memory plastics having a U shape in section is used to pinch the display panel 228 by its peripheral portion 227 on the outer peripheral side of the bent flexible wiring boards 230 and, in this state, the junction lines 238, 239 and the connecting portions 240, 241 and their corresponding input terminals 244, 245, output terminals 246, 247, and terminals 248, 249 are press bonded with each other. Thereby, the terminals for connection of the display panel 228 and the flexible wiring boards 230 can be connected each other simply and firmly. Also, in doing this, in order to determine the interval between the flexible wiring boards 230 and the glass substrate 222 and the interval between the flexible wiring boards 230 and the clip 267, a spacer 292 is mounted to the flexible wiring boards 230.

Therefore, in the present embodiment, the same effects as described in the foregoing embodiment can be achieved. Besides, the reliability of connection between the display panel 228 and the plurality of flexible wiring boards 230 can be further improved.

Figure 40:
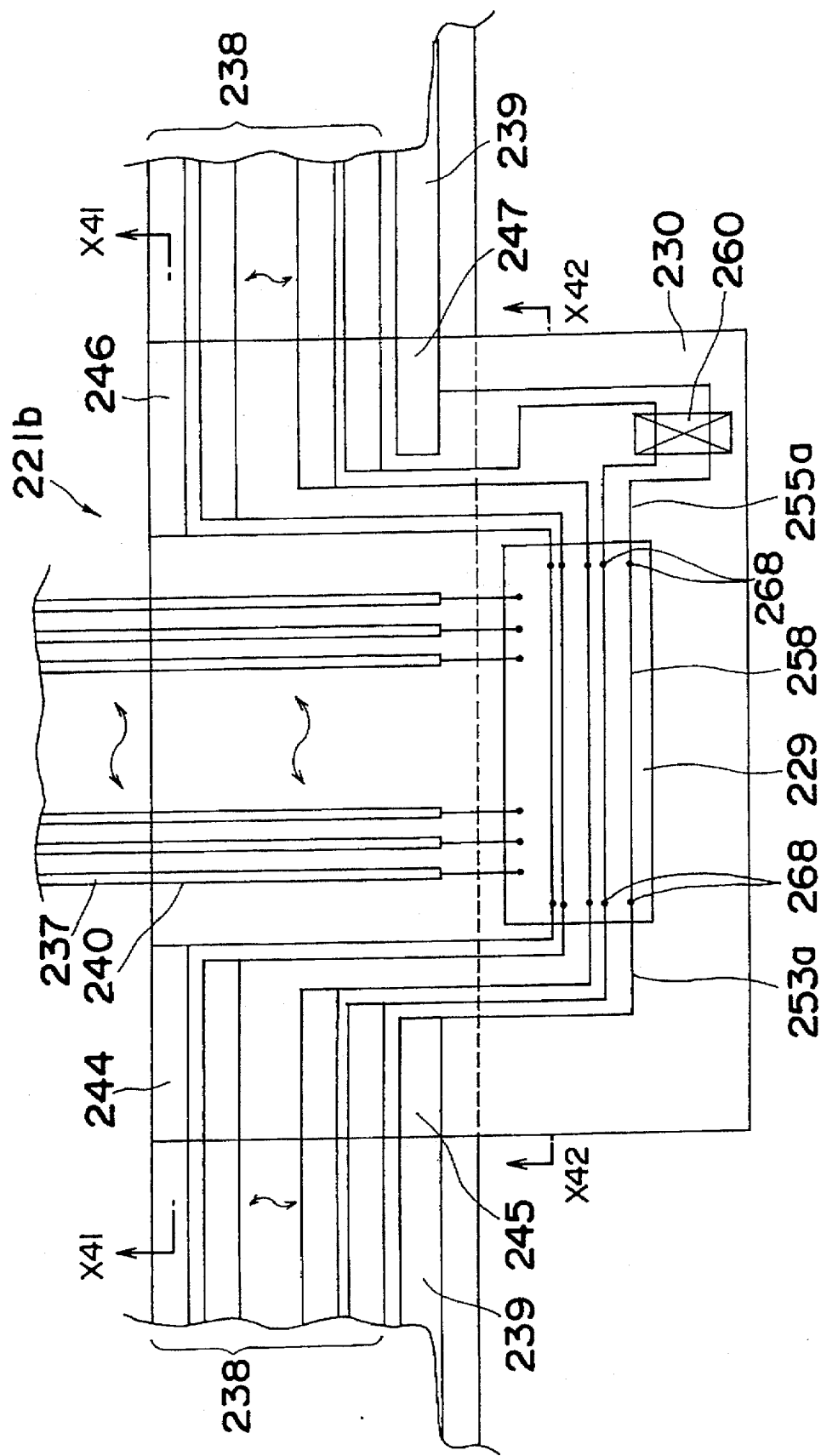
FIG. 40 is a plan view showing a liquid crystal display device which is a third embodiment of the present invention according to its seventh aspect.
Figure 41:
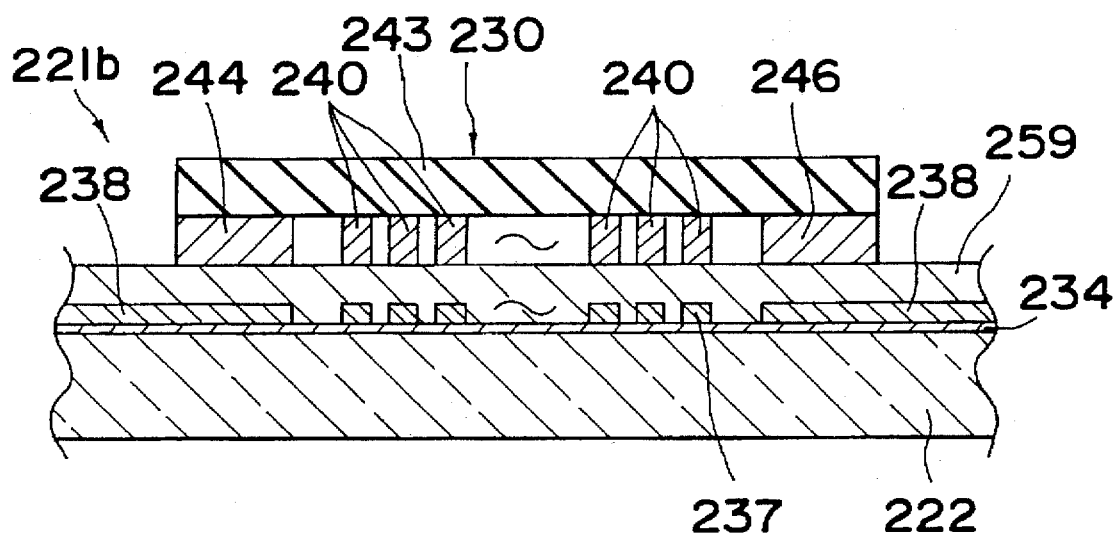
FIG. 41 is a sectional view taken along the line X41—X41 of FIG. 40.
Figure 42:
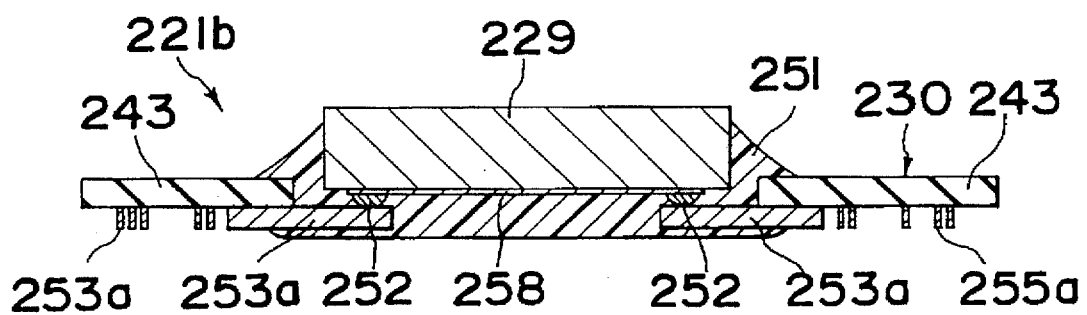
FIG. 42 is a sectional view taken along the line X42—X42 of FIG. 40.

FIG. 40 is a plan view of a liquid crystal display device 221b which is a third embodiment according to the seventh aspect of the present invention. FIG. 41 is a sectional view taken along the line X41—X41 of FIG. 40. FIG. 42 is a sectional view taken along the line X42—X42 of FIG. 40. This embodiment is similar to the foregoing first embodiment, where corresponding parts are designated by same reference numerals.

The first remarkable point of the present embodiment is that there are formed no common lines 231 on the display panel 228 of the first embodiment. Accordingly, signals to be transferred mutually between the plurality of flexible wiring boards 230 mounted on the display panel 228 are transferred by a plurality of junction lines 238, 239 formed on the display panel 228, and a plurality of input terminals 244, 245 and a plurality of output terminals 246, 247 in the flexible wiring boards 230.

This makes it possible to prevent occurrence of such a wiring state that the common lines 231 and signal lines 237 extending inside the display panel 228 intersect each other as in the first embodiment. Therefore, it is possible to omit the structure that the common lines 231 and the signal lines 237 are partially laminated on the display panel 228 with an insulating film 234 interposed therebetween. As a result, such events can be prevented that the signal lines 237 may cause connection failure or disconnection on account of the step gap due to the film thickness of the common lines 231, or that the common lines 231 and the signal lines 237 may be shortcircuited. This allows the manufacturing yield of the liquid crystal display device 221b to be improved, and the reliability of the liquid crystal display device 221b to be enhanced substantially. Also, since the present embodiment permits the process of forming the common lines 231 to be omitted, the manufacturing process of the liquid crystal display device 221b can be simplified.

The second remarkable point of the present embodiment is that all of signals to be transferred from the input terminals 244, 245 to the output terminals 246, 247 are passed through the inside of the IC 229. More specifically, all the input terminals 244, 245 of the flexible wiring boards 230 are connected to the input-use terminals 268 of the IC 229 by a plurality of connecting lines 253a, respectively. An output-use terminal 268 of the IC 229 mounted on the flexible wiring boards 230 is connected to all the output terminals 246, 247 by a plurality of connecting lines 255a.

Accordingly, a plurality of connecting lines formed by pulling around on the flexible wiring boards 230 along the second direction in order to connect the input terminals 244, 245 directly to the output terminals 246, 247 can be omitted. As a result, the structure of the flexible wiring boards 230 can be simplified.

The third remarkable point of the present embodiment is that the input terminals 244, 245, the output terminals 246, 247, and the electrode terminals 248, 249 in the first embodiment are arrayed in the second direction (up and down direction in FIGS. 32 and 40) perpendicular to the first direction (right and left direction in FIGS. 31 and 40) in which the lead-in lines 242 in the display panel 228 are arrayed. Thereby, in some cases, the length of the flexible wiring boards 230 along the first direction can be reduced, compared with the case where the electrode terminals 248, 249 are arrayed in the first direction as in the first embodiment. Thus, the liquid crystal display device 221 can be reduced in size.

The fourth remarkable point of the present embodiment is that part of a plurality of input/output terminals 268 in the IC 229 mounted on the flexible wiring boards 230 are arrayed in the second direction of the IC 229. This makes it possible to reduce the length of the IC 229 in the first direction, so that the liquid crystal display device 221b can be downsized.

Figure 43:
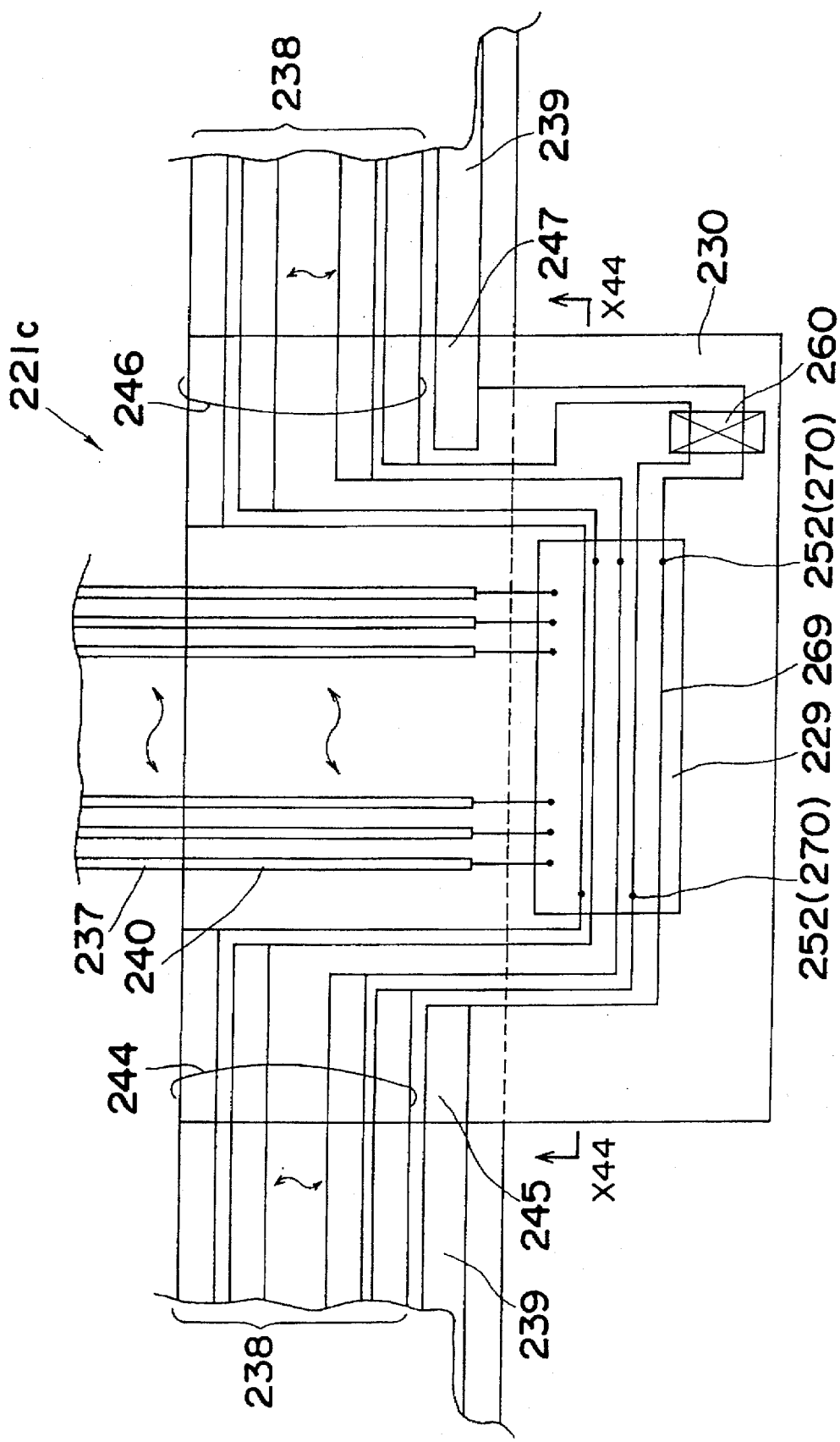
FIG. 43 is a plan view of a liquid crystal display devices which is a fourth embodiment of the present invention according to its seventh aspect.
Figure 44:
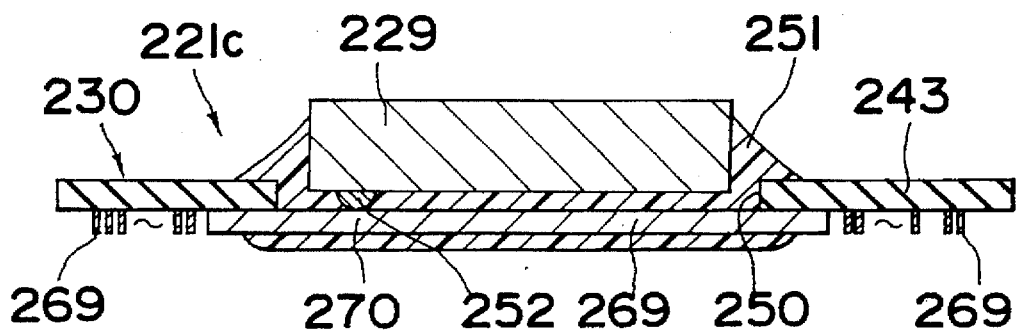
FIG. 44 is a sectional view taken along the line X44—X44 of FIG. 43.

FIG. 43 is a plan view of a liquid crystal display device 221c which is a fourth embodiment according to the seventh aspect of the present invention. FIG. 44 is a sectional view taken along the line X44—X44 of FIG. 43. This embodiment is similar to the third embodiment, where corresponding parts are designated by same reference numerals.

The remarkable point of the present embodiment is that there are formed a plurality of connecting lines 269 for connecting all the input terminals 244, 245 and all the output terminals 246, 247 of the flexible wiring boards 230 separately and directly in the structure of the foregoing third embodiment. The connecting lines 269 are formed of such a material as Sn- or Au-plated Cu. One end of the connecting lines 269 is connected to the input terminals 244, 245, while the other end is connected to the output terminals 246, 247. An intermediate portion of the connecting lines 269 is, as shown in FIG. 44, fixed at a position around the accommodating hole 250 which accommodates the ICs 229 and which is formed in the base material 243 of the flexible wiring boards 230, by using a protective resin 251 in the flexible wiring boards 230. In the connecting lines 269, underneath the IC 229 there are formed connecting portions 270 to be connected to a plurality of electrode bumps 252 of the IC 229.

In the above-described embodiment, the same effects as described in the foregoing embodiments can be achieved. Further, since the present embodiment allows the internal lines 258 for use of signal transmission of the ICs 229, which have been used in the third embodiment, to be omitted, the IC 229 can be simplified in their internal structure and therefore reduced in size. This makes it possible to downsize the structure of the liquid crystal display device 221c.

Figure 45:
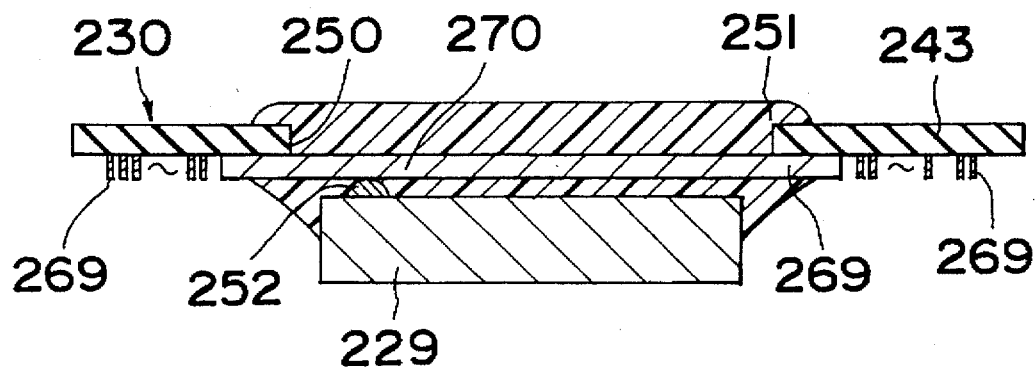
FIG. 45 is a sectional view showing a first modification example of the above embodiment.

FIG. 45 is a sectional view showing the structure of a first modification example of the above-described embodiment, or a sectional view of the display panel 228 taken at a cutting position corresponding to FIG. 44. As shown in FIG. 45, the IC 229 to be mounted on the flexible wiring boards 230 may be also arranged on the side of the flexible wiring boards 230 on which the connecting lines 269 are formed.

In such a modification example, the effects of the present embodiment can be achieved.

Figure 46:
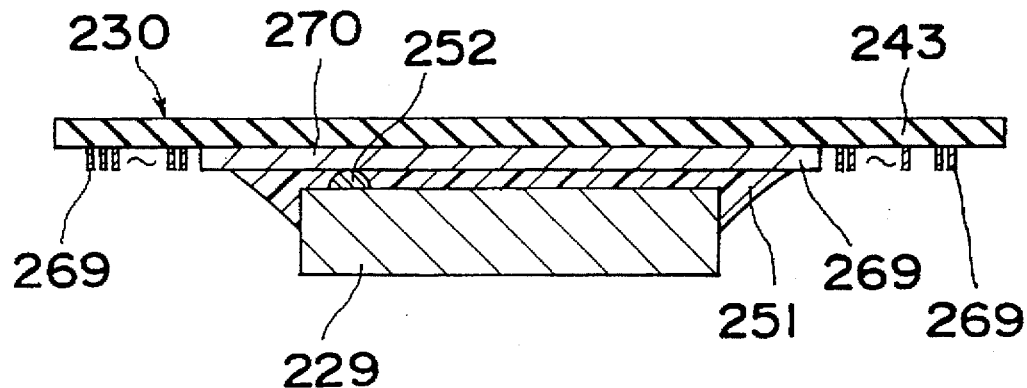
FIG. 46 is a sectional view showing a second modification example of the above embodiment.

FIG. 46 is a sectional view showing the structure of a second modification example of the present embodiment, or a sectional view of the display panel 228 taken at a position corresponding to FIG. 44. As shown in FIG. 46, the accommodating holes 250 are not formed in the flexible wiring boards 230 of this modification example. Accordingly, in the flexible wiring boards 230 of this modification example, the connecting lines 269 are formed on the base material 243 of the flexible wiring boards 230. Also, the IC 229 to be mounted are arranged on the base material 243 in the flexible wiring boards 230, for example, on the side on which the connecting lines 269 of the flexible wiring boards 230 are formed. Even in such a modification example, the effects of the present embodiment can be achieved.

Figure 47:
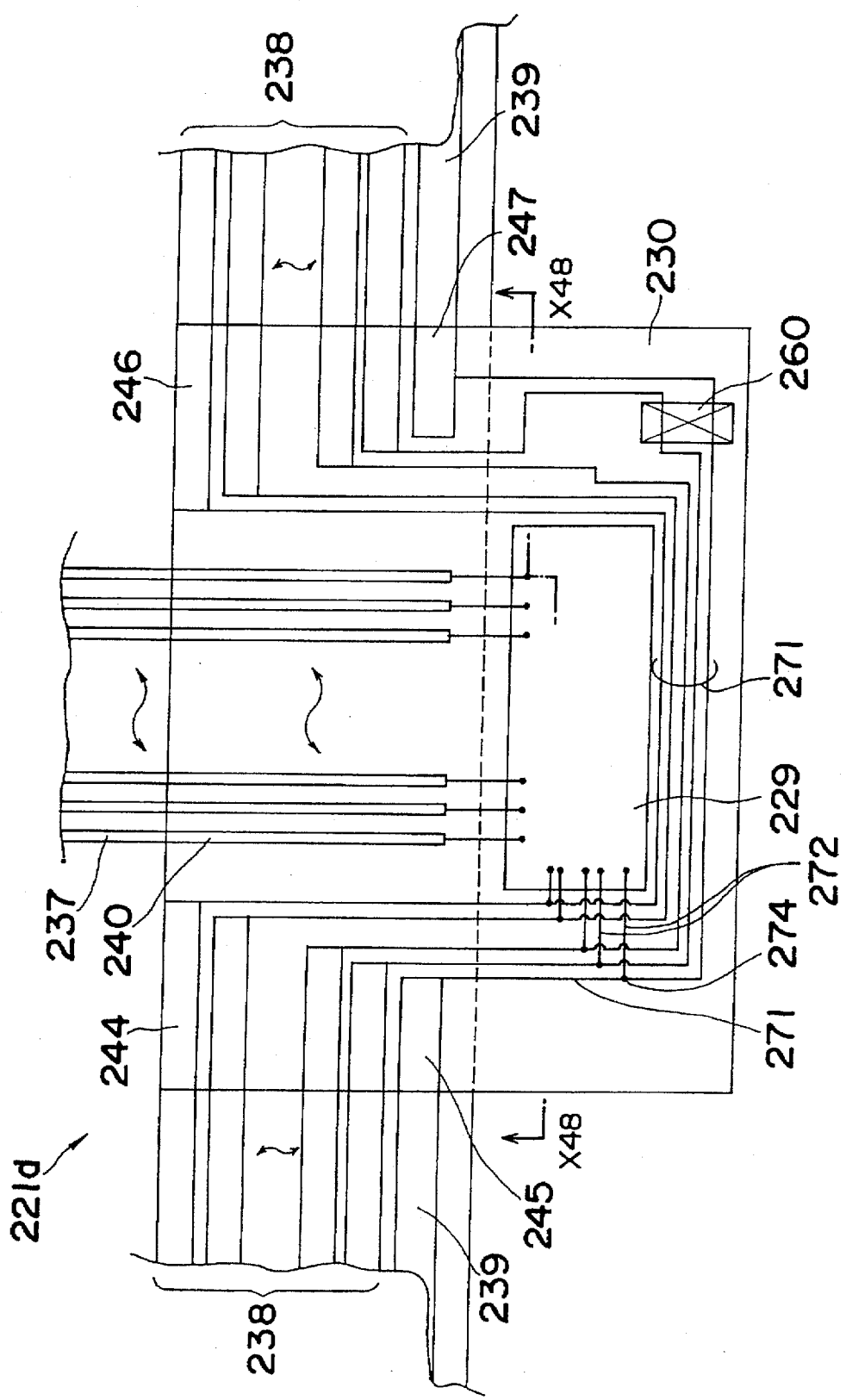
FIG. 47 is a plan view showing a liquid crystal display device which is a fifth embodiment of the present invention according to its seventh aspect.
Figure 48:
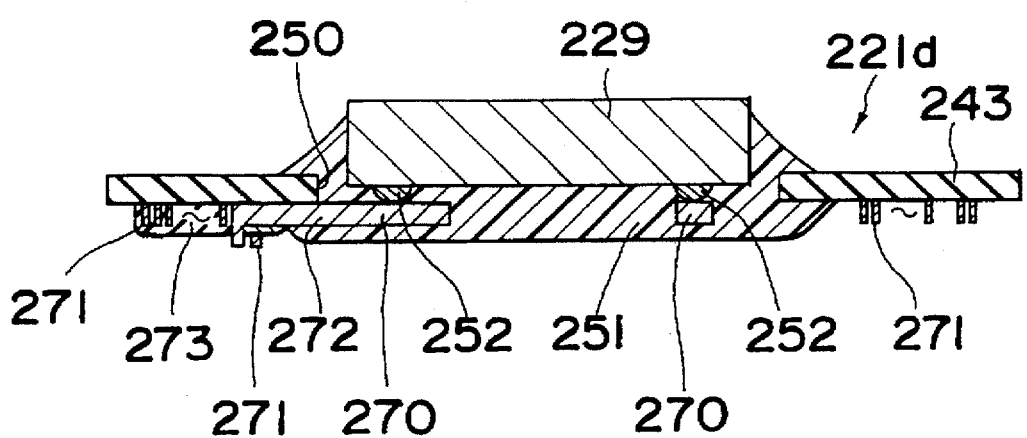
FIG. 48 is a sectional view taken along the line X48—X48 of FIG. 47.

FIG. 47 is a plan view of a liquid crystal display device 221 which is a fifth embodiment according to the seventh aspect of the present invention. FIG. 48 is a sectional view taken along the line X48—X48 of FIG. 47. This embodiment is similar to the foregoing third embodiment, where corresponding parts are designated by same reference numerals.

In this embodiment, the flexible wiring boards 230 have the accommodating holes 250 formed therein, where the IC 229 to be mounted are accommodated in the accommodating holes 250 and fixed to the base material 243 of the flexible wiring boards 230 by the protective layer 251. The input terminals 244, 245 and the output terminals 246, 247 are formed on one surface of the base material 243. A plurality of connecting lines 271 are formed on the base material 243 so as to directly connect the input terminals 244, 245 and the output terminals 246, 247 in such a wiring state as to detour the accommodating holes 250. The connecting lines 271 are made of such a material as Sn- or Au-plated Cu. The chip capacitor 260 is connected to specified connecting lines 271 such as one corresponding to the power line.

Some of the connecting lines 271 should be connected to not only the output terminals 246, 247 but also the electrode bumps 252 of the IC 229. A plurality of connecting lines 272 for connection between the connecting lines 271 and the electrode bumps 252 of the IC 229 are formed on the base material 243 in order to connect the connecting lines 271 to the IC 229. More specifically, an insulating film 273 is formed on a region where at least the connecting lines 272 are coated. The insulating film 273 has through holes 274 formed at positions corresponding to the connecting lines 272. Over the range of the insulating film 273 and the range of the base material 243, the plurality of connecting lines 271 are formed. The connecting lines 271 are electrically connected to their corresponding connecting lines 272 via the through holes 274 of the insulating film 273. In such an embodiment, the same effects as described in the foregoing embodiments can be achieved.

In particular, since the connecting lines 271 and the connecting lines 272 are provided in laminate structure, wiring density in the flexible wiring boards 230 can be increased, so that the flexible wiring boards 230 can be designed for smaller size.

Figure 49:
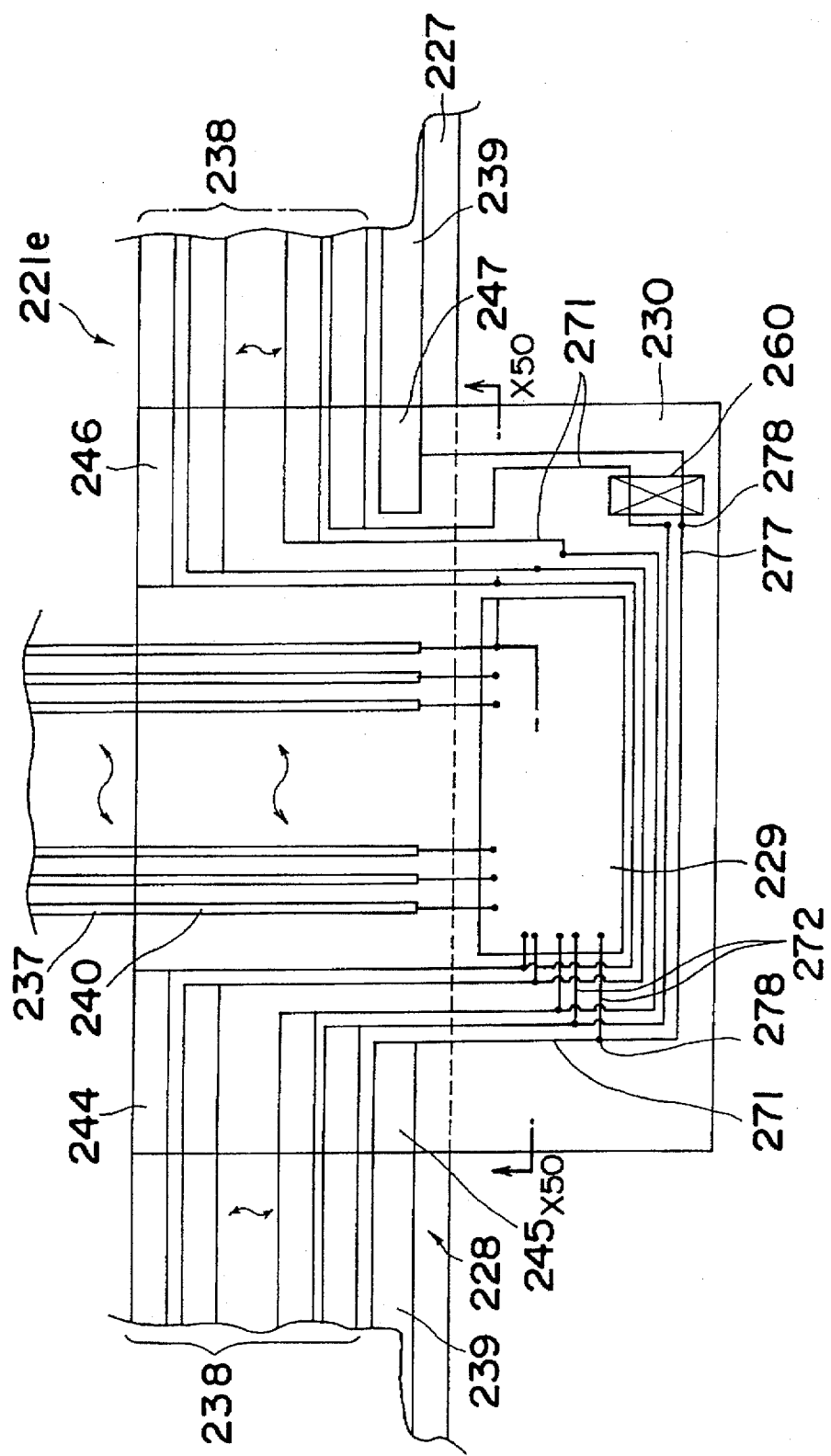
FIG. 49 is a plan view showing a liquid crystal display device which is a sixth embodiment of the present invention according to its seventh aspect.
Figure 50:
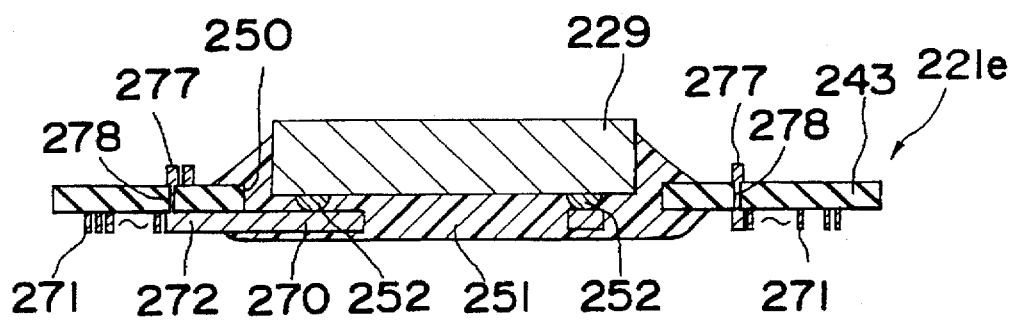
FIG. 50 is a sectional view taken along the line X50—X50 of FIG. 49.

FIG. 49 is a plan view of a liquid crystal display device 221e which is a sixth embodiment according to the seventh aspect of the present invention. FIG. 50 is a sectional view taken along the line X50—X50 of FIG. 49. This embodiment is similar to the foregoing fifth embodiment, where corresponding parts are designated by same reference numerals.

The plurality of input terminals 244, 245 are formed on one surface of the base material 243 of a plurality of flexible wiring boards 230 used in this embodiment. On the one surface, there are formed a plurality of connecting lines 275 one end of which is connected to the input terminals 244, 245 and extends along the second direction (up and down direction of FIG. 49) and the other end of which is positioned in an extension of the first direction (right and left direction of FIG. 49), and a plurality of connecting lines 272 each extending from the other ends of the connecting lines 275 toward the electrode bumps 252 of the ICs 229. Also, on the one surface, there are formed a plurality of output terminals 246, 247 and a plurality of connecting lines 276 one end of which is connected to the output terminals 246, 247 and extends along the second direction (up and down direction of FIG. 49) and the other end of which is positioned in an extension of the first direction (right and left direction of FIG. 49) of the IC 229.

In the flexible wiring boards 230, through holes 278 are formed at positions corresponding to the other ends of the connecting lines 271, 271. On a surface opposite to the surface on which the connecting lines 271 of the flexible wiring boards 230 are formed, bypass wirings 277 are formed separately between the through holes 278 corresponding to the connecting lines 271 on the signal output side and the through holes 278 corresponding to the connecting lines 271 on the signal output side. The bypass wirings 277 are made of such a material as Sn- or Au-plated Cu. One end of the bypass wirings 277 is connected to the other end of the connecting lines 271 via the through holes 278 on the signal input side, while the other end of the bypass wirings 277 is connected to the other end of the connecting lines 271 via the through holes 278 on the signal output side.

In such an embodiment, the same effects as described in the foregoing embodiments can be achieved. In particular, in this embodiment, the connecting lines 271, 271, the connecting lines 272, and the bypass wirings 277 are formed so as to be separated between both surfaces of the base material 243 and overlaid on each other. Accordingly, wiring density in the both surfaces of the flexible wiring boards 230 can be increased so that the flexible wiring boards 230 and the liquid crystal display device 221e can be designed for smaller size.

Figure 51:
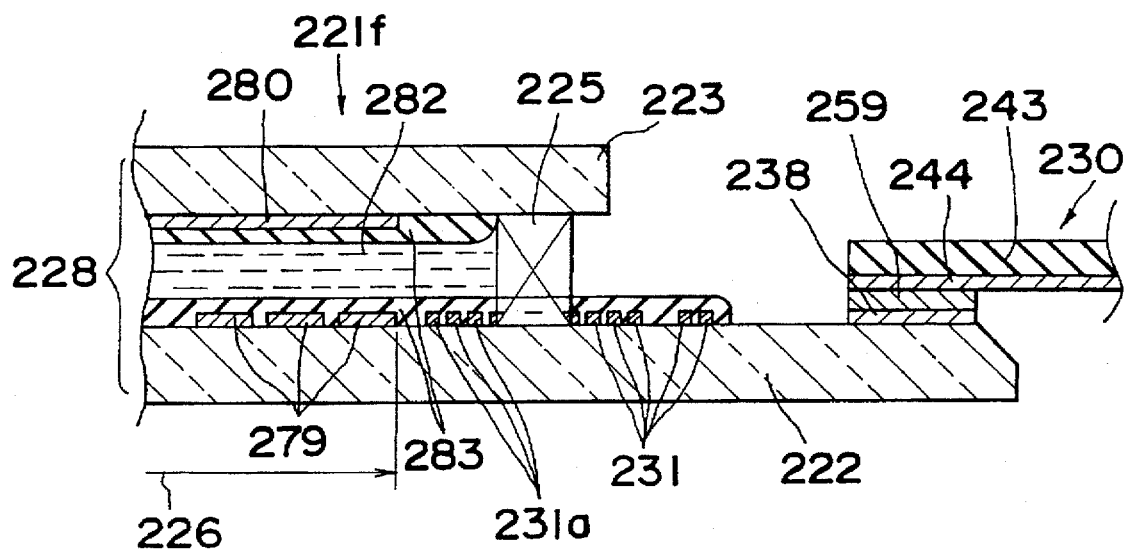
FIG. 51 is a sectional view showing a liquid crystal display device which is a seventh embodiment of the present invention according to its seventh aspect.
Figure 52:
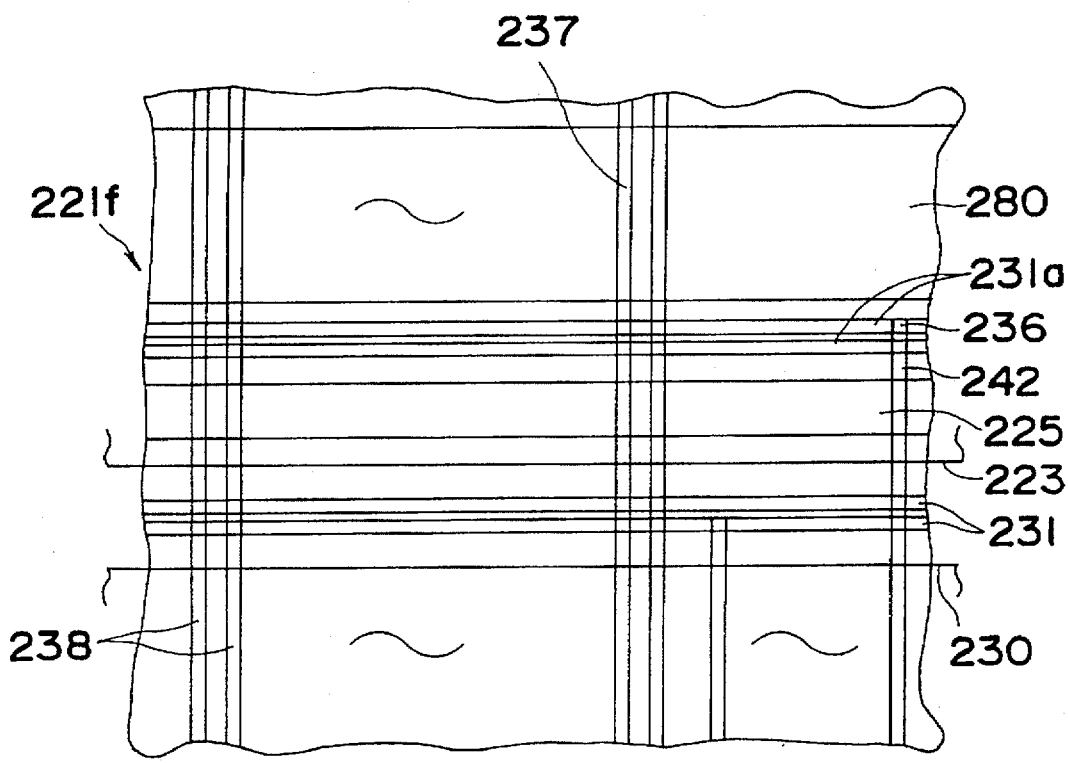
FIG. 52 is a plan view of the liquid crystal display device of FIG. 51.

FIG. 51 is a sectional view of a liquid crystal display device 221f which is a seventh embodiment according to the seventh aspect of the present invention. FIG. 52 is a plan view of the liquid crystal display device 221f. This embodiment is similar to the first embodiment, where corresponding parts are designated by same reference numerals.

This embodiment is described in a case where the liquid crystal display device 221f is the active matrix driven type. The liquid crystal display device 221f of this embodiment has a pair of glass substrates 222, 223, where a plurality of pixel electrodes 279 arrayed in a matrix are formed on the glass substrate 222, and opposite electrodes 280 opposed to the pixel electrodes 279 are formed on the glass substrate 223. On the glass substrates 222, 223, the regions where the pixel electrodes 279 and the opposite electrodes 280 are arrayed constitute a display section 226. A liquid crystal layer 282 is sandwiched between the glass substrates 222, 223, the peripheral portion of the display section 226 is sealed by a sealant 225.

In the liquid crystal display device 221f of this embodiment, the plurality of common lines 231 are formed over the entire regions including a region outer than the sealant 225, a region coated with the sealant 225, and a region inner than the sealant 225 and yet other than the display section 226. Of these common lines 231, those common lines 231 located inward of the sealant 225 are coated with an insulating film 283 such as a known orientation film or protective film (passivation film).

In this embodiment, the region where the common lines 231 are formed is made larger than the peripheral portion 227 of the display panel 228. This allows the area of the peripheral portion 227 to be reduced and therefore the liquid crystal display device 221f to be downsized. Otherwise, arrangement density of the common lines 231 can be lowered, so that the common lines 231 can be prevented from shortcircuiting among themselves or from occurrence of insulating failures. As a result, the reliability of the liquid crystal display device 221f can be improved. Moreover, the production yield of the liquid crystal display device 221f can be improved at the same time.

Further, some of the common lines 231 are arranged by making the use of the region of the display panel 228 inner than the sealant 225 except the region of the opposite electrodes 280, whereby the line width of the common lines 231 is widened and the resistance is lowered. As a result, time delay of a signal transferred through the common lines 231 is reduced. By this advantage, the signal transferred, when being an image signal, can be prevented from inclusion of noise that might cause the waveform of the image signal to be deformed undesirably. Thus, the resulting display image can be prevented from occurrence of failures.

Figure 53:
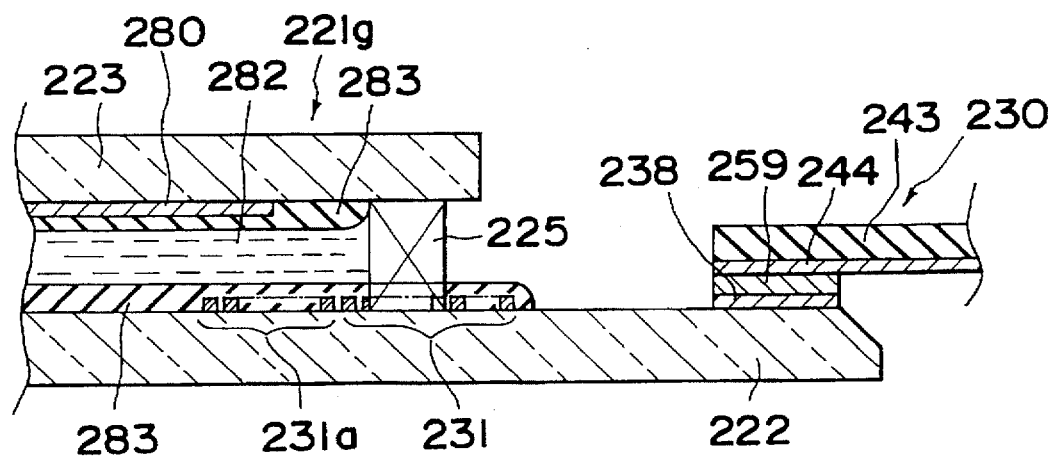
FIG. 53 is a sectional view showing a liquid crystal display device which is an eighth embodiment of the present invention according to its seventh aspect.
Figure 54:
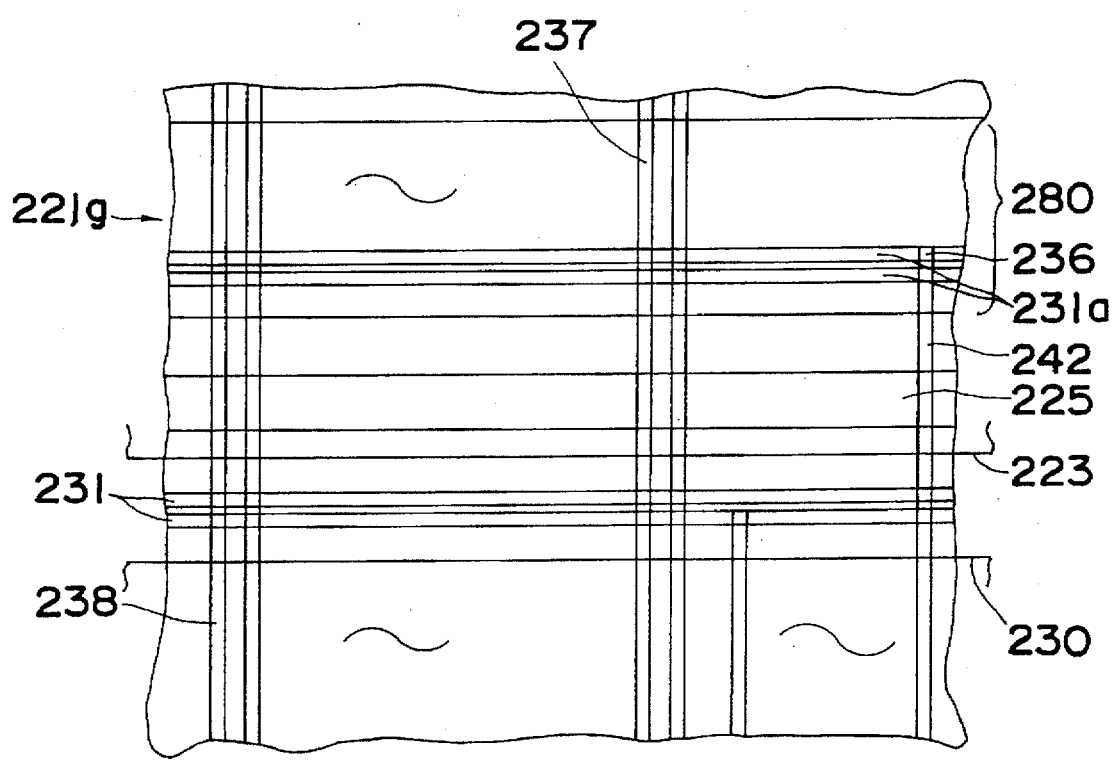
FIG. 54 is a plan view of the liquid crystal display device of FIG. 53.

FIG. 53 is a sectional view of a liquid crystal display device 221g which is an eighth embodiment according to the seventh aspect of the present invention. FIG. 54 is a plan view of the liquid crystal display device 221g. This embodiment is similar to the foregoing seventh embodiment, where corresponding parts are designated by same reference numerals.

The liquid crystal display device 221g of this embodiment has nearly the same structure as the liquid crystal display device 221f. This embodiment is characterized in the arrangement of common lines 231 and common lines 231a. In the liquid crystal display device 221g of this embodiment, the plurality of common lines 231, 231a are formed over the entire regions including a range on the glass substrate 222 outer than the sealant 225, a region coated with the sealant 225, and a region inner than the sealant 225 and yet around the peripheral portion of the display section 226. Of these common lines 231, 231a, some of the common lines 231a are provided as signal lines which transfer signals that do not easy pick up noise of the opposite electrodes 280 such as a clock signal. Further, the common lines 231, 231a are coated with an insulating film 283 such as a known orientation film or protective film (passivation film).

Of the regions where the common lines 231 are arranged, the region inner than the sealant 225 and yet around the peripheral portion of the display section 226 is defined as follows. When the liquid crystal display device 221g is used as, for example, a display device for a computer, the region included in the display section 226 and around the peripheral portion of the display section 226 is in some cases such that the image being displayed cannot be viewed from outside due to an effect of the casing by which the liquid crystal display device is mounted to the computer or the like, or other reasons. Thus, the region around the peripheral portion of the display section 226, although included in the display section 226, will often not contribute to the image displaying substantially. In such cases, formation of the common lines 231 around the peripheral portion of the display section 226 will to no extent affect a display image, as it is viewed from outside.

Therefore, in the above-described case, the common lines 231 may be formed on the glass substrate 222. In such an embodiment, the same effects as described in the seventh embodiment can be achieved.

In the seventh aspect of the present invention, the connecting material for electrically connecting the display panel 228 to the flexible wiring boards 230 is not limited to the anisotropic conductive film 259. Instead, connection techniques other than the anisotropic conductive film 259 may be used, such as connection by the use of solder or photosetting resins and clip press bonding.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An assembly structure of a flat type device, in which a panel has a plurality of electrode terminals disposed along a peripheral portion of one surface thereof, a flexible wiring board on which a drive IC for driving the panel is mounted is electrically connected to the electrode terminals of the panel, and wherein a circuit wiring for transferring a signal fed from external is electrically connected to the flexible wiring board, the assembly structure comprising:

an arrangement of the peripheral portion of the panel where a circuit wiring is provided at a layer below the electrode terminals so as to extend along the peripheral portion and to be electrically insulated from the electrode terminals with an insulating layer interposed therebetween, and where a junction terminal is provided so as to conduct with the circuit wiring, to penetrate through the insulating layer at a specified place, and to share the same layer with the electrode terminals; and an arrangement of one side of the flexible wiring board where an input terminal and output terminals leading to the drive IC are provided at places corresponding to the junction terminal and electrode terminals of the peripheral portion of the panel;

wherein the flexible wiring board is overlaid on the peripheral portion of the panel so that the junction terminal and electrode terminals of the peripheral portion of the panel are electrically connected to the input terminal and output terminals of the flexible wiring board, respectively;

wherein a portion of the flexible wiring board that projects sideward of the peripheral portion of the panel is bent so as to be wound around the peripheral portion of the panel.

2. An assembly structure of a flat type device, in which a panel has a plurality of electrode terminals disposed along a peripheral portion of one surface thereof, a flexible wiring board on which a drive IC for driving the panel is mounted is electrically connected to the electrode terminals of the panel, and wherein a circuit wiring for transferring a signal fed from external is electrically connected to the flexible wiring board, the assembly structure comprising:

an arrangement of the peripheral portion of the panel where a circuit wiring is provided at a layer below the electrode terminals so as to extend along the peripheral portion and to be electrically insulated from the electrode terminals with an insulating layer interposed therebetween, and where a junction terminal is provided so as to conduct with the circuit wiring, to penetrate through the insulating layer at a specified place, and to share the same layer with the electrode terminals; and an arrangement of one side of the flexible wiring board where an input terminal and output terminals leading to the drive IC are provided at places corresponding to the junction terminal and electrode terminals of the peripheral portion of the panel;

wherein the flexible wiring board is overlaid on the peripheral portion of the panel so that the junction terminal and electrode terminals of the peripheral portion of the panel are electrically connected to the input terminal and output terminals of the flexible wiring board, respectively;

wherein at least a region where the peripheral portion of the panel and the flexible wiring board overlap each other and the drive IC mounted on the flexible wiring board are covered with a specified protective resin.

3. An assembly structure of a flat type device, in which a panel has a plurality of electrode terminals disposed along a peripheral portion of one surface thereof, a flexible wiring board on which a drive IC for driving the panel is mounted is electrically connected to the electrode terminals of the panel, and wherein a circuit wiring for transferring a signal fed from external is electrically connected to the flexible wiring board, the assembly structure comprising:

an arrangement of the peripheral portion of the panel where a circuit wiring is provided at a layer below the electrode terminals so as to extend along the peripheral portion and to be electrically insulated from the electrode terminals with an insulating layer interposed therebetween, and where a junction terminal is provided so as to conduct with the circuit wiring, to penetrate through the insulating layer at a specified place, and to share the same layer with the electrode terminals; and an arrangement of one side of the flexible wiring board where an input terminal and output terminals leading to the drive IC are provided at places corresponding to the junction terminal and electrode terminals of the peripheral portion of the panel;

wherein the flexible wiring board is overlaid on the peripheral portion of the panel so that the function terminal and electrode terminals of the peripheral portion of the panel are electrically connected to the input terminal and output terminals of the flexible wiring board, respectively;

wherein a clip made of a shape memorizing member having a U shape in section is used to pinch the electrode terminals of the peripheral portion of the panel on outside of the flexible wiring board so that the electrode terminals are press fitted.

4. A method for assembling a flat type device in which a which a panel has a plurality of electrode terminals disposed along a peripheral portion of one surface thereof, a flexible wiring board on which a drive IC for driving the panel is mounted is electrically connected to the electrode terminals of the panel, and a circuit wiring for transferring a signal fed from external is electrically connected to the flexible wiring board, the method for assembling a flat type device comprising the steps of:

providing, on the peripheral portion of the panel, a circuit wiring at a layer below the electrode terminals so as to extend along the peripheral portion and to be electrically insulated from the electrode terminals with an insulating layer interposed therebetween, and providing a junction terminal so as to conduct with the circuit wiring, to penetrate through the insulating layer at a specified place, and to share the same layer with the electrode terminals;

providing, on one side of the flexible wiring board, an input terminal and output terminals leading to the drive IC at places corresponding to the junction terminal and electrode terminals of the peripheral portion of the panel;

aligning the junction terminal and the electrode terminals with the input terminal and the output terminals with the peripheral portion of the panel and the flexible wiring board opposed to each other; and electrically connecting the junction terminal and the electrode terminals to the input terminal and the output terminals by means of an anisotropic conductive material.

5. An assembly structure of a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a circuit wiring for transferring a signal fed from external is electrically connected to the flexible wiring boards, the assembly structure comprising:

an arrangement of the peripheral portion of the panel where a first junction terminal and a second junction terminal corresponding to each one of the flexible wiring boards and sharing the same layer with the electrode terminals are provided on both sides of a group of the electrode terminals corresponding to each one of the flexible wiring boards in a direction along the peripheral portion of the panel, and where a first circuit wiring for connecting the second junction terminal corresponding to one of the flexible wiring boards to the first junction terminal corresponding to another flexible wiring board adjacent to the flexible wiring board is provided in proximity to a row formed by the various terminals; and an arrangement on the flexible wiring boards where an input terminal, output terminals, and a third junction terminal formed of part of the wiring layer and leading to the drive IC are provided at places corresponding to the first junction terminal, electrode terminals, and second junction terminal of the peripheral portion of the panel, and where a second circuit wiring for connecting the input terminal to the third junction terminal is provided;

wherein the flexible wiring boards are overlaid on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence.

6. An assembly structure as claimed in claim 5, wherein a portion of the flexible wiring boards that projects sideward of the peripheral portion of the panel is bent so as to be wound around the peripheral portion of the panel.

7. An assembly structure as claimed in claim 6, wherein a slit is provided to the base material surface of the portion at which the flexible wiring boards are wound in a direction along the peripheral portion of the panel.

8. An assembly structure as claimed in claim 5, wherein a clip made of a shape memorizing member having a U shape in section is provided to pinch the peripheral portion of the panel on outside of each one of the flexible wiring boards so that a group of the electrode terminals corresponding to each one of the flexible wiring boards are press fitted.

9. An assembly structure as claimed in claim 5, wherein a slit is provided to the base material surface of a portion of each one of the flexible wiring boards that corresponds to a spacing between the row of the input terminal, the output terminals and the third junction terminal, and the second circuit wiring so as to extend along the spacing.

10. An assembly structure as claimed in claim 5, wherein the base material surface has been removed at a portion of the flexible wiring boards that corresponds to the input terminal, the output terminals, or the third junction terminal.

11. An assembly structure as claimed in claim 5, wherein the flexible wiring boards are overlaid on the peripheral portion of the panel in such a way that the row of the input terminal, the output terminals and the third junction terminal is located outer than the second circuit wiring, and wherein a portion of the flexible wiring boards that corresponds to the second circuit wiring is bent substantially 90 degrees to substantially 180 degrees with respect to the portions corresponding to the various terminals.

12. An assembly structure as claimed in claim 5, wherein the flexible wiring boards are overlaid on the peripheral portion of the panel in such a way that the row of the input terminal, the output terminals and the third junction terminal is located inner than the second circuit wiring, and wherein a portion of the flexible wiring boards on one side of the row of the various terminals opposite to the side on which the second circuit wiring is located is bent substantially 90 degrees to substantially 180 degrees with respect to the portions corresponding to the various terminals.

13. An assembly structure as claimed in claim 12, wherein the drive IC is mounted on a portion of each one of the flexible wiring boards at which the flexible wiring boards are bent.

14. An assembly structure as claimed in claim 5, wherein electronic components are mounted on the flexible wiring boards.

15. A method for assembling a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a circuit wiring for transferring a signal fed from external is electrically connected to the flexible wiring boards, the method for assembling a flat type device comprising the steps of:

providing, on the peripheral portion of the panel, a first junction terminal and a second junction terminal corresponding to each one of the flexible wiring boards and sharing the same layer with the electrode terminals on both sides of a group of the electrode terminals corresponding to each one of the flexible wiring boards in a direction along the peripheral portion of the panel, and providing a first circuit wiring for connecting the second junction terminal corresponding to one of the flexible wiring boards to the first junction terminal corresponding to another flexible wiring board adjacent to the flexible wiring board in proximity to a row formed by the various terminals; and providing, on the flexible wiring boards, an input terminal, output terminals, and a third junction terminal formed of part of the wiring layer and leading to the drive IC at places corresponding to the first junction terminal, electrode terminals, and second junction terminal of the peripheral portion of the panel, and providing a second circuit wiring for connecting the input terminal to the third junction terminal; and aligning the first junction terminal, electrode terminals, and second junction terminal of the peripheral portion of the panel with the input terminal, output terminals, and third junction terminal of each one of the flexible wiring boards, respectively, with the peripheral portion of the panel and the flexible wiring boards opposed to each other, and electrically connecting the corresponding terminals to each other by means of a specified electrically connecting material.

16. An assembly structure of a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a control board for feeding a signal for driving the panel is electrically connected to the flexible wiring boards, the assembly structure comprising:

an arrangement of the peripheral portion of the panel where a first junction terminal and a second junction terminal corresponding to each one of the flexible wiring boards and sharing the same layer with the electrode terminals are provided on both sides of a group of the electrode terminals corresponding to each one of the flexible wiring boards in a direction along the peripheral portion of the panel, and where a first circuit wiring for connecting the second junction terminal corresponding to one of the flexible wiring boards to the first junction terminal corresponding to another flexible wiring board adjacent to the flexible wiring board is provided in proximity to a row formed by the various terminals;

an arrangement on the flexible wiring boards where an input terminal, output terminals, and a third junction terminal formed of part of the wiring layer and leading to the drive IC are provided at places corresponding to the first junction terminal, electrode terminals, and second junction terminal of the peripheral portion of the panel, where a second circuit wiring for connecting the input terminal to the third junction terminal is provided, and where a fourth junction terminal leading to the third junction terminal via a third circuit wiring is provided; and an arrangement on one surface of the control board where a signal feed terminal for feeding a signal for driving the panel is provided in correspondence to the fourth junction terminal of the flexible wiring boards;

wherein the flexible wiring boards are overlaid on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence;

and wherein the control board is overlaid on the flexible wiring boards so that the fourth junction terminal of the flexible wiring boards is electrically connected to the signal feed terminal of the control board in correspondence.

17. An assembly structure as claimed in claim 16, wherein the panel is generally rectangular shaped, and wherein the control board is generally L-, U-, or square-shaped along the peripheral portion of the panel.

18. An assembly structure as claimed in claim 16, wherein the fourth junction terminal of part of the plurality of flexible wiring boards are not connected to the signal feed terminal of the control board.

19. An assembly structure as claimed in claim 18, wherein the fourth junction terminal of the part of the flexible wiring boards are cut off together with the base material surface.

20. An assembly structure as claimed in claim 16, wherein a portion of the part of the flexible wiring boards that projects sideward of the peripheral portion of the panel is bent at least once.

21. An assembly structure as claimed in claim 16, wherein the control board is overlaid on the peripheral portion of the panel directly or via a spacer and assembled integrally therewith.

22. An assembly structure as claimed in claim 21, wherein the control board is mounted on one surface of the peripheral portion of the panel opposite to the surface on which the electrode terminals are provided, and wherein the flexible wiring boards are wound around a peripheral portion of the panel and the control board.

23. An assembly structure as claimed in claim 22, wherein a clip made of a shape memorizing member having a U shape in section is provided to pinch the peripheral portion of the panel and the control board on outside of at least one of the flexible wiring boards so that a group of the electrode terminals corresponding to the one of the flexible wiring boards are press fitted.

24. An assembly structure as claimed in claim 16, wherein connection between the peripheral portion of the panel and the flexible wiring boards and connection between the flexible wiring boards and the control board are achieved by an identical electrically connecting material.

25. A method for assembling a flat type device, in which a panel has a plurality of electrode terminals disposed along a peripheral portion of one surface thereof, a plurality of flexible wiring boards which have a wiring layer on a base material surface with a flexibility and on which a drive IC for driving the panel is mounted are electrically connected to the electrode terminals of the panel, and a control board for feeding a signal fed from external is electrically connected to each of the flexible wiring boards, the method for assembling a flat type device comprising the steps of:

providing, on the peripheral portion of the panel, a first junction terminal and a second junction terminal corresponding to each one of the flexible wiring boards and sharing the same layer with the electrode terminals on both sides of a group of the electrode terminals corresponding to each one of the flexible wiring boards in a direction along the peripheral portion of the panel, and providing a first circuit wiring for connecting the second junction terminal corresponding to one of the flexible wiring boards to the first junction terminal corresponding to another flexible wiring board adjacent to the flexible wiring board in proximity to a row formed by the various terminals;

providing, on the flexible wiring boards, an input terminal, output terminals, and a third junction terminal formed of part of the wiring layer and leading to the drive IC at places corresponding to the first junction terminal, electrode terminals, and second junction terminal of the peripheral portion of the panel; providing a second circuit wiring for connecting the input terminal to the third junction terminal; and providing a fourth junction terminal leading to the third junction terminal via a third circuit wiring;

providing, on one surface of the control board, a signal feed terminal for feeding a signal for driving the panel in correspondence to the fourth junction terminal of the flexible wiring boards;

overlaying the flexible wiring boards on the peripheral portion of the panel so that the first junction terminal, electrode terminals, and second junction terminal of the peripheral portion of the panel are electrically connected to the input terminal, output terminals, and third junction terminal of each one of the flexible wiring boards in their respective correspondence; and overlaying the control board on the flexible wiring boards so that the fourth junction terminal of the flexible wiring boards is electrically connected to the signal feed terminal of the control board in correspondence.

26. A method for assembling a flat type device as claimed in claim 25, further comprising the steps of:

overlaying the control board directly or via a spacer on one surface of the peripheral portion of the panel opposite to the surface on which the electrode terminals are provided;

winding the flexible wiring boards around a peripheral portion of the panel and the control board; and providing a clip made of a shape memorizing member having a U shape in section to pinch the peripheral portion of the panel and the control board on outside of the flexible wiring boards so that a group of the terminals corresponding to the one of the flexible wiring boards are press fitted.

27. A method for assembling a flat type device as claimed in claim 25, further comprising the steps of:

providing a connecting material which will be cured by heating and pressurization or by heating, cooling, and pressurization between the peripheral portion of the panel and the flexible wiring boards and between the flexible wiring boards and the control board; and simultaneously achieving connection of the terminals in their correspondence by two thermal press head tips.

28. An assembly structure of a flat type device having: a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; a plurality of connecting terminals arrayed on the insulating substrate in such a direction as to intersect the array direction of the wiring boards at proximately both ends of each one of the wiring boards in their array direction; and a bypass wiring which electrically connects at least part of the plurality of connecting terminals at proximately the both ends with each other and which is electrically connected to the circuit element;

the display panel including a plurality of common lines which are connected respectively to the connecting terminals of each one of the plurality of wiring boards adjacent to one another on the peripheral portion and which are formed between one another of the connecting terminals of the plurality of wiring boards adjacent to one another;

wherein the connecting terminals of each one of the plurality of wiring boards are connected to the plurality of common lines and other connecting terminals on the display panel by means of an identical connecting material.

29. An assembly structure of a flat type device having: a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; a plurality of connecting terminals arrayed on the insulating substrate in such a direction as to intersect the array direction of the wiring boards at proximately both ends of each one of the wiring boards in their array direction; and a bypass wiring which electrically connects at least part of a plurality of connecting terminals at proximately the both ends with each other and which is electrically connected to the circuit element;

the display panel including a plurality of common lines which are connected in common to part of the connecting terminals of each one of the plurality of wiring boards on the peripheral portion and which are formed over a range including an array range of the plurality of wiring boards;

wherein the connecting terminals of each one of the plurality of wiring boards are connected to the plurality of common lines and other connecting terminals on the display panel by means of an identical connecting material.

30. An assembly structure of a flat type device having: a display panel having a peripheral portion; and a plurality of wiring boards which are disposed on the peripheral portion of the display panel in an array direction along the peripheral portion and on which a circuit element for driving the display panel is mounted, the plurality of wiring boards respectively comprising an insulating substrate; and a bypass wiring which electrically connects at least part of a plurality of connecting terminals at proximately both ends of the wiring boards with each other and which is electrically connected to the circuit element;

the display panel including a plurality of first common lines which are connected in common to the connecting terminals of each one of the plurality of wiring boards on the peripheral portion and which are formed over a range including an array range of the plurality of wiring boards; and a plurality of second common lines which are connected in common to part of the connecting terminals of each one of the plurality of wiring boards on the peripheral portion and which are formed over a range including the array range of the plurality of wiring boards;

wherein the connecting terminals of each one of the plurality of wiring boards are connected to the first common lines, the second common lines, and other connecting terminals on the display panel by means of an identical conductive connecting material.

31. An assembly structure as claimed in claim 28, wherein the bypass wiring includes a first bypass wiring which is formed on the insulating substrate and which directly connects the connecting terminals at proximately the both ends to one another.

32. An assembly structure as claimed in claim 28, wherein the bypass wiring includes: a second bypass wiring formed on the insulating substrate over a range from proximately any one of the both ends to the circuit element; a third bypass wiring which is formed on the insulating substrate over a range from proximately the other any one of the both ends to the circuit element; and an in-element bypass wiring which is formed within the circuit element and both ends of which are connected to the second bypass wiring and the third bypass wiring, respectively.

33. An assembly structure as claimed in claim 28, wherein the bypass wiring is provided on both surfaces of the insulating substrate of each one of the wiring boards.

34. An assembly structure as claimed in claim 31, wherein the first bypass wiring is provided on the insulating substrate and at such a position that the first bypass wiring passes between the insulating substrate and the circuit element.

35. An assembly structure as claimed in claim 28, wherein the connecting material is an anisotropic conductive film.

36. An assembly structure as claimed in claim 28, the display panel comprising a pair of display boards having display-use electrodes provided on their surfaces opposite to each other and having an optical transmission property, wherein the common lines are provided both on at least one of the pair of display boards within a range of overlap portion of these boards excepting a area of the display-use electrodes and on the peripheral portion.

* * * * *